US012648326B2

(12) United States Patent
Kim et al.

(10) Patent No.: US 12,648,326 B2
(45) Date of Patent: Jun. 2, 2026

(54) DISPLAY APPARATUS INCLUDING BLOCKING LAYER TO REDUCE LIGHT REFLECTION

(71) Applicant: SAMSUNG DISPLAY CO., LTD., Yongin-si (KR)

(72) Inventors: Hyangyul Kim, Yongin-si (KR); Sunhwa Kim, Yongin-si (KR); Jaehong Kim, Yongin-si (KR); Hyomin Kim, Yongin-si (KR); Hyunho Jung, Yongin-si (KR); Heeseong Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/622,759

(22) Filed: Mar. 29, 2024

(65) Prior Publication Data

US 2024/0260374 A1     Aug. 1, 2024

Related U.S. Application Data

(63) Continuation of application No. 17/737,981, filed on May 5, 2022, now Pat. No. 11,974,483, which is a
(Continued)

(30) Foreign Application Priority Data

Dec. 12, 2019     (KR) ........................ 10-2019-0165993

(51) Int. Cl.
*H10K 59/35*     (2023.01)
*H10K 59/80*     (2023.01)

(52) U.S. Cl.
CPC ......... *H10K 59/353* (2023.02); *H10K 59/352* (2023.02); *H10K 59/873* (2023.02); *H10K 59/8792* (2023.02)

(58) Field of Classification Search
CPC .. H10K 59/353; H10K 59/352; H10K 59/873; H10K 59/8792; H10K 71/166; H10K 59/40
(Continued)

(56) References Cited

U.S. PATENT DOCUMENTS 7,091,940 B2     8/2006  Tsujimura et al.
8,096,667 B2     1/2012  Boyd et al.
(Continued)

FOREIGN PATENT DOCUMENTS

CN          104576690 A      4/2015
CN          107482043 A     12/2017
(Continued)

OTHER PUBLICATIONS

Office action issued by the European Patent Office for Application No. 20213173.6, issued Oct. 14, 2024, 5 pages.
(Continued)

*Primary Examiner* — Didarul A Mazumder
(74) *Attorney, Agent, or Firm* — Womble Bond Dickinson (US) LLP

(57) ABSTRACT

According to one or more embodiments, provided is a display apparatus including a first subpixel having a rectangular shape, a second subpixel facing a first side of the first subpixel, the second subpixel having a rectangular shape, a third subpixel facing the first side of the first subpixel and spaced apart from the second subpixel, the third subpixel having a rectangular shape, and a blocking portion comprising a blocking layer on at least one of the first subpixel, the second subpixel, or the third subpixel, and, in a plan view, overlapping at least one of the first subpixel, the second subpixel, or the third subpixel, where a distance from the first side of the first subpixel to the second subpixel
(Continued)

is different from a distance from the first side of the first subpixel to the third subpixel.

48 Claims, 31 Drawing Sheets

Related U.S. Application Data continuation of application No. 16/911,872, filed on Jun. 25, 2020, now Pat. No. 11,329,103.

(58) Field of Classification Search
USPC ........................................ 257/42; 438/82, 99
See application file for complete search history.

(56) References Cited

U.S. PATENT DOCUMENTS

| | | | |
|---|---|---|---|
| 8,213,082 B2 | 7/2012 | Gaides et al. | |
| 8,373,624 B2 | 2/2013 | Chan et al. | |
| 8,503,122 B2 | 8/2013 | Liu et al. | |
| 8,659,829 B2 | 2/2014 | Walker, Jr. et al. | |
| 9,063,284 B2 | 6/2015 | Jones et al. | |
| 9,182,619 B2 | 11/2015 | Honda et al. | |
| 9,329,311 B2 | 5/2016 | Halverson et al. | |
| 9,335,449 B2 | 5/2016 | Gaides et al. | |
| 9,406,723 B2 | 8/2016 | Lee | |
| 9,568,650 B2 | 2/2017 | Hwang | |
| 9,651,726 B2 | 5/2017 | Merrill et al. | |
| 9,679,949 B2 | 6/2017 | Jung | |
| 9,704,424 B2 | 7/2017 | Sun | |
| 9,804,311 B2 | 10/2017 | Gaides et al. | |
| 10,147,772 B2 | 12/2018 | Breedlove et al. | |
| 10,263,054 B2 | 4/2019 | Kim et al. | |
| 10,312,472 B2 | 6/2019 | Chen et al. | |
| 10,431,635 B2 | 10/2019 | Breedlove et al. | |
| 10,475,857 B2 | 11/2019 | Song | |
| 10,735,715 B2 | 8/2020 | Jin et al. | |
| 11,329,103 B2 * | 5/2022 | Kim ..................... H10K 59/353 | |
| 11,605,675 B2 | 3/2023 | Lee et al. | |
| 2008/0213553 A1 | 9/2008 | Hwang | |
| 2008/0291541 A1 | 11/2008 | Padiyath et al. | |
| 2008/0292820 A1 | 11/2008 | Padiyath et al. | |
| 2009/0115943 A1 | 5/2009 | Gaides | |
| 2009/0165943 A1 | 7/2009 | Kim | |
| 2010/0000671 A1 | 1/2010 | Hwang | |
| 2014/0204294 A1 | 7/2014 | Lv | |
| 2014/0225089 A1 * | 8/2014 | Kato .................. H10K 59/8731 257/40 |
| 2014/0376100 A1 | 12/2014 | Jones et al. | |
| 2015/0009563 A1 | 1/2015 | Lauters et al. | |

| | | | |
|---|---|---|---|
| 2015/0311265 A1 | 10/2015 | Matsueda et al. | |
| 2016/0195983 A1 | 7/2016 | Miyake | |
| 2016/0329384 A1 | 11/2016 | Hou | |
| 2016/0329385 A1 | 11/2016 | Qui et al. | |
| 2017/0108628 A1 | 4/2017 | Larsen et al. | |
| 2017/0165947 A1 | 6/2017 | Murakami et al. | |
| 2017/0179206 A1 * | 6/2017 | Lee ..................... G09G 3/3225 |
| 2018/0120580 A1 | 5/2018 | Ouderkirk et al. | |
| 2018/0120581 A1 | 5/2018 | Ouderkirk et al. | |
| 2018/0358579 A1 * | 12/2018 | Chen .................. H10K 59/8792 |
| 2020/0033689 A1 | 1/2020 | Lee et al. | |
| 2020/0357863 A1 | 11/2020 | Nakamura et al. | |

FOREIGN PATENT DOCUMENTS

| | | |
|---|---|---|
| CN | 111653587 A | 9/2020 |
| CN | 116339540 A | 6/2023 |
| JP | 2015-176132 A | 10/2015 |
| JP | 2016-81531 A | 5/2016 |
| JP | 3211280 U | 7/2017 |
| KR | 20-0371442 Y1 | 1/2005 |
| KR | 20-0377830 Y1 | 3/2005 |
| KR | 10-0500477 B1 | 7/2005 |
| KR | 10-0526267 B1 | 11/2005 |
| KR | 20-0423548 Y1 | 8/2006 |
| KR | 20-0423887 Y1 | 8/2006 |
| KR | 10-0750867 B1 | 8/2007 |
| KR | 10-2007-0090654 A | 9/2007 |
| KR | 10-2007-0090662 A | 9/2007 |
| KR | 10-2013-0045299 A | 5/2013 |
| KR | 10-1432861 B1 | 8/2014 |
| KR | 10-1474045 B1 | 12/2014 |
| KR | 10-2015-0042009 A | 4/2015 |
| KR | 10-2015-0074826 A | 7/2015 |
| KR | 10-1546554 B1 | 8/2015 |
| KR | 10-1550004 B1 | 9/2015 |
| KR | 10-2015-0128470 A | 11/2015 |
| KR | 10-2016-0094588 A | 8/2016 |
| KR | 10-1714807 B1 | 3/2017 |
| KR | 10-1728177 B1 | 4/2017 |
| KR | 10-1830969 B1 | 2/2018 |
| KR | 10-2018-0062176 A | 6/2018 |
| KR | 10-2018-0062581 A | 6/2018 |
| KR | 10-1985030 B1 | 5/2019 |
| WO | 2019/106481 A1 | 6/2019 |

OTHER PUBLICATIONS

Office Action dated Dec. 31, 2024, issued by CNIPA for corresponding CN Patent Application No. 202011456644.3, 14 pages.

* cited by examiner

: USER'S GAZE DIRECTION 123-4

123-2

133-4

133-2

143-4

143-2

133-4

133-2

143-4

143-2

123-4

123-2

133-4

133-2

143-4

143-2

133-4

133-2

143-4

143-2

DISPLAY APPARATUS INCLUDING BLOCKING LAYER TO REDUCE LIGHT REFLECTION

CROSS-REFERENCE TO RELATED APPLICATIONS

This application is a continuation of U.S. patent application Ser. No. 17/737,981, filed May 5, 2022 and issued as U.S. Pat. No. 11,974,483, which is a continuation of U.S. patent application Ser. No. 16/911,872, filed Jun. 25, 2020 and issued as U.S. Pat. No. 11,329,103, which claims priority to and the benefit of Korean Patent Application No. 10-2019-0165993, filed Dec. 12, 2019, the entire contents of each of which are incorporated herein by reference.

BACKGROUND

1. Field

One or more embodiments relate to an apparatus, and more particularly, to a display apparatus.

2. Description of Related Art

In recent years, mobile electronic apparatuses have been widely used. For example, tablet personal computers (PC) and miniaturized electronic apparatuses such as mobile phones are widely used.

To support various functions, mobile electronic apparatuses include a display apparatus for providing visual information such as an image or a video to a user. Recently, as parts for driving a display apparatus are miniaturized, a part occupied by the display apparatus in the electronic apparatus has increased.

When the display apparatus is in a vehicle, an image of the display apparatus may be formed in a window of the vehicle in which the display apparatus is located. In this case, the driver's field of view may be disturbed.

SUMMARY

Aspects of one or more embodiments are directed toward a structure of the display device that may be bent to have a set or predetermined angle from a flat state.

When a display apparatus of the related art is arranged in a vehicle, reflection of external light may cause glare, or an image of the display apparatus may be formed in a window of the vehicle. The present disclosure has been made to solve various problems including the above-described problems, and one or more embodiments provide a display apparatus in which an image is not formed or reflected in an external object. However, this is merely an example, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes: a first subpixel having a rectangular shape; a second subpixel facing a first side of the first subpixel, and the second subpixel having a rectangular shape; a third subpixel facing the first side of the first subpixel and spaced apart from the second subpixel, and the third subpixel having a rectangular shape; and a blocking portion including a blocking layer on at least one of the first subpixel, the second subpixel, or the third subpixel, and, in a plan view, overlapping at least one of the first subpixel, the second subpixel, or the third subpixel, wherein a distance from the first side of each first subpixel to the second subpixel is different from a distance from the first side of the first subpixel to the third subpixel.

In the present embodiments, in a plan view, the blocking layer may overlap two sides of at least one of the first subpixel, the second subpixel, or the third subpixel.

In the present embodiments, the display apparatus may further include a plurality of blocking layers including the blocking layer, and the plurality of blocking layers may be spaced apart from each other and arranged in parallel with each other.

In the present embodiments, the blocking portion may include a protection layer exposed to the outside and a base layer in which a plurality of blocking layers, including the blocking layer, are inserted.

In the present embodiments, an end of the blocking layer may be concave.

In the present embodiments, the display apparatus may further include a substrate on which the first subpixel, the second subpixel, and the third subpixel are arranged, and a lengthwise direction of the blocking layer may be parallel to a long side or a short side of the substrate.

In the present embodiments, the display apparatus may further include a substrate on which the first subpixel, the second subpixel, and the third subpixel are arranged, and an angle between the first side of the first subpixel and a lengthwise direction of the blocking layer may be in a range of about 5° to about 85°.

In the present embodiments, at least a side portion of the second subpixel and at least a side portion of the third subpixel may be arranged within a length range of the first side of the first subpixel.

In the present embodiments, a short side of the second subpixel may be parallel to the first side of the first subpixel.

In the present embodiments, a short side of the third subpixel may be parallel to the first side of the first subpixel.

In the present embodiments, the display apparatus may further include a plurality of first subpixels comprising the first subpixel, the plurality of first subpixels including centers arranged in a straight line in a first direction and arranged in a serpentine form in a second direction.

In the present embodiments, the first direction may be parallel to a long side of the display apparatus.

In the present embodiments, the display apparatus may further include a plurality of second subpixels including the second subpixel and a plurality of third subpixels including the third subpixel, wherein centers of first ones of the plurality of second subpixels or centers of first ones of the plurality of third subpixels may be arranged in a straight line.

In the present embodiments, the display apparatus may further include a plurality of second subpixels including the second subpixel and a plurality of third subpixels including the third subpixel, wherein centers of first ones of the plurality of second subpixels or centers of first ones of the plurality of third subpixels may be arranged in a serpentine form in one direction.

In the present embodiments, the display apparatus may further include a plurality of first subpixels arranged in a first direction, the plurality of first subpixels including the first subpixel, wherein the second subpixel facing the first side of the first subpixel and another third subpixel facing a second side may be arranged to be symmetrical to each other about a straight line crossing centers of the plurality of first subpixels arranged in the first direction.

In the present embodiments, a length of a long side of the second subpixel may be substantially equal to a length of a long side of the third subpixel.

In the present embodiments, the display apparatus may further include a spacer between the first subpixel and the second subpixel or between the first subpixel and the third subpixel.

In the present embodiments, a shortest distance from the second subpixel to the spacer may be substantially equal to a shortest distance from another third subpixel to the spacer.

In the present embodiments, a short side of the second subpixel or a short side of the third subpixel may overlap one side of the first subpixel, and may be arranged in a straight line extending from one side of another first subpixel.

In the present embodiments, the display apparatus may further include a plurality of first subpixels arranged in a first direction, the plurality of first subpixels including the first subpixel, wherein an angle of about 45° may be between a long side of the second subpixel or a long side of the third subpixel and a straight line crossing centers of the plurality of first subpixels arranged in the first direction.

In the present embodiments, an area of the first subpixel may be greater than at least one of an area of the second subpixel or an area of the third subpixel.

In the present embodiments, an area of the second subpixel may be different from an area of the third subpixel.

In the present embodiments, an outline connecting a portion of an edge of the second subpixel to a portion of an edge of the third subpixel may have a square shape.

In the present embodiments, a vertex of at least one of the first subpixel, the second subpixel, or the third subpixel may be chamfered.

In the present embodiments, the first subpixel may emit blue light, one of the second subpixel and the third subpixel may emit red light, and the other of the second subpixel or the third subpixel may emit green light.

According to one or more embodiments, a display apparatus includes: a plurality of first subpixels each having a rectangular shape; a plurality of second subpixels including a second subpixel facing a first side of a corresponding first subpixel of the plurality of subpixels, each of the plurality of second subpixels having a rectangular shape; a plurality of third subpixels including a third subpixel facing the first side of the first subpixel and spaced apart from the second subpixel, each of the plurality of third subpixels having a rectangular shape; and a blocking portion including a blocking layer arranged on at least one of the first subpixel, the second subpixel, or the third subpixel, wherein centers of first ones of the plurality of first subpixels are arranged in a straight line in one direction, at least one side of the first subpixel is tilted with respect to the straight line crossing the centers of the first ones of the plurality of first subpixels, and wherein a lengthwise direction of the straight line crossing the centers of the first ones of the plurality of first subpixels is the same as or perpendicular to a lengthwise direction of the blocking layer.

In the present embodiments, an angle between the lengthwise direction of the blocking layer and one side of the first subpixel of the plurality of first subpixels may be in a range of about 5° to about 85°.

In the present embodiments, in a plan view, the blocking layer may overlap two sides of at least one of the first subpixel, the second subpixel, or the third subpixel.

In the present embodiments, the blocking portion may include a protection layer exposed to the outside and a base layer in which a plurality of blocking layers, including the blocking layer, are inserted.

In the present embodiments, an end of the blocking layer may be concave.

The display apparatus may further include a substrate on which the plurality of first subpixels, the plurality of second subpixels, and the plurality of third subpixels are arranged, wherein a lengthwise direction of the blocking layer may be parallel to a long side or a short side of the substrate.

In the present embodiments, in a plan view, the blocking layer may overlap at least one of the first subpixel, the second subpixel, or the third subpixel.

In the present embodiments, a size of the first subpixel may be different from a size of at least one of the second subpixel or the third subpixel.

In the present embodiments, the plurality of first subpixels each may have a square shape.

In the present embodiments, at least one of the second subpixel or the third subpixel may have a rectangular shape.

In the present embodiments, at least a portion of the second subpixel and at least a portion of the third subpixel, facing the first side of the first subpixel, may be arranged within a length range of the first side of the first subpixel that faces the second subpixel and the third subpixel.

In the present embodiments, centers of first ones of the plurality of second subpixels and centers of first ones of the plurality of third subpixels may be arranged in a serpentine form.

In the present embodiments, vertexes of at least one of the first subpixel, the second subpixel, or the third subpixel may be chamfered.

According to one or more embodiments, a display apparatus includes: a plurality of first subpixels; a plurality of second subpixels including a second subpixel facing a corresponding first subpixel of the plurality of first subpixels; a plurality of third subpixels including a third subpixel facing the first subpixel and spaced apart from the second subpixel; a spacer between the first subpixel and the second subpixel or between the first subpixel and the third subpixel; and a blocking portion including a blocking layer arranged on the first subpixel, the second subpixel, and the third subpixel, wherein centers of first ones of the plurality of first subpixels are arranged in a straight line, and at least one side of each first subpixel is tilted with respect to the straight line crossing the centers of the first ones of the plurality of first subpixels.

In the present embodiments, a lengthwise direction of the straight line crossing the centers of the first ones of the plurality of first subpixels may be the same as or perpendicular to a lengthwise direction of the blocking layer.

In the present embodiments, an angle between a lengthwise direction of the blocking layer and one side of at least one of the plurality of first subpixels may be in a range of about 5° to about 85°.

In the present embodiments, in a plan view, the blocking layer may overlap two sides of at least one of the first subpixel, the second subpixel, or the third subpixel.

In the present embodiments, the blocking portion may include a protection layer exposed to the outside and a base layer in which a plurality of blocking layers, including the blocking layer, are inserted.

In the present embodiments, an end of the blocking layer may be concave.

In the present embodiments, the display apparatus may further include a substrate on which the plurality of first subpixels, the plurality of second subpixels, and the plurality of third subpixels are arranged, wherein a lengthwise direction of the blocking layer may be parallel to a long side or a short side of the substrate.

In the present embodiments, in a plan view, the blocking layer may overlap at least one of the first subpixel, the second subpixel, or the third subpixel.

In the present embodiments, a size of the first subpixel may be different from a size of at least one of the second subpixel, or the third subpixel.

In the present embodiments, the plurality of first subpixels each may have a square shape.

In the present embodiments, a size of each second subpixel may be substantially equal to a size of each third subpixel.

In the present embodiments, a size of each second subpixel may be different from a size of each third subpixel.

In the present embodiments, a shortest distance from an edge of the spacer to the second subpixel may be substantially equal to a shortest distance from the edge of the spacer to another third subpixel.

In the present embodiments, a shortest distance from the second subpixel or the third subpixel to an edge of the spacer may be substantially equal to a shortest distance from the first subpixel to the edge of the spacer.

In the present embodiments, the plurality of second subpixels and the plurality of third subpixels each may have a rectangular shape, and a distance between the first subpixel and a long side of the second subpixel that face each other, a distance between the long side of the second subpixel and a long side of the third subpixel that face each other, and a distance between the long side of the third subpixel and another first subpixel that face each other may be the same.

In the present embodiments, a distance from one side of the first subpixel to the second subpixel may be different from a distance from the one side of the first subpixel to the third subpixel, wherein the first subpixel faces the second subpixel and the third subpixel.

The above and other aspects, features, and advantages of example embodiments of the disclosure will be more apparent from the following description, the accompanying drawings, and claims.

BRIEF DESCRIPTION OF THE DRAWINGS

The above and other aspects, features, and advantages of example embodiments of the disclosure will be more apparent from the following description taken in conjunction with the accompanying drawings, in which.

DETAILED DESCRIPTION

Figure 1A:
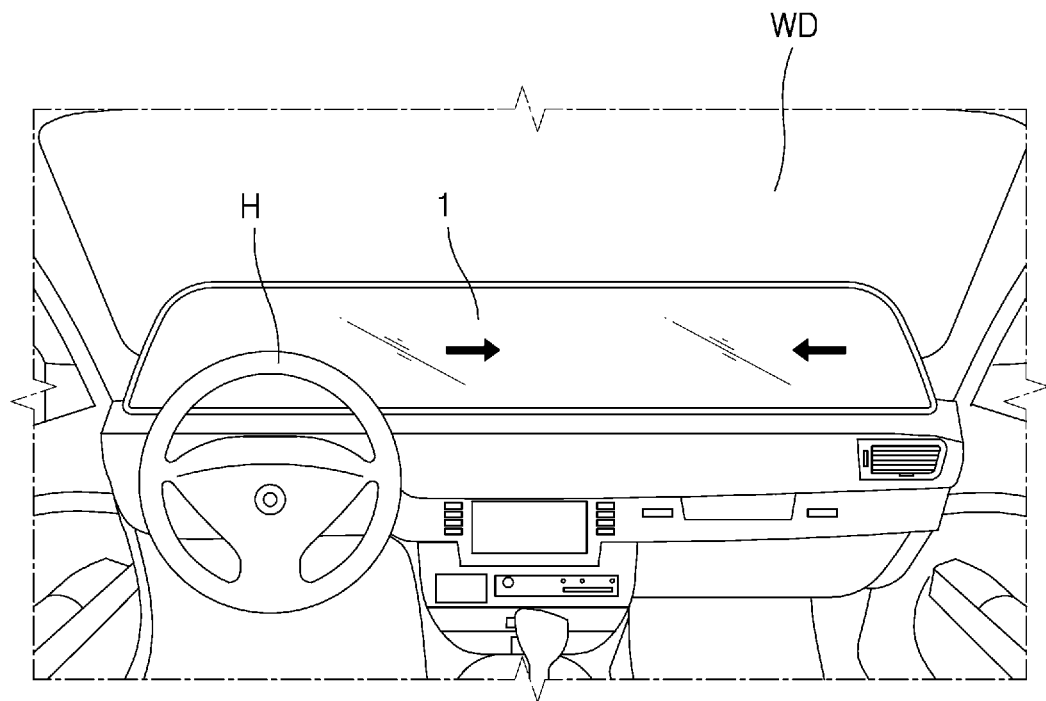
FIG. 1A is a perspective view illustrating a portion of a vehicle in which a display apparatus is arranged, according to one or more embodiments.
Figure 1A:
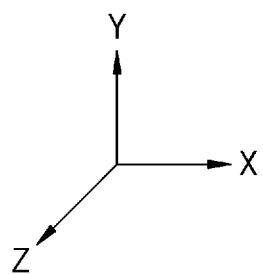

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present disclosure will be described in more detail by explaining embodiments of the disclosure with reference to the attached drawings. Like reference numerals in the drawings denote like elements, and redundant explanations thereof are omitted.

In the following description, while such terms as "first," "second," etc. may be used to describe various elements, such elements must not be limited to the above terms. The above terms are used only to distinguish one element from another.

In the following description, an expression used in the singular form encompasses the expression of the plural form, unless it has a clearly different meaning in the context.

In the following description, it will be understood that the terms such as "including," "having," and "comprising" are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

Further, the use of "may" when describing embodiments of the present disclosure refers to "one or more embodiments of the present disclosure".

In the following description, it will be understood that when a component, such as a layer, a film, an area, or a plate, is referred to as being "on" another component, the component can be directly on the other component or intervening components may be present thereon.

Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an example embodiment may be implemented differently, a specific process order may be performed differently from the described order. For example, two consecutively described processes may be performed substantially at the same time or performed in an order opposite to the described order.

As used herein, the phrases such as "a plan view" may refer to a view from top or from a direction normal to the display area of the display panel.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
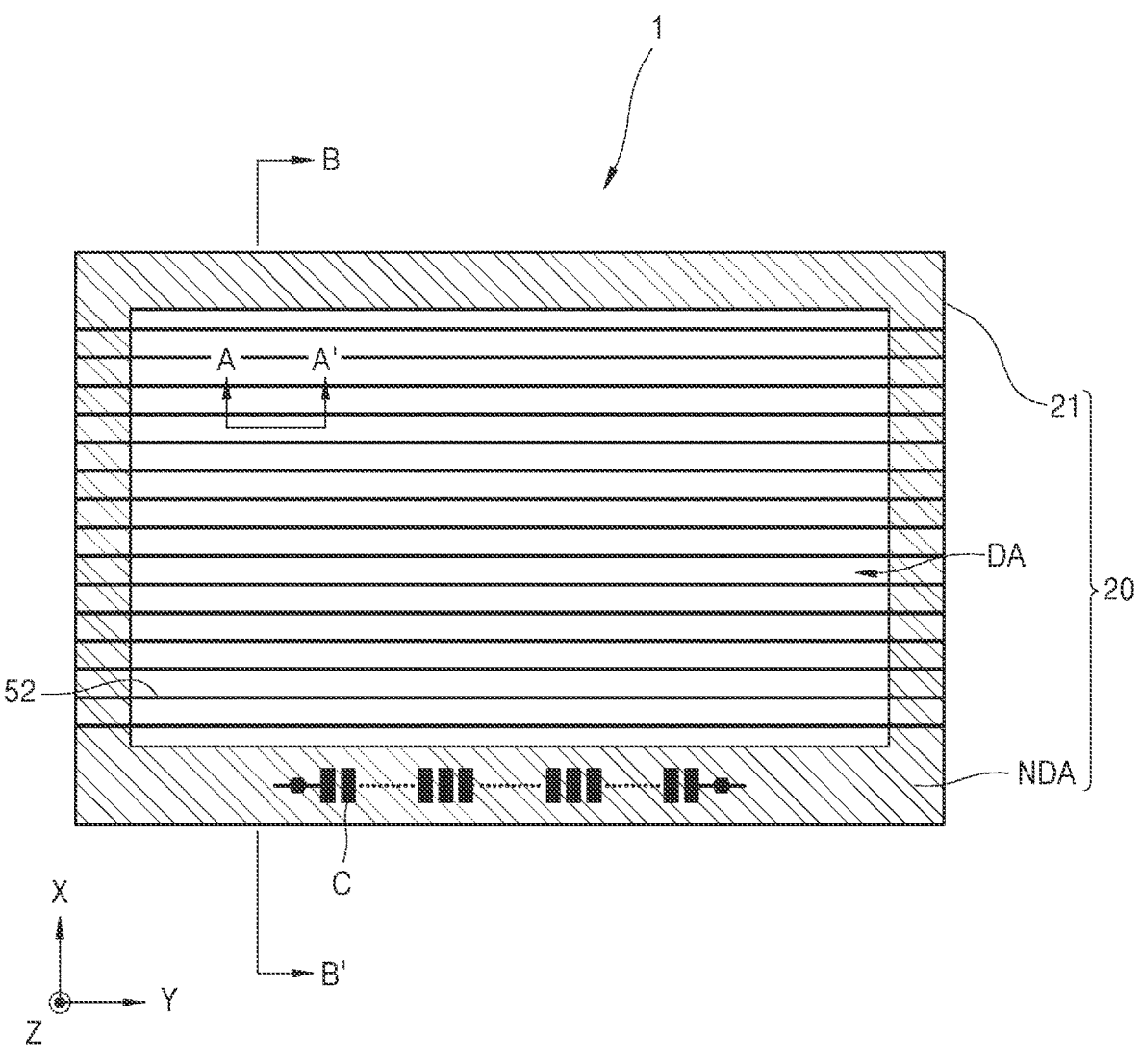
FIG. 1B is a plan view illustrating a display apparatus according to an embodiment.
Figure 1C:
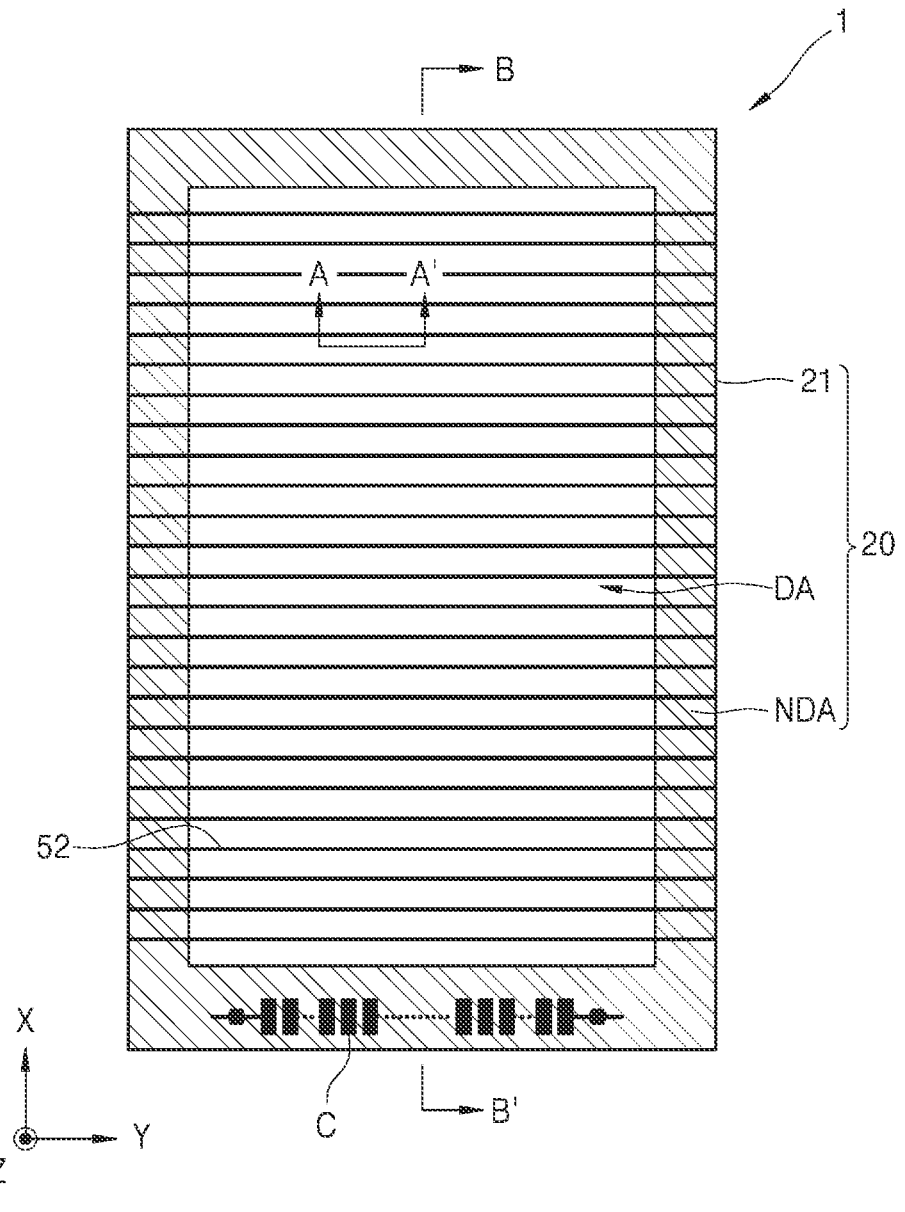
FIG. 1C is a plan view illustrating a display apparatus according to another embodiment.

FIG. 1A is a perspective view illustrating a portion of a vehicle in which a display apparatus 1 is arranged, according to one or more embodiments. FIG. 1B is a plan view illustrating the display apparatus 1 according to an embodiment. FIG. 1C is a plan view illustrating the display apparatus 1 according to another embodiment.

Figure 2A:
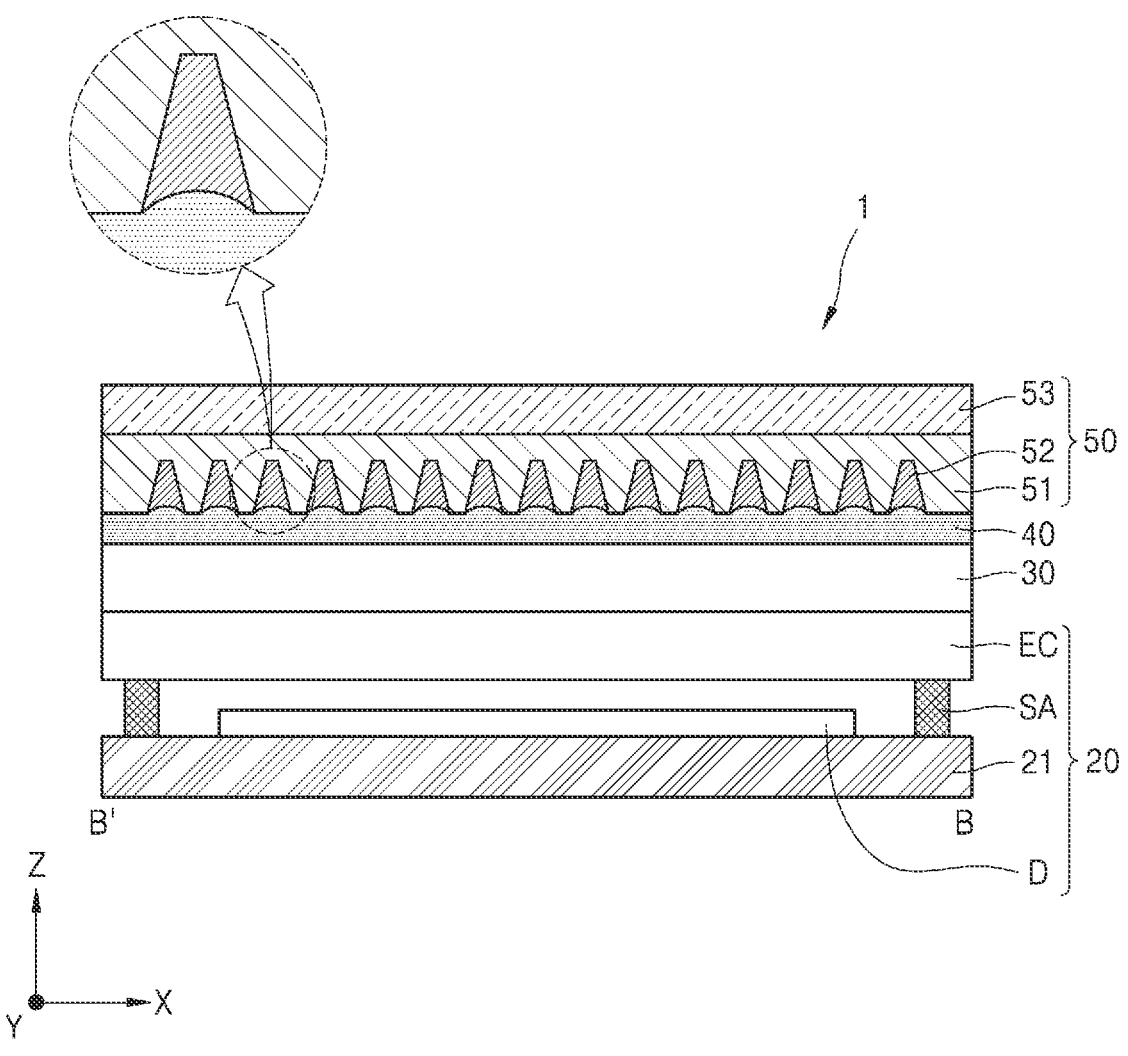
FIGS. 2A and 2B are cross-sectional views illustrating a display apparatus according to one or more embodiments.

Referring to FIGS. 1A-1C, the display apparatus 1 may include a display panel 20 (see FIG. 2A). The display panel 20 may include a display area DA on a substrate 21 and a non-display area NDA outside or around the display area DA. In one or more embodiments, the non-display area NDA surrounds the display area DA. An emission portion may be arranged in the display area DA, and a power supply wire may be arranged in the non-display area NDA. In one or more embodiments, a pad portion C may be located in the non-display area NDA. In one or more embodiments, the pad portion C may be adjacent to one side of the non-display area NDA.

In the case described above, the display area DA may have various suitable shapes. For example, the display area DA may have a rectangular, square, or circular shape. In one or more embodiments, the display area DA may have an irregular shape except for a rectangle, a square, a polygon, or a circle. However, hereinafter, for convenience of description, one or more embodiments where the display area DA has a rectangular shape is described in more detail.

The display apparatus 1 may be arranged inside a vehicle. In this case, the display apparatus 1 may display various suitable types of images, characters, etc.

The display apparatus 1 may be generally arranged obliquely on an interior material of the vehicle. In this case, the display apparatus 1 may have various suitable shapes. For example, an outer surface of the display apparatus 1 may be round. In another embodiment, the display apparatus 1 may have a circular or polygonal shape. Hereinafter, for convenience of description, one or more embodiments where the display apparatus 1 has a rectangular shape is described in more detail.

The display apparatus 1 may have a rectangular or square shape. In this case, the display apparatus 1 may have a short side and a long side. Here, the long side of the display apparatus 1 or the short side of the display apparatus 1 may be arranged to be adjacent to a window WD of the vehicle. In one or more embodiments, the display apparatus 1 is spaced apart from the window WD, and the display area DA of the display apparatus 1 does not face the window WD (i.e., faces away from the window WD).

In one or more embodiments, as shown in FIG. 1A, the long side of the display apparatus 1 may be arranged in one direction of an internal frame of the vehicle. In this case, the long side of the display apparatus 1 of FIG. 1B may be parallel to the window WD, and a user's gaze direction viewed from the side of the display apparatus 1 may be a direction perpendicular or normal to the short side of the display apparatus 1 (or a direction parallel to the long side of the display apparatus 1). Here, the user may view the display apparatus 1 at a steering wheel H of FIG. 1A or may view the display apparatus 1 at a side of the steering wheel H. In one or more embodiments, the user may view the display apparatus 1 from a driver's seat or a passenger's seat of the vehicle.

In one or more embodiments, the short side of the display apparatus 1 of FIG. 1C may be parallel to the window WD. In this case, the long side of the display apparatus 1 may be arranged from an upper portion to a lower portion of the vehicle. In other words, the long side of the display apparatus 1 may be vertically oriented. A user's gaze direction viewed from the side of the display apparatus 1 may be a direction perpendicular or normal to the long side of the display apparatus 1 (or a direction parallel to the short side of the display apparatus 1).

The display apparatus 1 may include a blocking layer 52. The blocking layer 52 may prevent or substantially prevent an image, a character, etc. displayed on the display apparatus 1 from being formed or reflected in the window WD. That is, the blocking layer 52 may prevent or substantially prevent light emitted from each subpixel of the display apparatus 1 from traveling at a predetermined or set angle with respect to surfaces of the display apparatus 1.

When the display apparatus 1 does not include the blocking layer 52, an image, a character, etc. may be reflected on the window WD, and thus, a driver's field of view may be disturbed. In one or more embodiments, when the display apparatus 1 including the blocking layer 52 operates, an afterimage or a stripe (or a wave pattern) may be displayed on the display apparatus 1 due to a Moire phenomenon by the operation of the display apparatus 1 or external light. In other words, a reflection may be prevented or substantially prevented but a pattern due to a Moire phenomenon may be present. However, in one or more embodiments, the pattern may be prevented or substantially prevented from being generated in the display apparatus 1 by preventing or substantially preventing the Moire phenomenon described above. In this case, as shown in FIGS. 1B and 1C, the blocking layer 52, which is provided as a plurality of blocking layers 52, may be connected in a straight line rather than being spaced apart from each other in a line.

This will be described below in more detail.

Figure 2B:
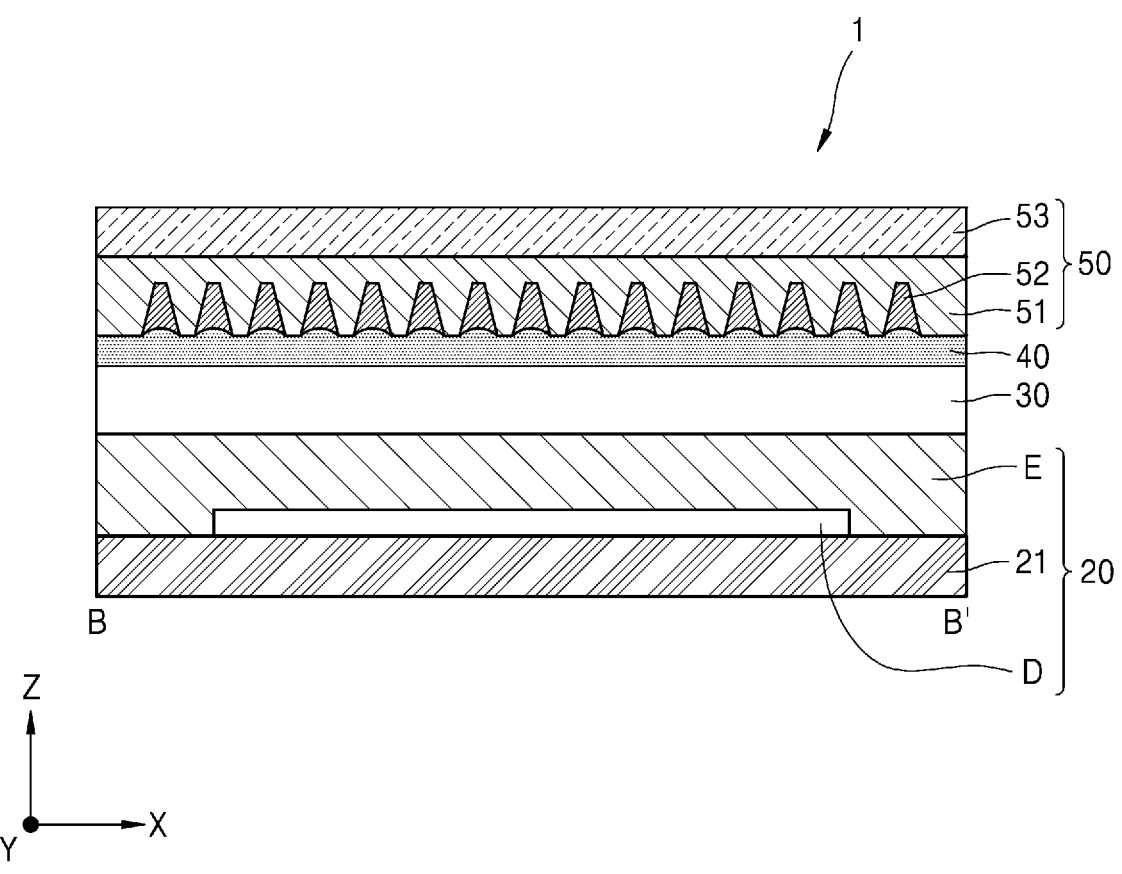
Figure 3:
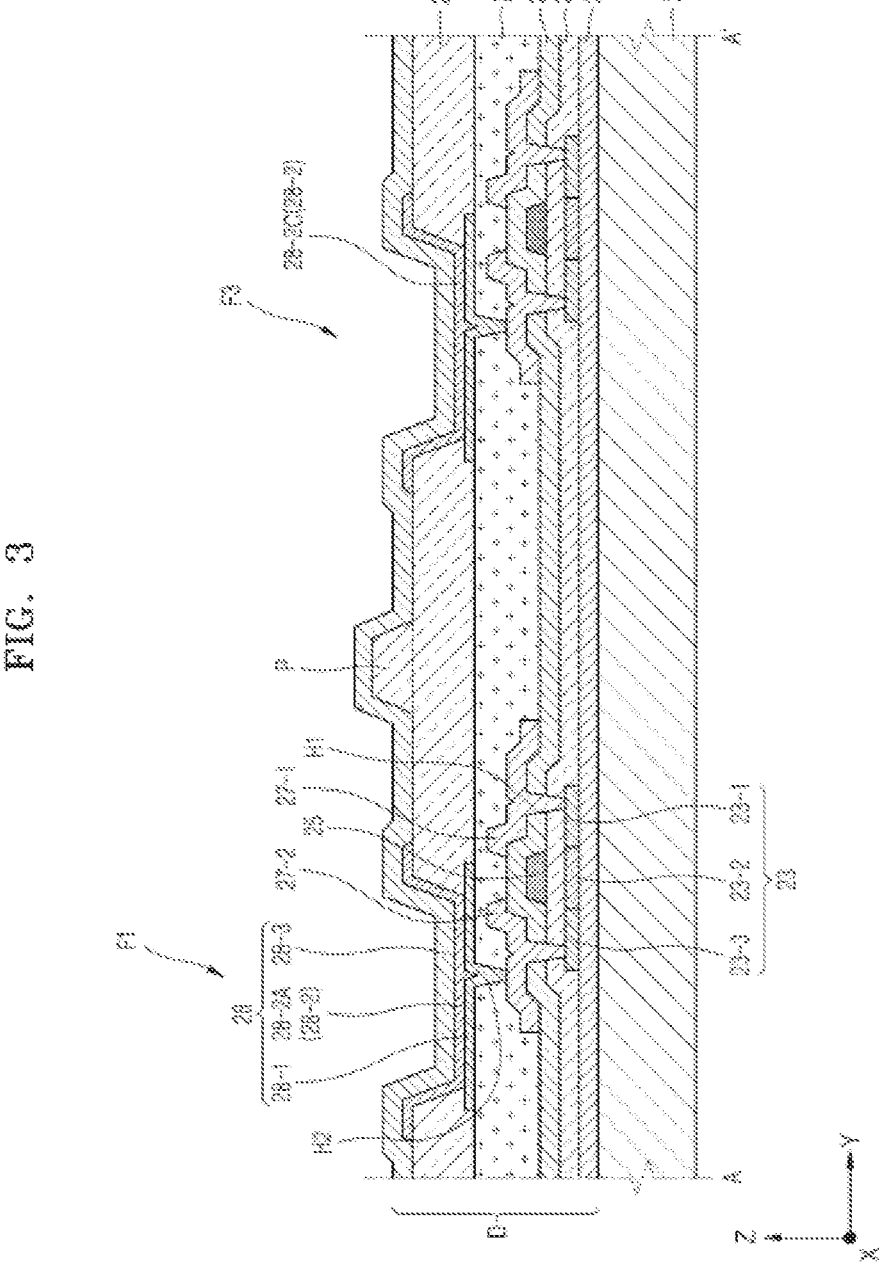
FIG. 3 is a cross-sectional view of a part of a display apparatus taken along the line A-A' of FIG. 1B or 1C.

FIGS. 2A and 2B are cross-sectional views illustrating the display apparatus 1 according to one or more embodiments, and FIGS. 2A and 2B are cross-sectional views taken along the line B-B' of FIG. 1B or 1C. FIG. 3 is a cross-sectional view of a part of the display apparatus 1 taken along the line A-A' of FIG. 1B or 1C.

Referring to FIGS. 2A-3, the display apparatus 1 may include a display panel 20, an optical functional member 30, an adhesive portion 40, and a blocking portion 50.

The display panel 20 may have various suitable shapes. For example, the display panel 20 may include a substrate 21, a display D, and an encapsulation portion.

In this case, the encapsulation portion may include a sealing portion SA and an encapsulation substrate EC as shown in FIG. 2A. The sealing portion SA may connect the encapsulation substrate EC to the substrate 21 to block or seal the display D from the outside (e.g., an external environment) together with the encapsulation substrate EC. The encapsulation substrate EC may be arranged to face the substrate 21 and may be fixed or coupled to the sealing portion SA. In this case, the encapsulation substrate EC may be the same as or similar to the substrate 21.

The encapsulation portion may include a thin-film encapsulation layer E as shown in FIG. 2B. The thin-film encapsulation layer E may include a plurality of inorganic layers or may include an inorganic layer and an organic layer.

The organic layer of the thin-film encapsulation layer E may be formed of a polymer and may include polyethylene terephthalate, polyethylene naphthalate, polycarbonate, polyimide, polyethylene sulfonate, polyoxymethylene, polyarylate, hexamethyldisiloxane, an acryl-based resin (e.g., polymethyl methacrylate, polyacrylic acid, etc.), or a combination thereof.

The inorganic layer of the thin-film encapsulation layer E may be a single layer or a stack layer including a metal oxide or a metal nitride. In more detail, the inorganic layer may include one of silicon nitride ($SiN_x$), aluminum oxide ($Al_2O_3$), silicon dioxide ($SiO_2$), and/or titanium dioxide ($TiO_2$).

An uppermost layer or outermost layer of the thin-film encapsulation layer E, which is exposed to the outside (e.g., an external environment), may be formed as an inorganic layer to prevent or substantially prevent moisture permeation into an organic light-emitting diode.

In one or more embodiments, the thin-film encapsulation layer E may include at least one sandwich structure in which at least one organic layer is between at least two inorganic layers. In one or more embodiments, the thin-film encapsulation layer E may include at least one sandwich structure in which at least one inorganic layer is between at least two organic layers. In one or more embodiments, the thin-film encapsulation layer E may include a sandwich structure in which at least one organic layer is between at least two inorganic layers and a sandwich structure in which at least one inorganic layer is between at least two organic layers.

For example, the thin-film encapsulation layer E may include sequentially from above an organic light-emitting diode 28, a first inorganic layer, a first organic layer, and a second inorganic layer.

As another example, the thin-film encapsulation layer E may include sequentially from above the organic light-emitting diode 28, the first inorganic layer, the first organic layer, the second inorganic layer, a second organic layer, and a third inorganic layer.

As another example, the thin-film encapsulation layer E may include sequentially from above the organic light-emitting diode 28, the first inorganic layer, the first organic layer, the second inorganic layer, the second organic layer, the third inorganic layer, a third organic layer, and a fourth inorganic layer.

In one or more embodiments, the display apparatus 1 may include a protection layer between the organic light-emitting diode 28 and the first inorganic layer. The protection layer may further include a halogenated metal layer including lithium fluoride (LiF). The halogenated metal layer may prevent or substantially prevent the organic light-emitting diode 28 from being damaged while the first inorganic layer is formed by using a sputtering method.

An area of the first organic layer may be less than an area of the second inorganic layer, and an area of the second organic layer may be less than an area of the third inorganic layer.

In the case where the inorganic layer is provided as a plurality of inorganic layers, the inorganic layers may be deposited to directly contact each other in an edge area of the display panel 20 and to prevent or substantially prevent the organic layer from being exposed to the outside (e.g., an external environment).

In one or more embodiments, the display panel 20 may include a touch layer. The touch layer may be in a film form and arranged between the encapsulation portion and the display D or arranged on an upper surface of the encapsulation portion. In this case, the touch layer may be separately formed to be attached or coupled to the encapsulation portion or directly formed in a pattern on the encapsulation portion.

The display D may include a thin-film transistor (TFT), a passivation layer 27, and an organic light-emitting diode 28.

The substrate 21 may be formed of a plastic material and/or a metal material such as stainless use steel (SUS) and/or titanium (Ti). The substrate 21 may include a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 21 may have a single-layer or multi-layer structure of the above materials, and when the substrate 21 has a multi-layer structure, an inorganic layer may be further included. Hereinafter, for convenience of description, one or more embodiments where the substrate 21 is formed of polyimde is described in more detail.

The TFT may be formed on the substrate 21, the passivation layer 27 may be formed to cover the TFT, and the organic light-emitting diode 28 may be formed on the passivation layer 27.

A buffer layer 22 is further formed on an upper surface of the substrate 21, the buffer layer 22 consisting of an organic compound and/or an inorganic compound. The inorganic compound may include $SiO_x$ where $x \geq 1$ and/or $SiN_x$ where $x \geq 1$.

An active layer 23 is formed on the buffer layer 22 in a predetermined or set pattern, and then the active layer 23 is buried by a gate insulating layer 24. The active layer 23 includes a source region 23-1, a drain region 23-3, and a channel region 23-2 between the source region 23-1 and the drain region 23-3.

The active layer 23 may include various suitable materials. For example, the active layer 23 may include an inorganic semiconductor material such as amorphous silicon or crystalline silicon. In one or more embodiments, the active layer 23 may include an oxide semiconductor. In one or more embodiments, the active layer 23 may include an organic semiconductor material. However, hereinafter, for convenience of description, one or more embodiments where the active layer 23 includes amorphous silicon is described in more detail.

The active layer 23 may be formed by forming an amorphous silicon layer on the buffer layer 22, crystallizing the amorphous silicon layer into a polycrystalline silicon layer, and patterning the polycrystalline silicon layer. The source region 23-1 and the drain region 23-3 of the active layer 23 may be doped with impurities depending on the type of a TFT, such as a driving TFT and a switching TFT.

On an upper surface of the gate insulating layer 24, a gate electrode 25 corresponding to the active layer 23, and an interlayer insulating layer 26 burying the gate electrode 25 may be formed.

In one or more embodiments, contact holes (e.g., contact hole H1) are formed in or through the interlayer insulating layer 26 and the gate insulating layer 24, and then a source electrode 27-1 and a drain electrode 27-2 are formed on the interlayer insulating layer 26 to respectively contact the source region 23-1 and the drain region 23-3 through the contact holes. In one or more embodiments, the source electrode 27-1 and the drain electrode 27-2 fill corresponding contact holes formed in or through the interlayer insulating layer 26 and the gate insulating layer 24.

The passivation layer 27 is formed on the TFT, and a pixel electrode 28-1 of the organic light-emitting diode 28 is formed on the passivation layer 27. The pixel electrode 28-1 contacts the drain electrode 27-2 of the TFT through a via hole H2 formed in the passivation layer 27. The passivation layer 27 may include an inorganic material and/or an organic material and may include a single layer or two or more layers. The passivation layer 27 may be formed as a planarization layer having a flat top surface regardless of the bending of a layer thereunder (e.g., regardless of the shape of the layer below the passivation layer 27), or formed to be curved along the bending of the layer thereunder (e.g., curved along the shape of the layer below the passivation layer 27). In other words, an upper surface of the passivation layer 27 may be flat or may correspond to the shape of the layer below the passivation layer 27. In one or more embodiments, the passivation layer 27 includes a transparent insulator to accomplish a resonance effect.

After the pixel electrode 28-1 is formed on the passivation layer 27, a pixel-defining layer 29 is formed of an organic material and/or an inorganic material to cover the pixel electrode 28-1 and the passivation layer 27. A portion of the pixel-defining layer 29 is open to expose the pixel electrode 28-1. In other words, the pixel-defining layer 29 may define an opening that exposes a top surface of the pixel electrode 28-1.

Here, a spacer P may be positioned on the pixel-defining layer 29. The spacer P may be arranged on the pixel-defining layer 29 or may be integrally formed with the pixel-defining layer 29. The spacer P may have various suitable shapes. For example, the spacer P may be formed in a protrusion shape. In one or more embodiments, the spacer P may be provided as a plurality of spacers P, and the spacers P may be arranged in the pixel-defining layer 29 to be spaced apart from each other. In another embodiment, one spacer P may be provided in a space between adjacent subpixels (or between adjacent intermediate layers). However, the spacer P is not limited thereto, and when each mask sheet enters an opening of the pixel-defining layer 29 or a deposition material is deposited on the substrate 21, each mask sheet is closely attached or coupled to the pixel-defining layer 29 to contact the substrate 21, thereby preventing or substantially preventing a dent defect that damages or destroys a portion of the substrate 21. In particular, when each mask assembly is closely attached or coupled to the substrate 21, the spacer P may maintain a distance between an end of the opening of the pixel-defining layer 29 and each mask assembly. Accordingly, the spacer P may be arranged not to overlap each intermediate layer.

The spacer P may be concurrently (e.g., simultaneously) formed with the pixel-defining layer 29 as a monolithic or integral structure when the pixel-defining layer 29 is formed, or may be separately formed on the pixel-defining layer 29 after the pixel-defining layer 29 is formed. Therefore, the spacer P may be formed of the same material as or a different material from the pixel-defining layer 29. Hereinafter, for convenience of description, one or more embodiments where the spacer P is formed of the same material as the pixel-defining layer P is described in more detail.

In one or more embodiments, an intermediate layer 28-2 and an opposite electrode 28-3 are formed on at least the pixel electrode 28-1. In another embodiment, the opposite electrode 28-3 may be formed on a front surface of the substrate 21. In this case, the opposite electrode 28-3 may be formed on the intermediate layer 28-2 and the pixel-defining layer 29. Hereinafter, for convenience of description, one or more embodiments where the opposite electrode 28-3 is formed on the intermediate layer 28-2 and the pixel-defining layer 29 is described in more detail.

The pixel electrode 28-1 functions as an anode electrode, and the opposite electrode 28-3 functions as a cathode electrode, but polarities of the pixel electrode 28-1 and the opposite electrode 28-3 may be reversed.

The pixel electrode 28-1 and the opposite electrode 28-3 are insulated from each other by the intermediate layer 28-2, and apply voltages of opposite polarities to the intermediate layer 28-2 to induce light emission in an organic emission layer.

The intermediate layer 28-2 may include an organic emission layer. Alternatively, the intermediate layer 28-2 may include an organic emission layer, and may further include at least one of a hole injection layer (HIL), a hole transport layer, an electron transport layer, or an electron injection layer. However, the present embodiment is not limited thereto, and the intermediate layer 28-2 may include an organic emission layer and may further include various suitable functional layers.

The intermediate layer 28-2 may be provided as a plurality of intermediate layers 28-2, and the plurality of intermediate layers 28-2 may form a display area DA. In this case, the plurality of intermediate layers 28-2 may be arranged in the display area DA to be spaced apart from each other.

One unit pixel may include a plurality of subpixels. The plurality of subpixels may emit light beams of various suitable colors. In one or more embodiments, one subpixel may be refer to an area where light of one color is emitted. In another embodiment, one subpixel may be defined as a portion of the pixel electrode 28-1 that is exposed to the outside through an open area of the pixel-defining layer 29. In one or more embodiments, the open area of the pixel-defining layer 29 corresponds to a bottom of an opening of the pixel-defining layer 29 that extends through the pixel-defining layer 29 to expose a portion of the pixel electrode 28-1. In this case, a size of one subpixel may be controlled by adjusting a size of the open area of the pixel-defining layer 29 to adjust an area of the pixel electrode 28-1 exposed to the outside. In other words, adjusting the size of one subpixel may be achieved by adjusting a size of the opening extending through the pixel-defining layer 29. However, hereinafter, for convenience of description, one or more embodiments where one subpixel is an area where a light beam of one color is emitted is described in more detail.

The plurality of subpixels may include subpixels emitting red, green, and blue light, respectively. In another embodiment, the plurality of subpixels may include subpixels emitting red, green, blue, and white light. In another embodiment, the plurality of subpixels may include subpixels emitting red, yellow, and blue light. However, the plurality of subpixels are not limited thereto, and the present disclosure may include all suitable variations of cases including subpixels that emit light beams of different colors. However, hereinafter, for convenience of description, one or more embodiments where the plurality of subpixels include subpixels emitting blue, red, and green light is described in more detail.

An apparatus for manufacturing a display apparatus, which will be described later, may form various suitable layers on the substrate 21. For example, the apparatus for manufacturing a display apparatus may form at least one of the intermediate layers 28-2 on the substrate 21. In more detail, the apparatus for manufacturing a display apparatus may form at least one of an organic emission layer, an HIL, a hole transport layer, an electron injection layer, an electron transport layer, or a functional layer of the intermediate layer 28-2. In particular, when the apparatus for manufacturing a display apparatus forms at least one layer of the intermediate layers 28-2 on the substrate 21, the apparatus for manufacturing a display apparatus may manufacture one layer through a plurality of deposition materials or concurrently (e.g., simultaneously) manufacture a plurality of layers.

In one or more embodiments, an optical functional member 30 may be between the display D and the blocking portion 50. The optical functional member 30 may include a phase retarder and a polarizer. The phase retarder may be of a film type or a liquid crystal coating type and may include a λ/2 phase retarder and/or a λ/4 phase retarder. The polarizer may also be of a film type or a liquid crystal coating type. The film type may include a stretchable synthetic resin film, and the liquid crystal coating type may include liquid crystals arranged in a predetermined or set arrangement.

In another embodiment, the optical functional member 30 may include a black matrix and color filters. The color filters may be arranged based on the colors of light emitted by the pixel of the display apparatus 1. Each color filter may include a red, green, or blue pigment or dye. Alternatively, each color filter may further include quantum dots in addition to the above-described pigment or dye. Alternatively, some of the color filters may not include the above-described pigment or dye and may include scattering particles such as titanium oxide.

In another embodiment, the optical functional member 30 may include a destructive interference structure. The destructive interference structure may include a first reflective layer and a second reflection layer arranged on different layers. First reflected light and second reflected light respectively reflected by the first reflection layer and the second reflection layer may destructively interfere with each other, and thus, the reflectance of external light may be reduced.

The adhesive portion 40 may connect the optical functional member 30 to the blocking portion 50. In this case, the adhesive portion 40 may include an optically clear adhesive (OCA).

The blocking portion 50 may include a base layer 51, a blocking layer 52, and a protection layer 53. The base layer 51 may include a transparent resin for nano-implant. For example, the base layer 51 may include polyethylene methyl methacrylate, a photocurable resin, etc.

The blocking layer 52 may be inserted into the base layer 51. The blocking layer 52 may be made of an opaque material to block external light and/or light of the display panel 20 from being transmitted to the outside (e.g., an external environment). In particular, the blocking layer 52 is provided as a plurality of blocking layers 52 and arranged to be spaced apart from each other, and thus, light of the display area DA may be prevented or substantially prevented from moving to an area such that a predetermined or set angle is formed in a Z-axis direction of FIGS. 1B and 1C with respect to a plane formed by the display area DA. Here, the blocking layer 52 may be formed in an ink form and may be formed by being inserted into a groove of the base layer 51 and cured. In this case, an end of the blocking layer 52 adjacent to an outer surface of the base layer 51 among ends of the blocking layer 52 may be concave. That is, the end of the blocking layer 52 may be recessed into the base layer 51. In this case, a portion of the adhesive portion 40 may be inserted into the concave portion of the blocking layer 52. A portion of the adhesive portion 40 may have a convex shape. A lengthwise direction (e.g., a Y-axis direction of FIGS. 2A and 2B) of the blocking layer 52 may be parallel to one side of the display apparatus 1 or may have a predetermined or set angle when the display apparatus 1 is formed in a rectangular shape (e.g., see FIGS. 2A and 2B).

The protection layer 53 may be arranged on an outer surface of the blocking layer 52 and the base layer 51 to protect the blocking layer 52 and the display panel 20 from external impact. In other words, the protection layer 53 form an outermost surface of the display apparatus 1. In this case, the protection layer 53 may include polycarbonate.

Figure 4A:
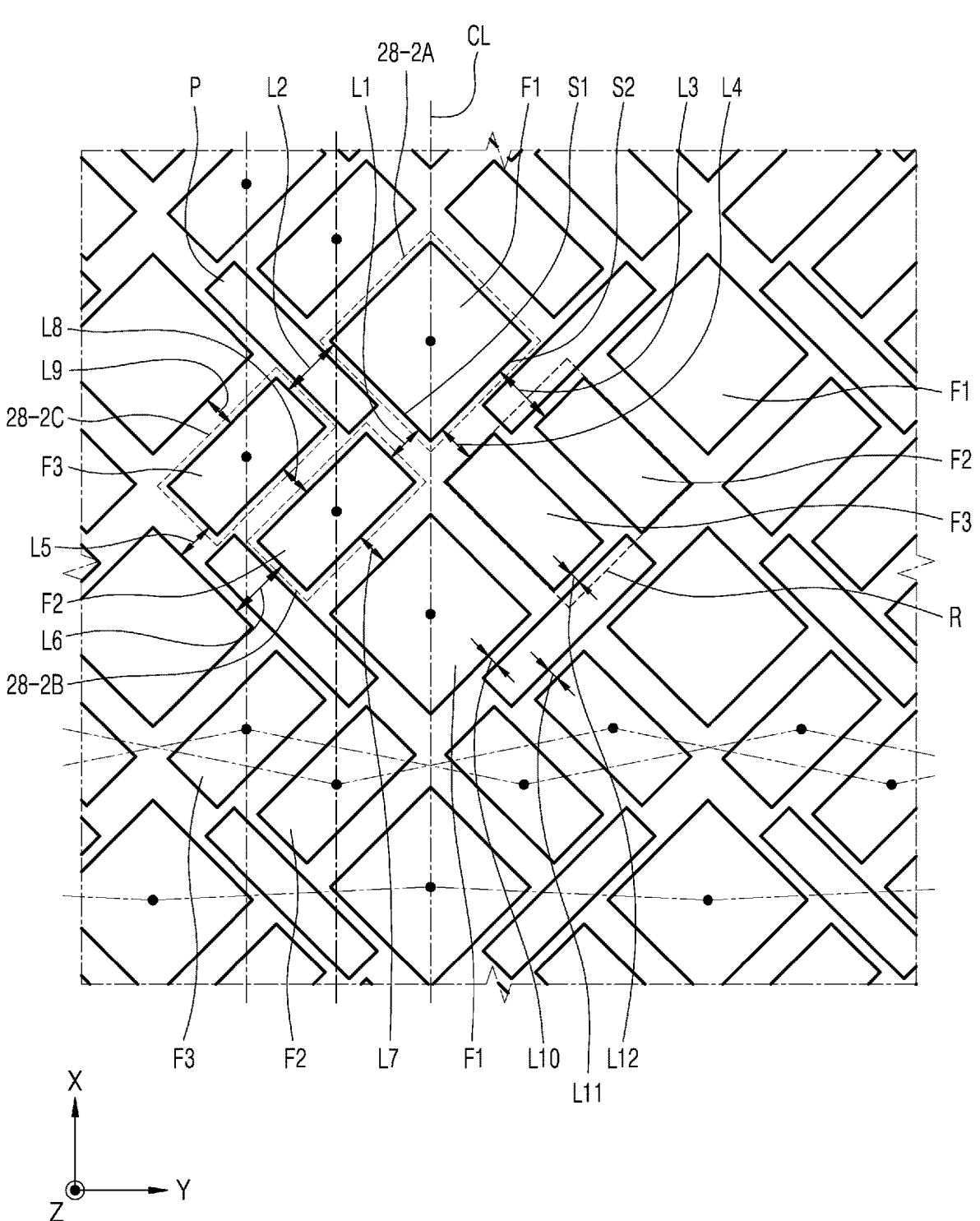
FIG. 4A is a plan view illustrating a first subpixel, a second subpixel, and a third subpixel of a display apparatus according to one or more embodiments.
Figure 4B:
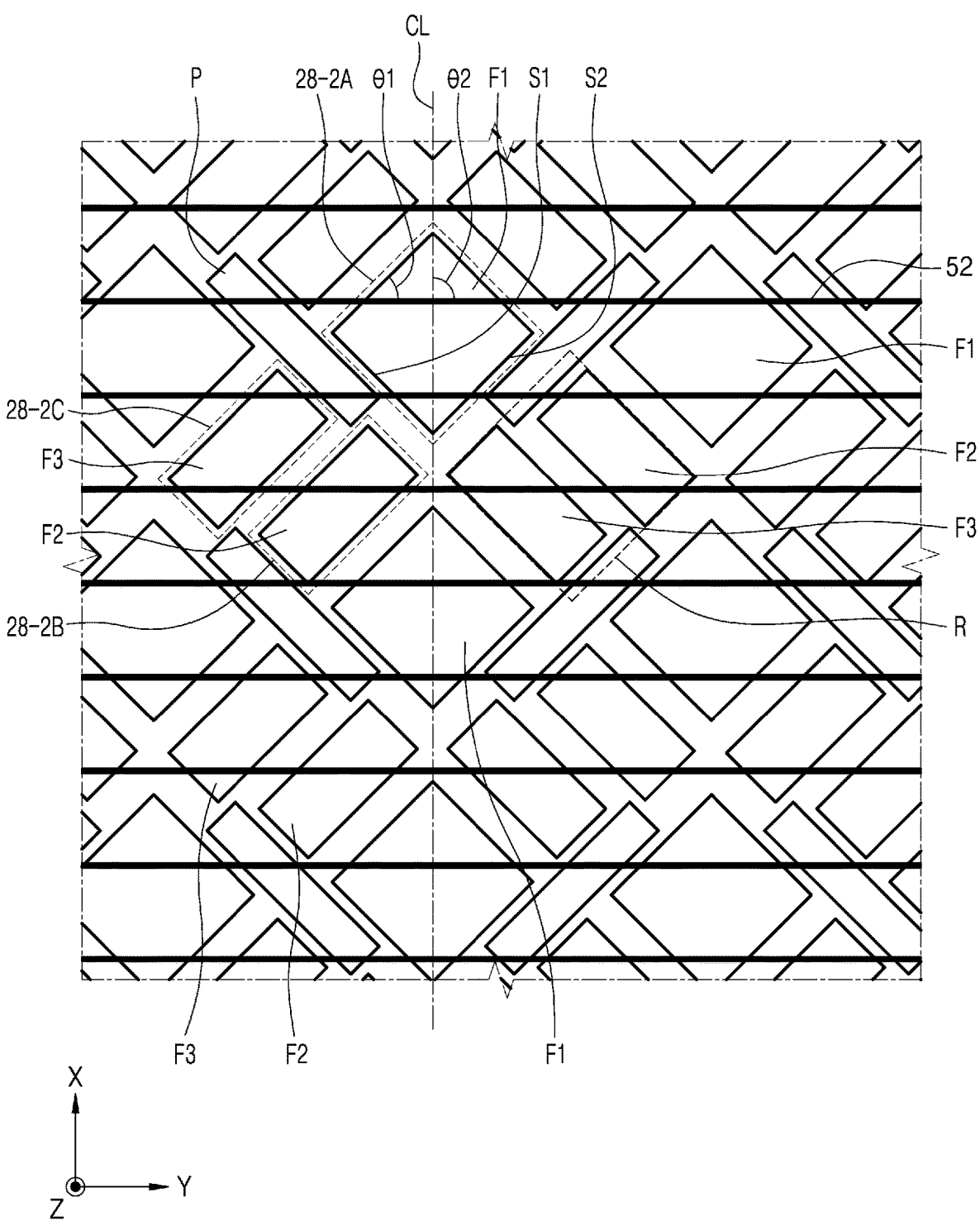
FIG. 4B is a plan view illustrating an arrangement of first, second, and third subpixels shown in FIG. 4A and a blocking layer.

FIG. 4A is a plan view illustrating a first subpixel F1, a second subpixel F2, and a third subpixel F3 of the display apparatus according to one or more embodiments. FIG. 4B is a plan view illustrating an arrangement of the first, second, and third subpixels F1, F2, and F3 shown in FIG. 4A and the blocking layer 52.

Referring to FIGS. 4A and 4B, the plurality of subpixels may include a first subpixel F1, a second subpixel F2, and a third subpixel F3. The first subpixel F1, the second subpixel F2, and the third subpixel F3 may have a rectangular shape or substantially rectangular shape. In this case, one of the first subpixel F1, the second subpixel F2, and the third subpixel F3 may have a rectangular, square, or diamond shape of which four sides are the same or substantially the same, and the other two of the first subpixel F1, the second subpixel F2, and the third subpixel F3 may have a rectangular shape of which each of two pairs of sides (e.g., sides opposite to each other) are the same or substantially the same. For example, one of the first subpixel F1, the second subpixel F2, and the third subpixel F3 may have a substantially square or diamond shape, and the other two of the first subpixel F1, the second subpixel F2, and the third subpixel F3 may have a substantially rectangular shape. In this case, the substantially square (or diamond) shape may refer to a rectangle in which, based on one of all sides of a square, the other remaining sides of the all sides each have a length within a certain margin of error from a length of the one side. Further, the substantially rectangular shape may refer to a rectangle in which one of a pair of sides facing (e.g., opposite to) each other has a length within a certain margin of error based on a length of the other one of the pair of sides facing (e.g., opposite to) each other. In particular, the first subpixel F1, the second subpixel F2, and the third subpixel F3, which are formed through a deposition process to be described below, may be formed in a substantially square or rectangular shape as described above. In this case, the first subpixel F1, the second subpixel F2, or the third subpixel F3 may have a substantially square (diamond) or rectangular shape in which edge portions are round or chamfered.

In one or more embodiments, an angle of each edge (or vertex) formed between connected sides of each of the first subpixel F1, the second subpixel F2, and the third subpixel F3 may not be equal to 90° at all edges (or vertices) and may also be within a certain margin of error.

Hereinafter, for convenience of description, one or more embodiments where the first subpixel F1 has a square shape, and the second subpixel F2 and the third subpixel F3 have a rectangular shape is described in more detail. As used herein, a square and a rectangle to be described below may respectively refer to a substantially square shape and a substantially rectangle shape as described above.

One of the first subpixel F1, the second subpixel F2, or the third subpixel F3 emits blue light, another one of the first subpixel F1, the second subpixel F2, and the third subpixel F3 emits red light, and the other one of the first subpixel F1, the second subpixel F2, and the third subpixel F3 emits green light. In this case, according to a shape of each of the first subpixel F1, the second subpixel F2, or the third subpixel F3, one of the blue, red, and green light may have a square shape, and the other of the blue, red, or green light may have a rectangular shape. Hereinafter, for convenience of description, one or more embodiments where the first subpixel F1 emits blue light, the second subpixel F2 emits red light, and the third subpixel F3 emits green light is described in more detail. However, the embodiments of the present disclosure are not limited thereto, and the first subpixel F1 may emit green light.

Areas of the first subpixel F1, the second subpixel F2, and the third subpixel F3 may be variously configured in a suitable manner. In this case, because an aperture ratio of each subpixel is adjustable, display panels with various suitable shapes and capable of various suitable operations may be implemented.

The first subpixel F1, the second subpixel F2, and the third subpixel F3 may respectively include a first intermediate layer 28-2A, a second intermediate layer 28-2B, and a third intermediate layer 28-2C. In one or more embodiments, the first intermediate layer 28-2A, the second intermediate layer 28-2B, and the third intermediate layer 28-2C may include materials (e.g., organic light-emitting layers) that emit different light beams when external power is applied thereto. In other words, the first intermediate layer 28-2A, the second intermediate layer 28-2B, and the third intermediate layer 28-2C may include different materials (e.g., organic emission layers) that emit different light beams (e.g., light beams of different colors) in response to power supplied to each of the intermediate layers.

The first intermediate layer 28-2A, the second intermediate layer 28-2B, and the third intermediate layer 28-2C may respectively correspond to the shapes of the first subpixel F1, the second subpixel F2, and the third subpixel F3. For example, the first intermediate layer 28-2A may have a square shape to correspond to a square shape of the first subpixel F1. In one or more embodiments, the second intermediate layer 28-2B and the third intermediate layer 28-2C may have a rectangular shape to correspond to a rectangular shape of the second subpixel F2 and the third subpixel F3, respectively. In this case, a planar area of each intermediate layer may be the same as or different from a planar area of each subpixel. For example, in one or more embodiments, a planar area of the first intermediate layer 28-2A may be different from a planar area of the first subpixel F1, a planar area of the second intermediate layer 28-2B may be the same as a planar area of the second subpixel F2, and a planar area of the third intermediate layer 28-2C may be the same as a planar area of the third subpixel F3. In another embodiment, the planar area of the second intermediate layer 28-2B may be different from the planar area of the second subpixel F2, the planar area of the first intermediate layer 28-2A may be the same as the planar area of the first subpixel F1, and the planar area of the third intermediate layer 28-2C may be the same as the planar area of the third subpixel F3. In another embodiment, the planar area of the third intermediate layer 28-2C may be different from the planar area of the third subpixel F3, the planar area of the second intermediate layer 28-2B may be the same as the planar area of the second subpixel F2, and the planar area of the first intermediate layer 28-2A may be the same as the planar area of the first subpixel F1. In another embodiment, the planar area of the first intermediate layer 28-2A may be the same as the planar area of the first subpixel F1, the planar area of the second intermediate layer 28-2B may be different from the planar area of the second subpixel F2, and the planar area of the third intermediate layer 28-2C may be different from the planar area of the third subpixel F3. In another embodiment, the planar area of the second intermediate layer 28-2B may be the same as the planar area of the second subpixel F2, the planar area of the first intermediate layer 28-2A may be different from the planar area of the first subpixel F1, and the planar area of the third intermediate layer 28-2C may be different from the planar area of the third subpixel F3. In another embodiment, the planar area of the third intermediate layer 28-2C may be the same as the planar area of the third subpixel F3, the planar area of the first intermediate layer 28-2A may be different from the planar area of the first subpixel F1, and the planar area of the second intermediate layer 28-2B may be different from the planar area of the second subpixel F2. In another embodiment, the planar area of the first intermediate layer 28-2A may be different from the planar area of the first subpixel F1, the planar area of the second intermediate layer 28-2B may be different from the planar area of the second subpixel F2, and the planar area of the third intermediate layer 28-2C may be different from the planar area of the third subpixel F3. In another embodiment, the planar area of the first intermediate layer 28-2A may be the same as the planar area of the first subpixel F1, the planar area of the second intermediate layer 28-2B may be the same as the planar area of the second subpixel F2, and the planar area of the third intermediate layer 28-2C may be the same as the planar area of the third subpixel F3. In one or more embodiments, the planar area may refer to an area of a plane formed by a display area of the display apparatus. Alternatively, the planar area may refer to an area of a plane on which an image is implemented when the image is implemented. Hereinafter, for convenience of description, one or more embodiments where a planar area of each intermediate layer is different from a planar area of each subpixel is described in more detail.

In one or more embodiments, the planar area of each subpixel may be less than the planar area of each intermediate layer as illustrated in FIGS. 4A and 4B. In one or more embodiments, each intermediate layer may be deposited on the substrate 21 to have a sufficient margin with respect to each subpixel, and thus, light having an accurate shape may be emitted from each subpixel.

Hereinafter, for convenience of description, because a relationship between the subpixels and a relationship between the intermediate layers are the same as or similar to each other, the relationship between the subpixels is described in more detail.

The first subpixel F1, the second subpixel F2, and the third subpixel F3 may be provided as a plurality of first subpixels F1, a plurality of second subpixels F2, and a plurality of third subpixels F3, respectively. The first subpixels F1 may be spaced apart from each other in at least one of a first direction or a second direction. For example, some of the first subpixels F1 may be arranged to be spaced apart from each other in the first direction (e.g., one of an X-axis direction and a Y-axis direction of FIG. 4A), and other ones of the first subpixels F1 may be arranged to be spaced apart from each other in the second direction (e.g., the other of the X-axis direction and the Y-axis direction of FIG. 4A). Hereinafter, for convenience of description, one or more embodiments where the first direction means the X-axis direction of FIG. 4A and the second direction means the Y-axis direction of FIG. 4A is described in more detail.

Centers of first subpixels F1 arranged in the first direction among the first subpixels F1 may be arranged in a straight line. In this case, the first subpixels F1 arranged in the first direction among the first subpixels F1 may be arranged in a row (or a straight line) in the first direction. Here, the first direction may be parallel to a long side of the display panel 20. In this case, in one or more embodiments, the first subpixel F1 may emit green light having high visibility. In particular, when the first subpixel F1 emits green light, the visibility of characters in an image implemented in (or provided by) the display panel 20 may be improved. In one or more embodiments, centers of first subpixels F1 arranged in the second direction among the first subpixels F1 may not be arranged in a straight line, but may be arranged in a serpentine (or zigzag) form (e.g., as illustrated in FIG. 4A).

A predetermined or set angle may be between a first side S1 and a second side S2 of each first subpixel F1. In particular, the first side S1 and the second side S2 of the first subpixel F1 may be perpendicular or normal to each other. In this case, the first side S1 and the second side S2 may be tilted in different directions with respect to at least one of the first direction or the second direction. Accordingly, each first subpixel F1 may be arranged in a diamond shape based on one of the first direction and the second direction, and an angle formed between two sides (e.g., the first side S1 and the second side S2) adjacent to each vertex of each first subpixel F1 may be 90°. In particular, each first subpixel F1 may have a square (or diamond) shape.

In this case, one second subpixel F2 and one third subpixel F3 may be arranged to face the first subpixel F1 at the first side S1 or the second side S2 of one first subpixel F1. The second subpixel F2 and the third subpixel F3 may be tilted with respect to one of the first direction and the second direction. In particular, the second subpixel F2 and the third subpixel F3 may be tilted such that an angle of 45° or about 45° is formed with respect to one of the first direction and/or the second direction. For example, an angle of 45° or about 45° may be formed between at least one of a short side or a long side of at least one of the second subpixel F2 or the third subpixel F3 and a straight line connecting or crossing the centers of the first subpixels F1 arranged in the first direction. In one or more embodiments, one side of the second subpixel F2 and one side of the third subpixel F3 may be parallel to one side of the first subpixel F1.

The second subpixel F2 and the third subpixel F3 may each have a rectangular shape. Here, an area of at least one of the second subpixel F2 or the third subpixel F3 may be less than an area of the first subpixel F1. In one or more embodiments, at least one of the second subpixel F2 or the third subpixel F3 facing the first subpixel F1 may be arranged to overlap one side (e.g., the first side S1 or the second side S2) of the first subpixel F1 facing the second subpixel F2 and the third subpixel F3, and/or may be arranged to overlap an extension line of the one side of the first subpixel F1 (in a direction parallel to a plane defined by the X axis and the Y axis). For example, at least a side portion of the second subpixel F2 and at least a side portion of the third subpixel F3 adjacent to the second subpixel F2 may be arranged within a length range of one of the first side S1 or the second side S2.

A short side or a long side of at least one of a second subpixel F2 or a third subpixel F3 facing one first subpixel F1 may be parallel to the first side S1 or the second side S2. In one or more embodiments, extension lines of short sides of different second subpixels F2 respectively facing the first side S1 and the second side S2 may cross each other, or extension lines of long sides of the different second subpixels F2 respectively facing the first side S1 and the second side S2 may cross each other. In another embodiment, extension lines of short sides of third subpixels F3 respectively facing the first side S1 and the second side S2 may cross each other, or extension lines of long sides of the third subpixels F3 respectively facing the first side S1 and the second side S2 may cross each other. In another embodiment, the extension line of the short side of the second subpixel F2 facing the first side S1 may cross the extension line of the short side of the third subpixel F3 facing the second side S2, or the extension line of the long side of the second subpixel F2 facing the first side S1 may cross the extension line of the long side of the third subpixel F3 facing the second side S2. In another embodiment, the extension line of the long side of the second subpixel F2 facing the first side S1 may cross the extension line of the short side of the third subpixel F3 facing the second side S2, or the extension line of the short side of the second subpixel F2 facing the first side S1 may cross the extension line of the long side of the third subpixel F3 facing the second side S2. A short side of the second subpixel F2 or a short side of the third subpixel F3 may be arranged in a straight line extending from one side of another first subpixel F1.

The second subpixels F2 may be arranged to be spaced apart from each other in at least one of the first direction or the second direction. In this case, centers of some of second subpixels F2 arranged in one of the first direction and the second direction may be arranged in a straight line, and centers of the others of the second subpixels F2 arranged in the other of the first direction or the second direction may be arranged in a serpentine (or zigzag) form in the other of the first direction and the second direction. Hereinafter, for convenience of description, one or more embodiments where centers of some of the second subpixels F2 arranged in the first direction are arranged in a straight line, and centers of the others of the second subpixels F2 arranged in the second direction are arranged in a serpentine form is described in more detail.

Similarly to the second subpixel F2, the third subpixels F3 may be arranged to be spaced apart from each other in at least one of the first direction or the second direction. In this case, the third subpixels F3 may be arranged in a similar manner to the second subpixel F2. Hereinafter, for convenience of description, one or more embodiments where centers of some of third subpixels F3 arranged in the first direction among the third subpixels F3 are arranged in a straight line, and centers of the others of the third subpixels F3 arranged in the second direction among the third subpixels F3 are arranged in a serpentine form is described in more detail.

In the case described above, one of a second subpixel F2 and a third subpixel F3 facing a first side S1 of a first subpixel F1 may be arranged to be symmetrical to one of a second subpixel F2 and a third subpixel F3 facing a second side S2 of the first subpixel F1 with respect to or about a straight line (or a straight line that passes through centers of two adjacent subpixels and is parallel to the first direction)

connecting or crossing the centers of the first subpixels F1 arranged in the first direction. For example, in one or more embodiments, the second subpixel F2 facing the first side S1 may be symmetrical to the third subpixel F3 facing the second side S2 with respect to or about the straight line. In one or more embodiments, the third subpixel F3 facing the first side S1 may be symmetrical to the second subpixel F2 facing the second side S2 with respect to or about the straight line. In this case, a distance between the centers of the second subpixels F2 adjacent to each other may be the same as a distance between the centers of the third subpixels F3 adjacent to each other. In another embodiment, the second subpixel F2 and the third subpixel F3 facing the first side S1 may be symmetrical to the second subpixel F2 and the third subpixel F3 facing the second side S2 with respect to or about the straight line. In this case, a distance between centers of one of a pair of second subpixels F2 and a pair of third subpixels F3 arranged to be symmetrical to each other may be less than a distance between centers of the other of the pair of second subpixels F2 or the pair of third subpixels F3 arranged to be symmetrical to each other. In this case, the pair of second subpixels F2 adjacent to each other may be positioned between the pair of third subpixels F3 adjacent to each other, or the pair of third subpixels F3 adjacent to each other may be positioned between the pair of second subpixels F2 adjacent to each other. However, hereinafter, for convenience of description, one or more embodiments where the second subpixel F2 and the third subpixel F3 are arranged to be symmetrical to each other with respect to or about a straight line connecting or crossing the centers of the first subpixels F1 arranged in the first direction is described in more detail.

A size of the second subpixel F2 may be the same as a size of the third subpixel F3. For example, a planar area of the second subpixel F2 may be the same as a planar area of the third subpixel F3. In this case, a size of the short side of the second subpixel F2 may be the same as a size of the short side of the third subpixel F3, and a size of the long side of the second subpixel F2 may be the same as a size of the long side of the third subpixel F3. Here, the second intermediate layer 28-2B and the third intermediate layer 28-2C respectively arranged in the second subpixel F2 and the third subpixel F3 may also have substantially the same size as the second subpixel F2 and the third subpixel F3.

A shortest distance from one of two subpixels facing one side of the first subpixel F1 to the one side of the first subpixel F1 may be different from a shortest distance from the other of the two subpixels to the one side of the first subpixel F1. For example, a first distance L1, which is a shortest distance from an edge of the first subpixel F1 to the second subpixel F2, may be different from a second distance L2, which is a shortest distance from the edge of the first subpixel F1 to the third subpixel F3. In particular, the first distance L1 may be less than the second distance L2. In this case, the shortest distance may be measured from the first side S1 or the second side S2 to one side of the second subpixel F2 or one side of the third subpixel F3 in a direction perpendicular or normal to one of the first side S1 and the second side S2. In another embodiment, the shortest distance may be measured from the first side S1 (or an extension line of the first side S1) or the second side S2 (or an extension line of the second side S2) to one side of the second subpixel F2 or one side of the third subpixel F3 in a direction perpendicular or normal to an extension line of one of the first side S1 and the second side S2. However, hereinafter, for convenience of description, one or more embodiments where the shortest distance is a distance measured between the first side S1 or the extension line of the first side S1 and the second subpixel F2 and the third subpixel F3 facing the first side S1 is described in more detail. In another embodiment, the shortest distance may be measured as a distance from the center of the first subpixel F1 to the center of the second subpixel F2 or a distance from the center of the first subpixel F1 to the center of the third subpixel F3. In another embodiment, the shortest distance may be measured as a distance from the first side S1 of the first subpixel F1 or an extension line of the first side S1 to the center of the second subpixel F2 or a distance from the first side S1 of the first subpixel F1 or the extension line of the first side S1 to the center of the third subpixel F3.

In one or more embodiments, a distance from an edge of one of the second subpixel F2 and the third subpixel F3 facing the same first subpixel F1 to the edge of the first subpixel F1 may be different from a distance from an edge of the other of the second subpixel F2 or the third subpixel F3 to the edge of the first subpixel F1. For example, the first distance L1 from the short side of the second subpixel F2 facing the first side S1 of one first subpixel F1 to the first side S1 may be different from a third distance L3 from the short side of the second subpixel F2 facing the second side S2 to the second side S2. Further, the second distance L2 from the short side of the third subpixel F3 facing the first side S1 of the first subpixel F1 to the first side S1 may be different from a fourth distance L4 from the short side of the third subpixel F3 facing the second side S2 to the second side S2. Here, the third distance L3 may be equal to or substantially equal to the second distance L2, and the fourth distance L4 may be equal to or substantially equal to the first distance L1.

In one or more embodiments, a shortest distance from an edge of one of a second subpixel F2 and a third subpixel F3 arranged between the first subpixels F1 adjacent to each other to an edge of one first subpixel F1 may be different from a shortest distance from an edge of the one of the second subpixel F2 or the third subpixel F3 to an edge of another first subpixel F1. For example, the first distance L1 from the short side of the second subpixel F2 facing the first side S1 of the first subpixel F1 to the first side S1 may be different from a sixth distance L6 from the short side of the second subpixel F2 facing one side of another adjacent first subpixel F1 to the one side of the other adjacent first subpixel F1. Further, the second distance L2 from the short side of the third subpixel F3 facing the first side S1 of the first subpixel F1 to the first side S1 may be different from a fifth distance L5 from the short side of the third subpixel F3 facing the one side of another adjacent first subpixel F1 to the one side of the other adjacent first subpixel F1. Here, the relationship described above may be equally applied to the long side of the second subpixel F2 and the long side of the third subpixel F3, and may also be equally applied to the first intermediate layer 28-2A, the second intermediate layer 28-2B, and the third intermediate layer 28-2C.

In the case described above, a seventh distance L7 from one side of the first subpixel F1 to the long side of the second subpixel F2 that face each other, an eighth distance L8 between the long side of the second subpixel F2 and the long side of the third subpixel F3 that face each other, and a ninth distance L9 from the long side of the third subpixel F3 to the one side of the first subpixel F1 that face each other may be the same. Here, the seventh distance L7 to the ninth distance L9 may be greater than or equal to the first distance L1 and may be less than the second distance L2. In particular, such distances provide a width of a mask sheet portion arranged between openings of a mask sheet that is to be described below, and thus, the rigidity of the mask sheet may be maintained. In one or more embodiments, such distances may prevent or substantially prevent the intermediate layers from overlapping or being connected to each other.

An outline R connecting a portion of an edge of the second subpixel F2 to a portion of an edge of the third subpixel F3 may have a square shape, the second subpixel F2 and the third subpixel F3 facing one side of the first subpixel F1. For example, the outline R may be drawn by connecting, except for one side of the second subpixel F2 and one side of the third subpixel F3, the other edges of the second subpixel F2 to the other edges of the third subpixel F3, and connecting a vertex of the second subpixel F2 to a vertex of the third subpixel F3, at a portion where the second subpixel F2 and the third subpixel F3 are spaced apart from each other, wherein the one side of the second subpixel F2 and the one side of the third subpixel F3 face each other, and the vertex of the second subpixel F2 and the vertex of the third subpixel F3 face each other. The outline R may be formed in a square shape such that the second subpixel F2 and the third subpixel F3 are arranged at the second side S2 by rotating the second subpixel F2 and the third subpixel F3 arranged at the first side S1, and thus, an arrangement of the second subpixel F2 and the third subpixel F3 arranged at the second side S2 corresponds to an arrangement of the second subpixel F2 and the third subpixel F3 that face the first side S1.

The first intermediate layer 28-2A, the second intermediate layer 28-2B, and the third intermediate layer 28-2C, which respectively form the first subpixel F1, the second subpixel F2, and the third subpixel F3, may be formed and arranged in the same or a similar manner as the first subpixel F1, the second subpixel F2, and the third subpixel F3, respectively. In this case, centers of the first intermediate layer 28-2A, the second intermediate layer 28-2B, and the third intermediate layer 28-2C may be respectively arranged at positions that are the same as or different from the centers of the first subpixel F1, the second subpixel F2, and the third subpixel F3. Here, the descriptions of the first subpixel F1, the second subpixel F2, and the third subpixel F3 described above may be respectively applied to the first intermediate layer 28-2A, the second intermediate layer 28-2B, and the third intermediate layer 28-2C.

A spacer P may be arranged in at least one of a space between the first subpixel F1 and the second subpixel F2 or a space between the first subpixel F1 and the third subpixel F3. Hereinafter, for convenience of description, one or more embodiments where the spacer P is arranged between one first side S1 and the third subpixel F3 and between one second side S2 and the second subpixel F2 is described in more detail.

Distances from subpixels facing an edge of the spacer P to the edge of the spacer P may be the same. For example, a tenth distance L10 from one side of the first subpixel F1 facing the edge of the spacer P to the edge of the spacer P, an eleventh distance L11 from the short side of the second subpixel F2 facing the edge of the spacer P to the edge of the spacer P, and a twelfth distance L12 from the short side of the third subpixel F3 facing the edge of the spacer P to the edge of the spacer P may be the same.

A blocking layer 52 may be arranged on at least one of the first subpixel F1, the second subpixel F2, or the third subpixel F3. In this case, the blocking layer 52 may be provided as a plurality of blocking layers 52, and the blocking layers 52 may be arranged to be spaced apart from each other.

In a plan view, each blocking layer 52 may be arranged to cross a center line CL where centers of some of the first subpixels F1 are arranged. In this case, in a plan view, at least one of the blocking layers 52 may overlap two sides of at least one of the first subpixels F1. For example, in FIG. 4B, in a plan view, one of the blocking layers 52 may overlap the first side S1 and the second side S2 of the first subpixel F1.

The center line CL may be arranged in the first direction. In this case, in a plan view, a second angle 82 may be formed between the center line CL and the blocking layer 52. The second angle 82 may be a right angle.

A lengthwise direction of the blocking layer 52 may be parallel to a direction of one of the long side and the short side of the substrate 21. For example, when the display apparatus 1 is arranged as shown in FIG. 1B, the lengthwise direction of the blocking layer 52 may be parallel to a direction of the long side of the substrate 21. In one or more embodiments, when the display apparatus 1 is arranged as shown in FIG. 1C, the lengthwise direction of the blocking layer 52 may be parallel to a direction of the short side of the substrate 21. That is, the lengthwise direction of the blocking layer 52 may be parallel to one surface of the window arranged in the vehicle. Further, the lengthwise direction of the blocking layer 52 may be the same as a gaze direction of a user sitting in a lateral direction of the display apparatus.

A predetermined or set angle may be formed between the lengthwise direction of the blocking layer 52 and one side of at least one of the first subpixel F1, the second subpixel F2, or the third subpixel F3. Hereinafter, for convenience of description, one or more embodiments where an angle formed between the lengthwise direction of the blocking layer 52 and one side of the first subpixel F1 is described in more detail.

A first angle 61 may be formed between the lengthwise direction of the blocking layer 52 and a one side of the first subpixel F1. In this case, the first angle 61 may in a range of about 5° to about 85°. In particular, when the first angle 61 is less than 5° or more than 85°, a Moire phenomenon that is visible in the display apparatus due to the blocking layer 52 may not be removed.

The display panel 20 may be fixed to an apparatus that transports a user, such as a vehicle, an airplane, or the like. In this case, the display apparatus may be fixed to the apparatus such that a predetermined or set angle that is not 0° is formed between a user's gaze direction and the first direction or the second direction. For example, the display panel 20 may be arranged such that an angle of 90° is formed between the user's gaze direction looking at the display panel 20 and the first direction or the second direction. In this case, as described above, each subpixel may be tilted with respect to the user's gaze direction (e.g., the Y-axis direction of FIG. 4B). For example, one side of each subpixel may be tilted with respect to the first direction or the second direction. In this case, one side of each subpixel may be inclined with respect to one of the blocking layer 52, the center line CL, a long side of the display apparatus, and a short side of the display apparatus. Hereinafter, for convenience of description, one or more embodiments where an angle of 90° is formed between the user's gaze direction looking at the display panel 20 and the first direction is described in more detail.

In the case described above, when the user looks at the display panel 20, an inclined portion of the pixel-defining layer 29 and the gaze direction are not perpendicular or normal to each other, and thus, external light may be reflected through the inclined portion of the pixel-defining layer 29 and prevented or substantially prevented from being incident to the user's eyes. In other words, the inclined portion of the pixel-defining layer 29 may prevent or substantially prevent external light from being reflected into the user's eyes.

Therefore, the display apparatus may reduce glare of the user caused by external light. In one or more embodiments, the display apparatus may remove the Moire phenomenon generated by the external light through the blocking layer 52. During operation, the display apparatus may prevent or substantially prevent an image, a character, etc. from being formed or reflected in a window of a vehicle.

Figure 5:
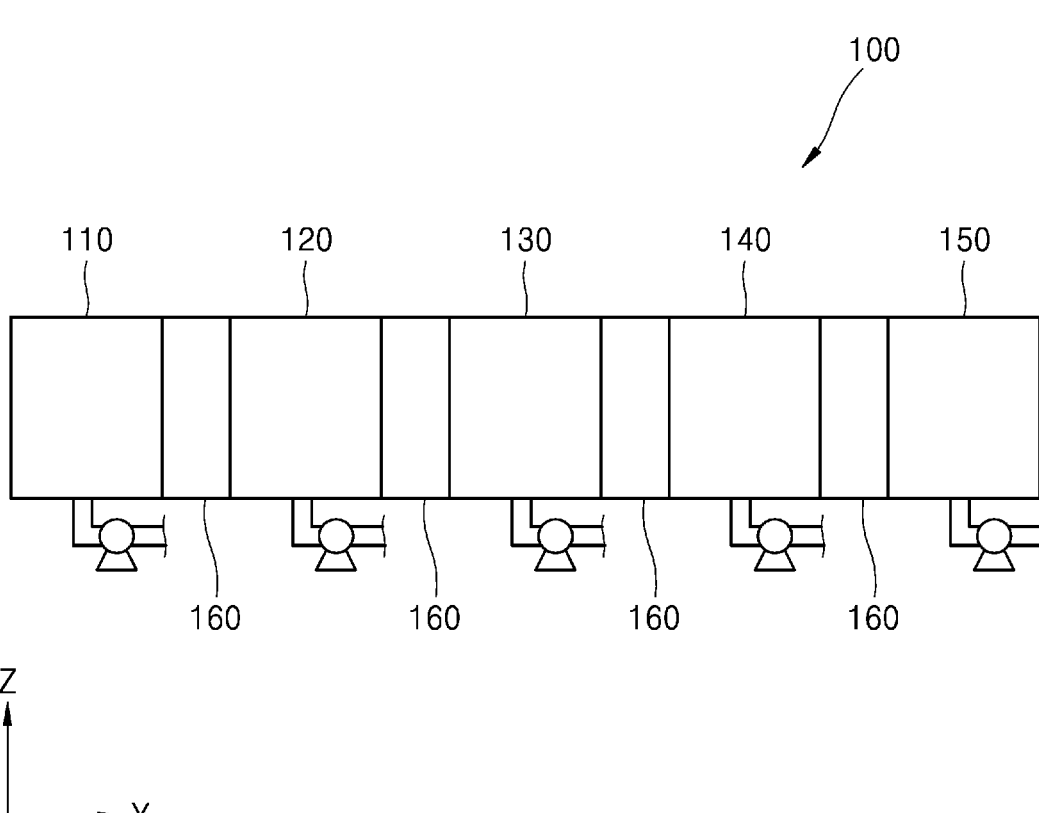
FIG. 5 is a front view illustrating an apparatus for manufacturing a display apparatus shown in FIGS. 2A and 2B.
Figure 6:
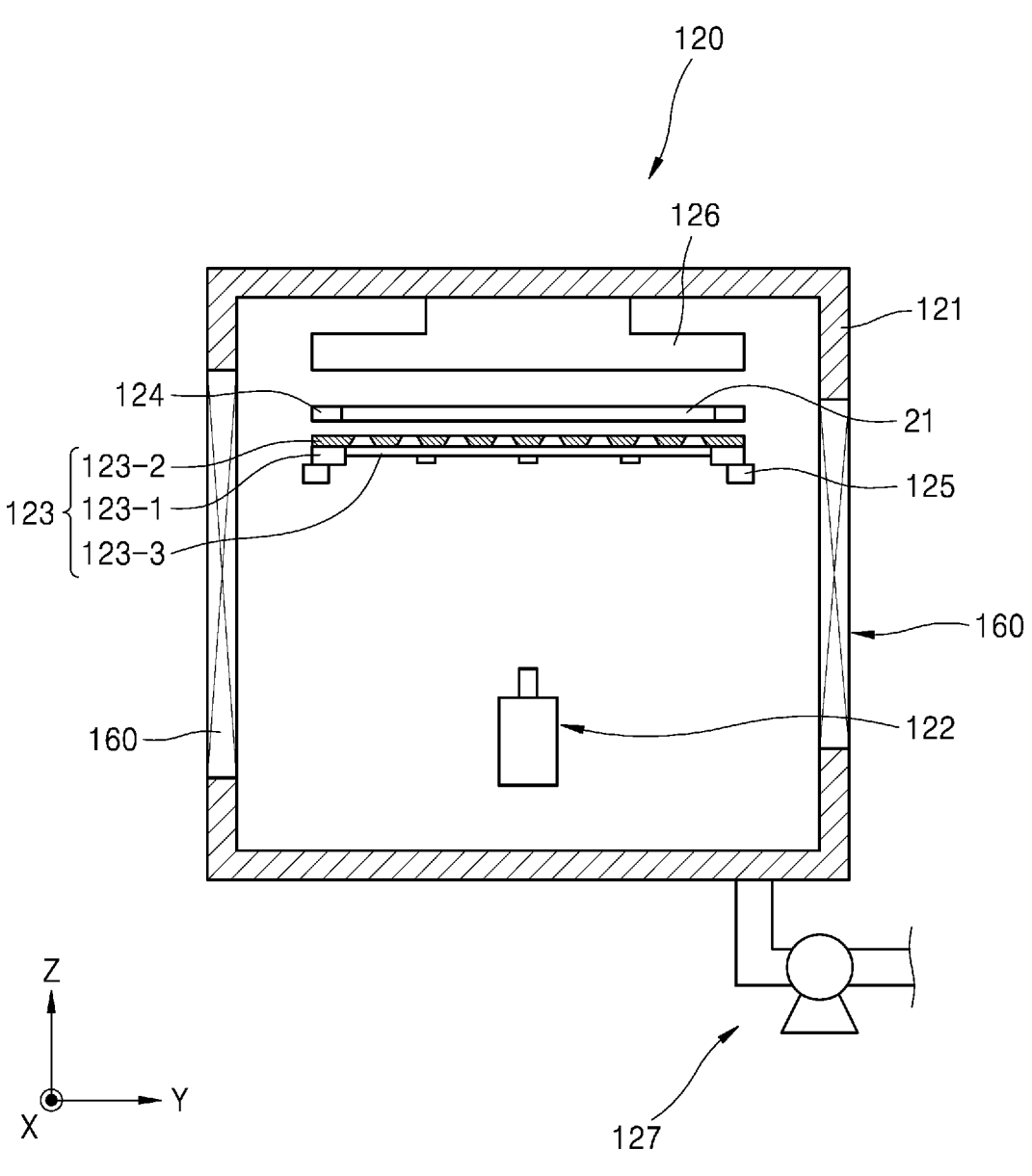
FIG. 6 is a cross-sectional view of a first deposition portion shown in FIG. 5.
Figure 7:
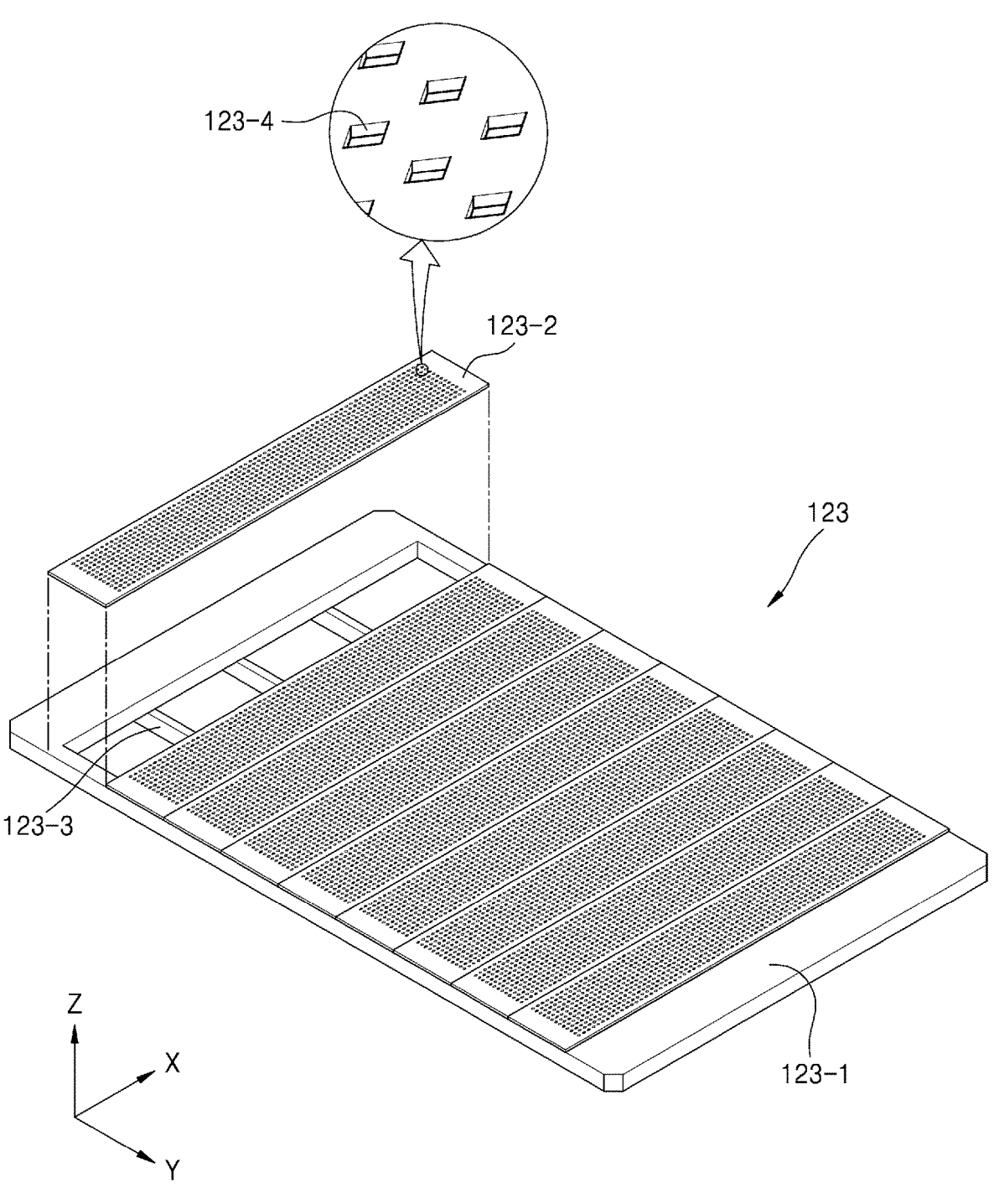
FIG. 7 is a perspective view illustrating a first mask assembly shown in FIG. 6.
Figure 8:
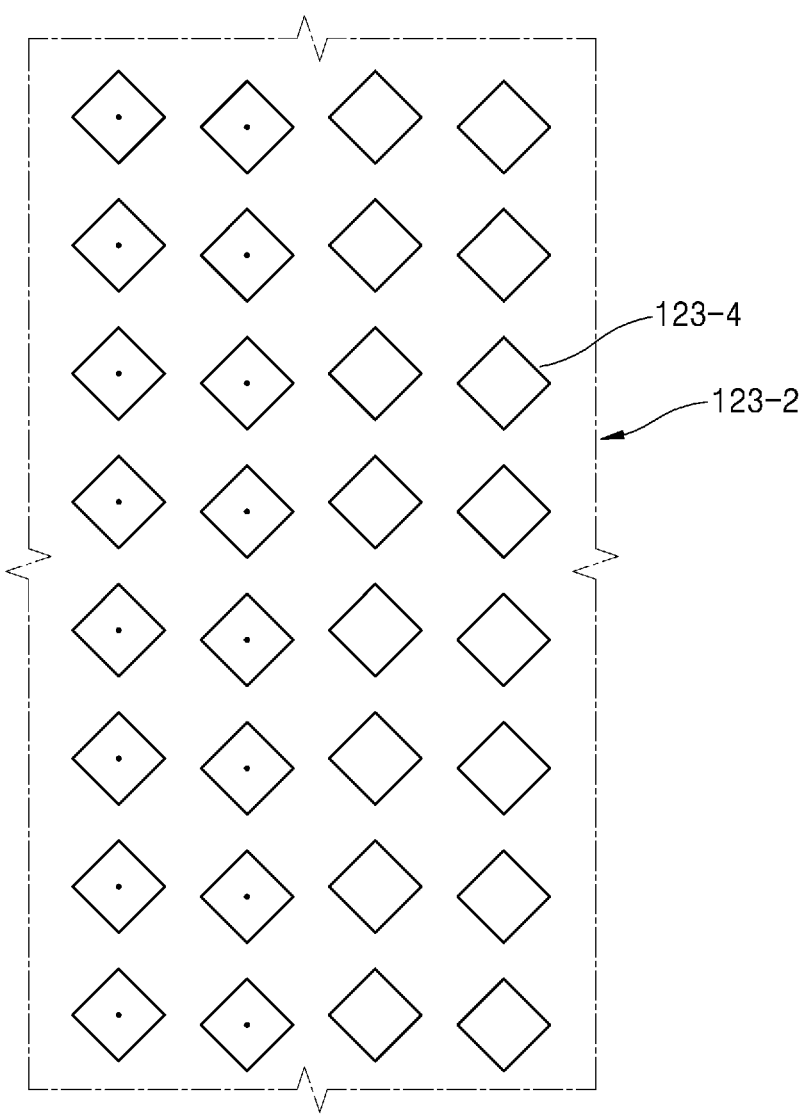
FIG. 8 is a plan view illustrating a portion of a first mask sheet shown in FIG. 7.
Figure 8:
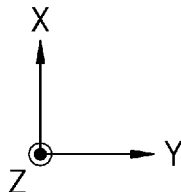
Figure 9:
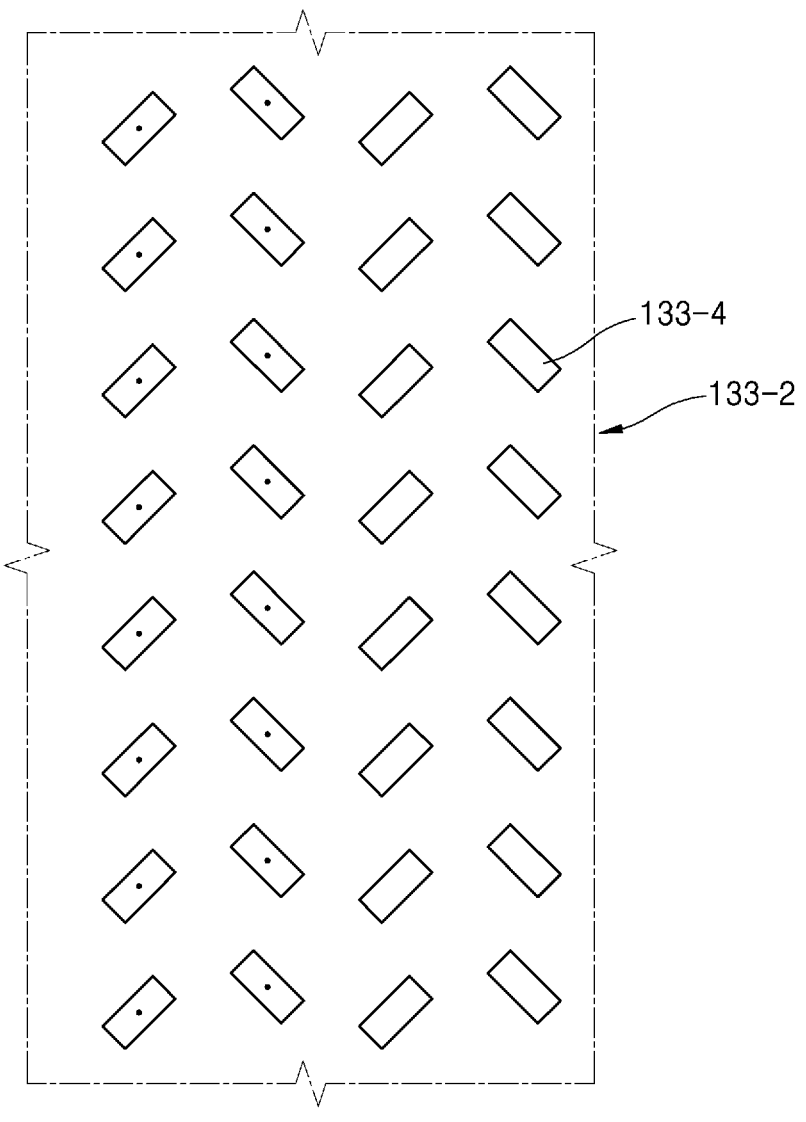
FIG. 9 is a plan view illustrating a portion of a second mask sheet used by a second deposition portion shown in FIG. 5.
Figure 9:
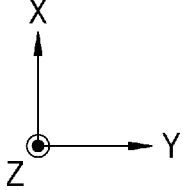
Figure 10:
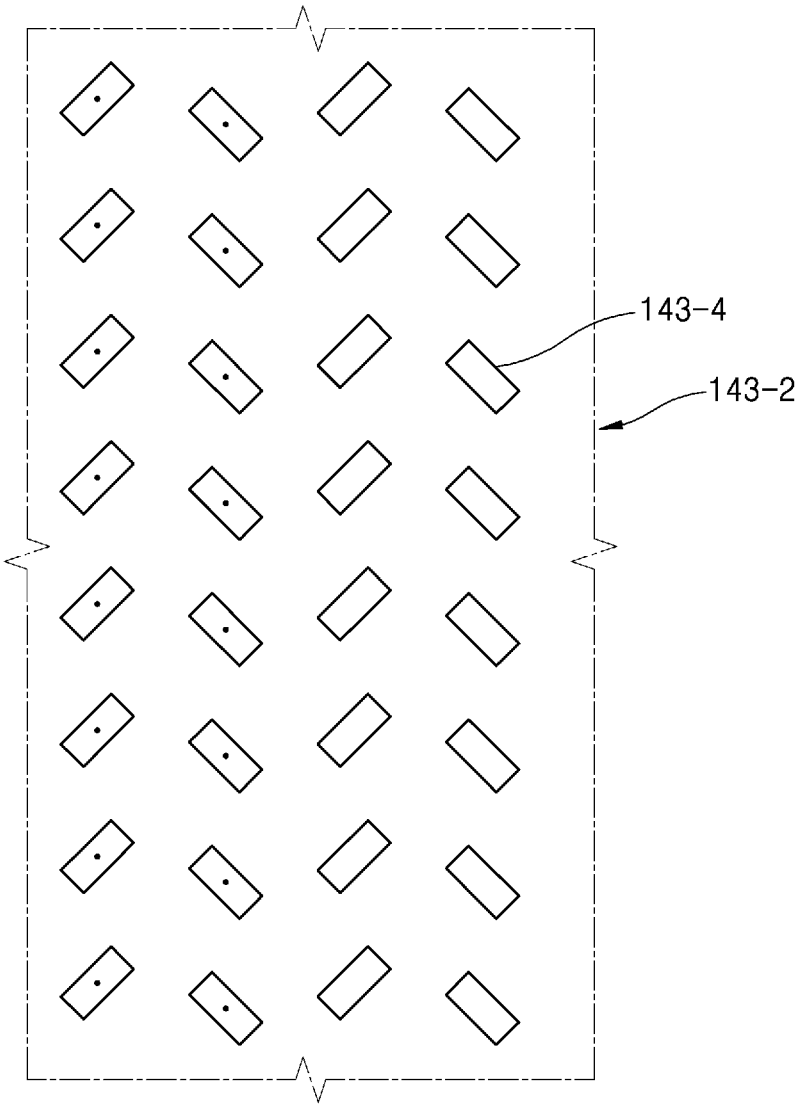
FIG. 10 is a plan view illustrating a portion of a third mask sheet used by a third deposition portion shown in FIG. 5.
Figure 10:
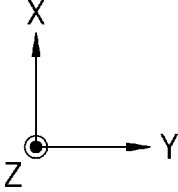

FIG. 5 is a front view illustrating an apparatus 100 for manufacturing a display apparatus shown in FIGS. 2A and 2B. FIG. 6 is a cross-sectional view of a first deposition portion 120 shown in FIG. 5. FIG. 7 is a perspective view illustrating a first mask assembly shown in FIG. 6. FIG. 8 is a plan view illustrating a portion of a first mask sheet 123-2 shown in FIG. 7. FIG. 9 is a plan view illustrating a portion of a second mask sheet 133-2 used by a second deposition portion 130 shown in FIG. 5. FIG. 10 is a plan view illustrating a portion of a third mask sheet 143-2 used by a third deposition portion 140 shown in FIG. 5.

Referring to FIGS. 5 through 10, the apparatus 100 for manufacturing a display apparatus may include an apparatus for loading a substrate 21, an apparatus for manufacturing a TFT on the substrate 21, an apparatus to form a pixel electrode, a pixel-defining layer, and a spacer on the substrate 21, an apparatus to form an intermediate layer on the substrate 21, an apparatus to form an opposite electrode on the substrate 21, an apparatus to form an encapsulation portion on the substrate 21, an apparatus for unloading the substrate 21, and the like. In one or more embodiments, the apparatus 100 for manufacturing a display apparatus may be formed such that the apparatuses described above are connected to each other in an in-line form. In another embodiment, the apparatus 100 for manufacturing a display apparatus may be formed such that only some of the apparatuses described above are arranged in the in-line form, and the others are arranged to be spaced apart from the some of the apparatuses arranged in the in-line form. In another embodiment, the apparatus 100 for manufacturing a display apparatus may be formed such that each apparatus is arranged separately. However, hereinafter, for convenience of description, one or more embodiments where the apparatus 100 for manufacturing a display apparatus includes a loading apparatus, an apparatus to form the intermediate layer, and an unloading apparatus is described in more detail.

The apparatus 100 for manufacturing a display apparatus may include a loader 110, a first deposition portion 120, a second deposition portion 130, a third deposition portion 140, and an unloader 150. In one or more embodiments, the apparatus 100 for manufacturing a display apparatus may include a shielding portion 160 that is arranged between the apparatuses connected to each other to disconnect or connect a space between the apparatuses. In other words, the shielding portion 160 may function as a partition between the loader 110, the first deposition portion 120, the second deposition portion 130, the third deposition portion 140, and/or the unloader 150.

A first intermediate layer, a second intermediate layer, and a third intermediate layer may be deposited on the substrate 21 in various suitable orders by the first deposition portion 120, the second deposition portion 130, and the third deposition portion 140. For example, one of the first intermediate layer, the second intermediate layer, and the third intermediate layer is deposited on the substrate 21 by the first deposition portion 120, another one of the first intermediate layer, the second intermediate layer, and the third intermediate layer may be deposited on the substrate 21 by the second deposition portion 130, and the other one of the first intermediate layer, the second intermediate layer, and the third intermediate layer may be deposited on the substrate 21 by the third deposition portion 140. However, hereinafter, for convenience of description, one or more embodiments where the first intermediate layer is deposited on the substrate 21 by the first deposition portion 120, the second intermediate layer is deposited on the substrate 21 by the second deposition portion 130, and the third intermediate layer is deposited on the substrate 21 by the third deposition portion 140 is described in more detail. Hereinafter, for convenience of description, one or more embodiments where the first intermediate layer, the second intermediate layer, and the third intermediate layer have the same shape and arrangement as those of the first subpixel, the second subpixel, and the third subpixel, respectively, described with reference to FIGS. 1A through 4B is described in more detail.

The substrate 21 may be inserted from the outside (e.g., an external environment) and temporarily stored in the loader 110. In this case, the loader 110 may store a plurality of substrates 21 or one substrate 21. The loader 110 may receive the substrate 21 from the outside (e.g., an external environment) by using a robot arm or a movable shuttle arranged therein and supply the substrate 21 to the first deposition portion 120. In this case, a pixel-defining layer may be stacked on the substrate 21. Hereinafter, for convenience of description, one or more embodiments where the loader 110 supports the substrate 21 by using the robot arm therein and supplies, to the first deposition portion 120, the substrate 21 supplied by the robot arm while being seated on the shuttle, is described in more detail.

The first intermediate layer may be deposited on the substrate 21 by the first deposition portion 120. In this case, the first deposition portion 120 may be provided as at least one first deposition portion 120. For example, in one or more embodiments, when a first deposition portion 120 is provided, at least one layer of the first intermediate layer may be formed by the first deposition portion 120. In this case, the first deposition portion 120 may include at least one first deposition source 122 to form a layer of the first intermediate layer on the substrate 21. In particular, when the first deposition source 122 is provided as a plurality of first deposition sources 122 and the first deposition portion 120 forms a plurality of layers of the first intermediate layer, each first deposition source 122 may be replaceable (e.g., replaceable with another first deposition source in response to exhausting the deposition material of each of the first deposition sources 122). In this case, each first deposition source 122 may accommodate different deposition materials. In another embodiment, when the first deposition portion 120 is provided as a plurality of first deposition portions 120, each layer of the first intermediate layer may be deposited separately on the substrate 21 by each first deposition portion 120. In other words, each of the first deposition portions 120 of the plurality of first deposition portions 120 may deposit a corresponding layer of the plurality of layers of the first intermediate layer on the substrate 21. In one or more embodiments, different deposition materials may be deposited on the substrate 21 by each first deposition portion 120. However, hereinafter, for convenience of description, one or more embodiments where only one first deposition source 122 is provided and only an organic emission layer of the first intermediate layer is formed by the first deposition source 122 is described in more detail.

The first deposition portion 120 may include a first chamber 121, a first deposition source 122, a first mask assembly 123, a first substrate support 124, a first mask support 125, a first magnetic force generator 126, and a first pressure controller 127.

The first chamber 121 may have a space therein and may have one side open such that the substrate 21 may be withdrawn therefrom or accommodated therein. In this case, the shielding portion 160 including a gate valve may be arranged in the open portion of the first chamber 121 to selectively open and close the first chamber 121. In one or more embodiments, two sides (e.g., two opposing sides) of the first chamber 121 may be selectively opened and closed to allow the substrate 21 to be withdrawn from the first chamber 121 or received by the first chamber 121.

The first deposition source 122 may accommodate a first deposition material forming at least one layer of the first intermediate layer. In this case, the first deposition source 122 may vaporize or sublimate the first deposition material by applying energy (e.g., thermal energy, light energy, vibration energy, etc.) thereto.

The first deposition source 122 may be replaceable. In this case, when the accommodated first deposition material is exhausted, the first deposition source 122 may be replaced with a new first deposition source 122.

The first mask assembly 123 may include a first mask frame 123-1, a first mask sheet 123-2, and a first support frame 123-3.

The first mask frame 123-1 may have an opening at a center thereof. In this case, the first mask frame 123-1 may be formed in a window frame shape. In another embodiment, the first mask frame 123-1 may have an opening at the center thereof, and a separate frame that divides the opening in a grid form may also be arranged. Hereinafter, for convenience of description, one or more embodiments where the first mask frame 123-1 has one opening at the center thereof is described in more detail.

The first mask sheet 123-2 may be arranged on one surface of the first mask frame 123-1 while being tensioned in at least one of the first direction or the second direction, and may be fixed to the first mask frame 123-1 by welding or the like. In this case, a groove may be formed in the first mask frame 123-1 to accommodate the first mask sheet 123-2. The first mask sheet 123-2 may have a rectangular shape and may be arranged at one side of the first mask frame 123-1. In one or more embodiments, the first mask sheet 123-2 may have a slit shape.

The first mask sheet 123-2 may be provided as a plurality of first mask sheets 123-2. In this case, the first mask sheets 123-2 may be arranged in a row to be adjacent to each other in the first direction or the second direction. In particular, in this case, a long side of the first mask sheet 123-2 may be parallel to a long side or a short side of the first mask frame 123-1. Hereinafter, for convenience of description, one or more embodiments where the long side of the first mask sheet 123-2 is arranged in an X-axis direction of FIG. 6 is described in more detail.

The first mask sheet 123-2 may include a plurality of first openings 123-4. In this case, the first openings 123-4 may be arranged to be spaced apart from each other in the first direction and the second direction. In particular, each first opening 123-4 may have a diamond shape of which vertices are arranged in a tensile direction of the first mask sheet 123-2. In particular, each first opening 123-4 may have a square shape in which an angle formed between two sides adjacent to each vertex is 90°. In this case, centers of some of the first openings 123-4 may be arranged in a row in one of the tensile direction of the first mask sheet 123-2 and a direction perpendicular or normal to the tensile direction of the first mask sheet 123-2. In one or more embodiments, centers of the others of the first openings 123-4 may be arranged in a serpentine form in one of the tensile direction of the first mask sheet 123-2 and the direction perpendicular or normal to the tensile direction of the first mask sheet 123-2. In this case, the first openings 123-4 may be arranged to correspond to the arrangement of the first subpixel described with reference to FIGS. 4A and 4B. When the plurality of first openings 123-4 are formed as described above, even though the first mask sheet 123-2 is tensioned, a tensile shape of the first mask sheet 123-2 may be predictable to a certain degree. In other words, in one or more embodiments, the arrangement and shape of the plurality of first openings 123-4 of the first mask sheet 123-2 cause the shape of the first mask sheet 123-2 under tension to be more predictable (i.e., maintains the shape within a predictable range).

The first support frame 123-3 may be arranged on the first mask frame 123-1 to support the first mask frame 123-1 as well as to support the first mask sheet 123-2. In this case, the first support frame 123-3 may be arranged in the first mask frame 123-1 in a grid form to define a display area of one display apparatus. That is, the first support frame 123-3 may define a plurality of display areas by dividing a central opening of the first mask frame 123-1 into a plurality of areas.

The first substrate support 124 may support the substrate 21. In this case, the first substrate support 124 may support the substrate 21 as the substrate 21 is seated thereon, or may support the substrate 21 by coupling or attaching one surface of the substrate 21. For example, the first substrate support 124 may include a frame, a bar, or the like fixed in the first chamber 121. In another embodiment, the first substrate support 124 may include a clamp that grips the substrate 21. In another embodiment, the first substrate support 124 may include an adhesive chuck or an electrostatic chuck. In this case, the first substrate support 124 may be integrally formed with the first magnetic force generator 126. In another embodiment, the first substrate support 124 may include a shuttle that transfers the substrate 21 from the loader 110. However, hereinafter, for convenience of description, one or more embodiments where the first substrate support 124 includes the shuttle is described in more detail.

The first mask support 125 may support the first mask assembly 123. In this case, because the first mask support 125 may be the same as or similar to the first substrate support 124 described above, a more detailed description thereof is omitted for convenience of description. Hereinafter, for convenience of description, one or more embodiments where the first mask support 125 includes a frame fixed in the first chamber 121, and the first mask assembly 123 is seated on and supported by the frame is described in more detail.

The first magnetic force generator 126 may be positioned in the first chamber 121 to closely attach the first mask frame 123-1 to the substrate 21. In this case, the first magnetic force generator 126 may include an electromagnet.

The first pressure controller 127 may be connected to the first chamber 121 to adjust an internal pressure of the first chamber 121. The first pressure controller 127 may include a pipe connected to the first chamber 121 and a pump arranged in the pipe.

The second deposition portion 130 may form the second intermediate layer by depositing a second deposition material on the substrate 21 on which the first intermediate layer is formed. The second deposition portion 130 may be similar to the first deposition portion 120 described above. In this case, the second deposition portion 130 may include a second mask sheet 133-2. The second mask sheet 133-2 may be similar to the first mask sheet 123-2. In this case, the second mask sheet 133-2 may include a plurality of second openings 133-4. The second openings 133-4 may be arranged to be spaced apart from each other. In this case, some of the second openings 133-4 may be tilted in one direction with respect to a tensile direction of the second mask sheet 133-2 (e.g., an X-axis direction of FIG. 7 or a lengthwise direction of the second mask sheet 133-2). In one or more embodiments, the others of the second openings 133-4 may be tilted in a direction different from the direction of the some of the second openings 133-4 with respect to the tensile direction of the second mask sheet 133-2. For example, the second openings 133-4 may be tilted at an angle other than 0° with respect to the tensile direction of the second mask sheet 133-2. In particular, the second openings 133-4 may be arranged such that an angle of 45° or about 45° is formed with respect to the tensile direction of the second mask sheet 133-2.

In one or more embodiments, a straight line may be formed in one direction by connecting or crossing centers of the second openings 133-4. For example, a straight line may be formed by connecting or crossing centers of some of the second openings 133-4, and a straight line may not be formed by connecting centers of the others of the second openings 133-4. For example, a straight line may be formed by connecting or crossing, among the second openings 133-4, centers of second openings 133-4 arranged in a row in one of the tensile direction of the second mask sheet 133-2 and a direction perpendicular or normal to the tensile direction of the second mask sheet 133-2. In contrast, among the second openings 133-4, centers of second openings 133-4 arranged in the other one of the tensile direction of the second mask sheet 133-2 and the direction perpendicular or normal to the tensile direction of the second mask sheet 133-2 may be arranged in a serpentine form (or a zigzag form). However, hereinafter, for convenience of description, one or more embodiments where a straight line is formed by the centers (e.g., by crossing the centers) of the some of the second openings 133-4, and a straight line is not formed (e.g., a serpentine or a zigzag is formed) by the centers of the others of the second openings 133-4 is described in more detail. In one or more embodiments, the second openings 133-4 may have a rectangular shape.

As described above, the second mask sheet 133-2 may be fixed to a second mask frame with tensile force applied thereto. In this case, when the second mask sheet 133-2 is deformed in a state where all of the second openings 133-4 are tilted in the same direction as the tensile direction of the second mask sheet 133-2, left and right sides or front and rear sides of the second mask sheet 133-2 may be deformed to different degrees, and thus, the deformation of the second mask sheet 133-2 may exceed a predictable range. In particular, in the case described above, one side of the second mask sheet 133-2 may be greatly deformed, and the other side of the second mask sheet 133-2 may not be deformed or may be insignificantly deformed, such that shapes of the second openings 133-4 may be distorted, or some of the second openings 133-4 and the others of the second openings 133-4 may have different shapes under tension. In one or more embodiments, in the case described above, centers of the some of the second openings 133-4 may not be arranged in a row.

However, as described above, the some of the second openings 133-4 and the others of the second openings 133-4 may be tilted in different directions with respect to the tensile direction of the second mask sheet 133-2, and then formed on the second mask sheet 133-2. Thus, when the second mask sheet 133-2 is tensioned, the degree of deformation may be uniformly maintained to a certain degree throughout the second mask sheet 133-2. In particular, uniform deformation may be induced throughout the second mask sheet 133-2 by tilting second openings 133-4 adjacent to each other in different directions with respect to the tensile direction of the second mask sheet 133-2. In one or more embodiments, each of the plurality of second openings 133-4 may be arranged to form an angle of 45 degrees or about 45 degrees with respect to the tensile direction of the second mask sheet 133-2 and be tilted in a different direction from another one of the plurality of second openings 133-4 with respect to the tensile direction of the second mask sheet 133-2.

A third deposition material may be deposited on the substrate 21, on which the first and second intermediate layers are formed, by the third deposition portion 140 to form the third intermediate layer on the substrate 21. In this case, the first intermediate layer, the second intermediate layer, and the third intermediate layer may be arranged not to overlap each other on a plane. The third deposition portion 140 may be similar to the first deposition portion 120. Here, the third deposition portion 140 may include a third mask sheet 143-2 including a plurality of third openings 143-4. In this case, the third mask sheet 143-2 may be similar to the second mask sheet 133-2, and the third openings 143-4 may be arranged similarly to the second openings 133-4. However, when the second mask sheet 133-2 and the third mask sheet 143-2 are stacked on each other, the second mask sheet 133-2 and the third mask sheet 143-2 may be manufactured such that the second openings 133-4 and the third openings 143-4 do not overlap (e.g., overlap when viewed from a plan view) each other.

The unloader 150 may store (e.g., temporarily store) the substrate 21 on which the first intermediate layer, the second intermediate layer, and the third intermediate layer are formed, and then may carry out (transfer) the substrate 21 to the outside (e.g., an external environment) or transfer the substrate 21 to another apparatus. In this case, the unloader 150 may include therein a robot arm that transfers the substrate 21.

The substrate 21 on which the first intermediate layer, the second intermediate layer, and the third intermediate layer are formed as described above may be manufactured as the display panel by forming the opposite electrode on the first intermediate layer, the second intermediate layer, and the third intermediate layer, and forming the encapsulation portion.

An operation of the apparatus 100 for manufacturing a display apparatus is described. The apparatus 100 for manufacturing a display apparatus may manufacture the first subpixel, the second subpixel, and the third subpixel in various suitable orders, as described above. However, hereinafter, for convenience of description, one or more embodiments where the apparatus 100 for manufacturing a display apparatus sequentially manufactures the first subpixel, the second subpixel, and the third subpixel shown in FIGS. 4A and 4B is described in more detail.

After the substrate 21 is transferred to the loader 110, the loader 110 may transfer the substrate 21 to the first deposition portion 120.

The first deposition portion 120 supplies the first deposition material to the first deposition source 122 to form the first intermediate layer on the substrate 21. Here, the first deposition material may be deposited on the substrate 21 by passing through the first opening 123-4. In this case, the first intermediate layer may have a square shape tilted with respect to the tensile direction of the first mask sheet 123-2.

When the above process is completed, the substrate 21 is transferred from the first deposition portion 120 to the second deposition portion 130, and then the second deposition material may be deposited on the substrate 21 by the second deposition portion 130. In this case, the second deposition portion 130 may form, on the substrate 21, a plurality of pairs of second intermediate layers that are tilted in different directions with respect to the tensile direction of the second mask sheet 133-2 and are adjacent to each other.

Thereafter, the substrate 21 may be transferred from the second deposition portion 130 to the third deposition portion 140. The third deposition portion 140 may supply the third deposition material onto the substrate 21, and the third deposition material that passed through the third opening 143-4 may be deposited on the substrate 21. In this case, the third deposition portion 140 may form, on the substrate 21, a plurality of pairs of third intermediate layers that are tilted in different directions with respect to a tensile direction of the third mask sheet 143-2 and are adjacent to each other.

The substrate 21 on which the first intermediate layer, the second intermediate layer, and the third intermediate layer are formed may be carried out to the outside (e.g., an external environment) by the unloader 150 or supplied to an apparatus (or equipment) for a next operation. Thereafter, the opposite electrode and the thin-film encapsulation layer are formed on the substrate 21 such that the manufacturing of the display panel is completed.

Thereafter, an optical functional member is arranged on the display panel, and a blocking portion is arranged on the optical functional member such that the manufacturing of the display apparatus may be completed.

Thus, the apparatus 100 for manufacturing a display apparatus and a method of manufacturing a display apparatus may manufacture the display apparatus having a precise deposition pattern.

In one or more embodiments, the apparatus 100 for manufacturing a display apparatus and the method of manufacturing a display apparatus may reduce an error between a design pattern and an actual deposition pattern that may occur during a manufacturing process.

Figure 11A:
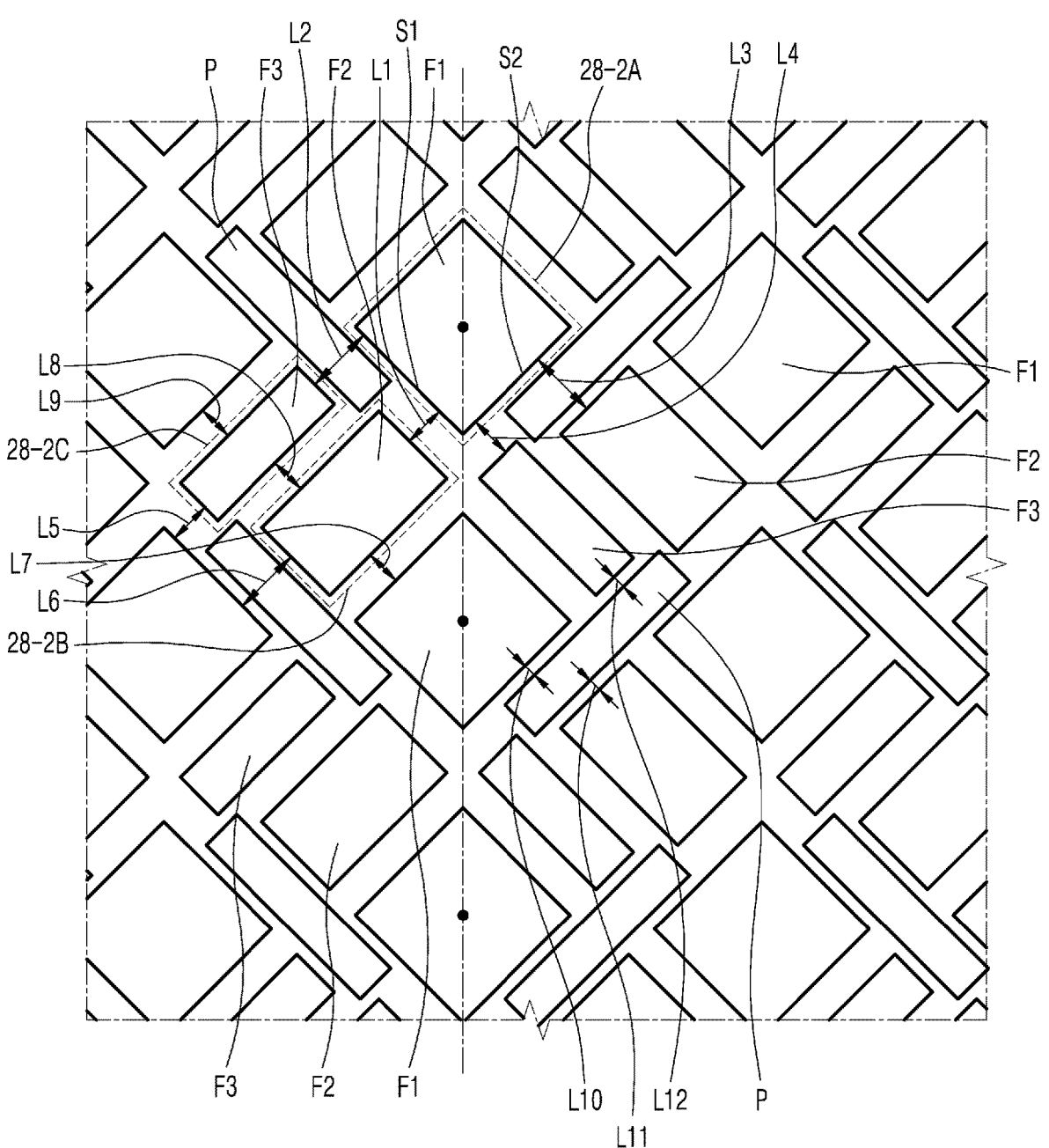
FIG. 11A is a plan view illustrating a first subpixel, a second subpixel, and a third subpixel of a display apparatus according to one or more embodiments.
Figure 11B:
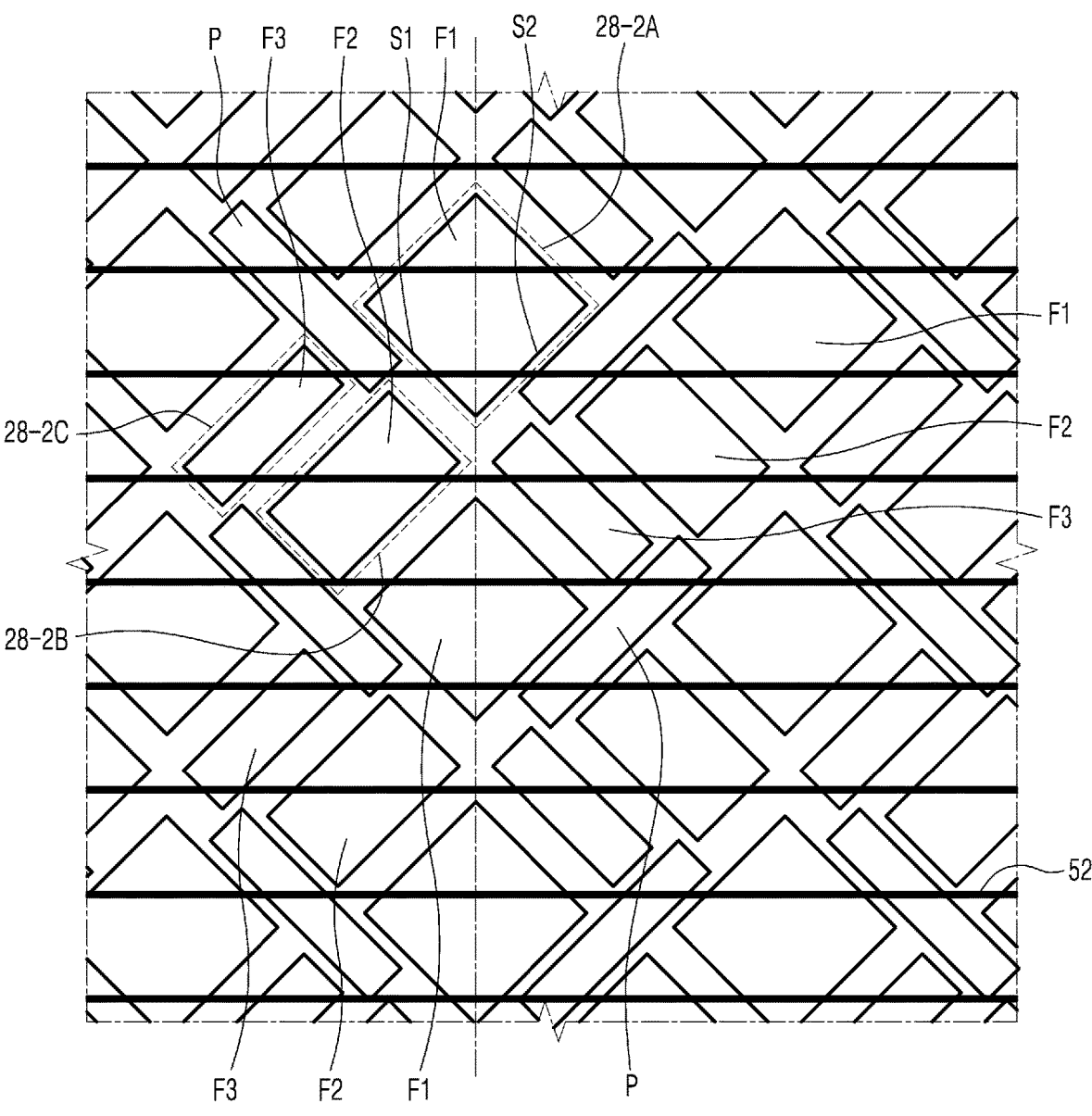
FIG. 11B is a plan view illustrating an arrangement of first, second, and third subpixels shown in FIG. 11A and a blocking layer.
Figure 12:
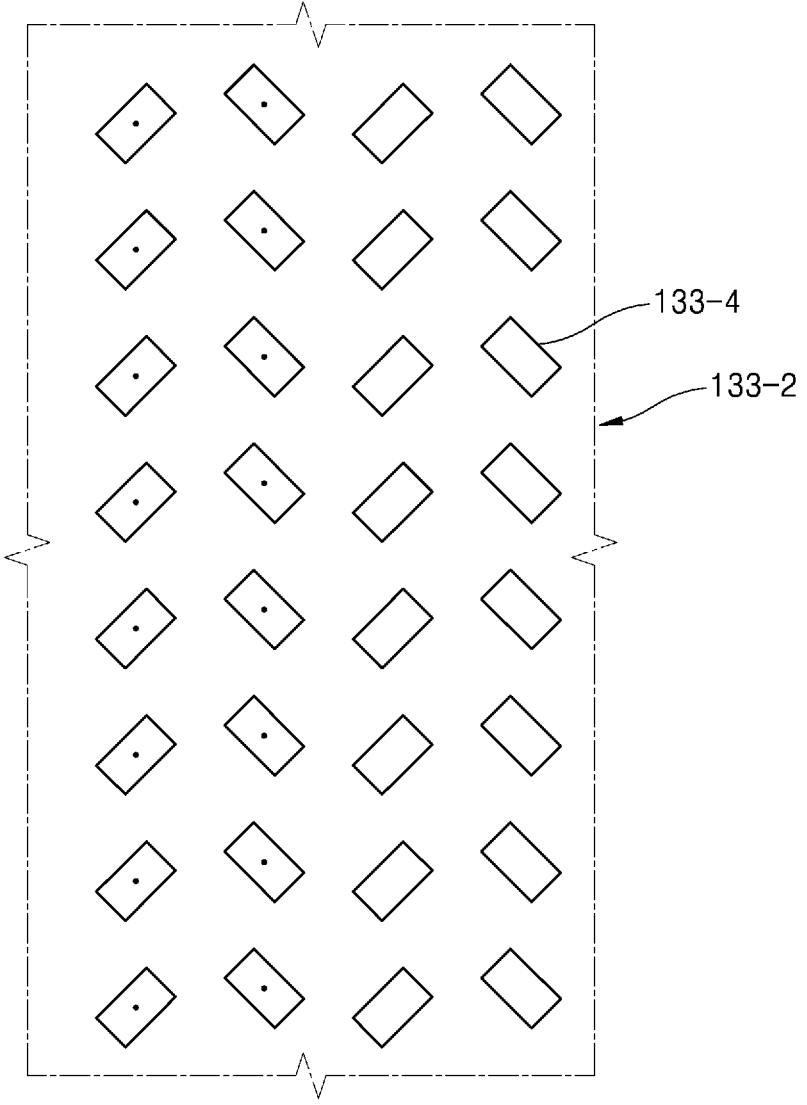
FIG. 12 is a plan view illustrating a portion of a second mask sheet for depositing a second intermediate layer shown in FIGS. 11A and 11B.
Figure 12:
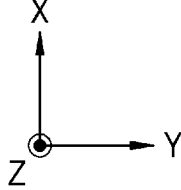
Figure 13:
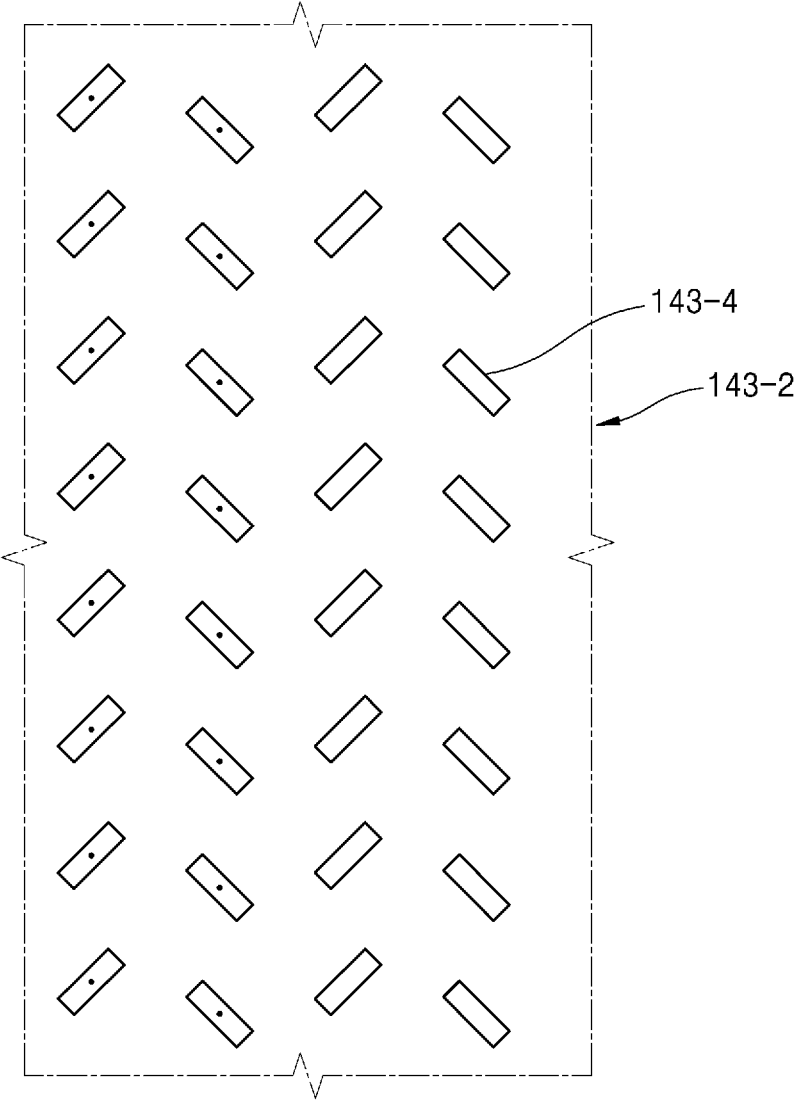
FIG. 13 is a plan view illustrating a portion of a third mask sheet for depositing a third intermediate layer shown in FIGS. 11A and 11B.
Figure 13:
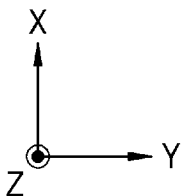

FIG. 11A is a plan view illustrating a first subpixel F1, a second subpixel F2, and a third subpixel F3 of a display apparatus according to one or more embodiments. FIG. 11B is a plan view illustrating an arrangement of the first, second, and third subpixels F1, F2, and F3 shown in FIG. 11A and a blocking layer 52. FIG. 12 is a plan view illustrating a portion of a second mask sheet 133-2 for depositing a second intermediate layer 28-2B shown in FIGS. 11A and 11B. FIG. 13 is a plan view illustrating a portion of a third mask sheet 143-2 for depositing a third intermediate layer 28-2C shown in FIGS. 11A and 11B.

Referring to FIGS. 11A-13, the display apparatus may be the same as that shown in FIGS. 2A and 2B. In a display panel, a display area and a non-display area outside or around the display area may be defined over a substrate. In one or more embodiments, the non-display area surrounds the display area. The subpixels including the first subpixel F1, the second subpixel F2, and the third subpixel F3 may be arranged in the display area, and a power line may be arranged in the non-display area. In one or more embodiments, a pad portion may be arranged in the non-display area.

The first subpixel F1, the second subpixel F2, and the third subpixel F3 may emit light beams of different colors. For example, one of the first subpixel F1, the second subpixel F2, and the third subpixel F3 emits blue light, another one of the first subpixel F1, the second subpixel F2, and the third subpixel F3 emits red light, and the other one of the first subpixel F1, the second subpixel F2, and the third subpixel F3 emits green light.

One of the first subpixel F1, the second subpixel F2, or the third subpixel F3 may have a square shape, and the other two of the first subpixel F1, the second subpixel F2, and the third subpixel F3 may have a rectangular shape.

Hereinafter, for convenience of description, one or more embodiments where the first subpixel F1 has a square shape and emits red light, the second subpixel F2 has a rectangular shape and emits green light, and the third subpixel F3 has a rectangular shape and emits blue light is described in more detail.

The first subpixel F1 may include a first intermediate layer 28-2A, and the first intermediate layer 28-2A may correspond to a shape and a position of the first subpixel F1. In this case, a planar area of the first intermediate layer 28-2A may be greater than or equal to a planar area of the first subpixel F1, and a region of the first subpixel F1 may be arranged in a region of the first intermediate layer 28-2A.

The second subpixel F2 may include a second intermediate layer 28-2B. In one or more embodiments, the second intermediate layer 28-2B may correspond to a shape and a position of the second subpixel F2. In this case, a region of the second subpixel F2 may be arranged in a region of the second intermediate layer 28-2B.

The third subpixel F3 may include a third intermediate layer 28-2C. In one or more embodiments, the third intermediate layer 28-2C may correspond to a shape and a position of the third subpixel F3. In this case, a region of the third subpixel F3 may be arranged in a region of the third intermediate layer 28-2C.

Each of the second subpixel F2 and the third subpixel F3 may have various suitable planar areas.

In one or more embodiments, planar areas of some of the plurality of second subpixels F2 may be different from planar areas of the others of the plurality of second subpixels F2, and planar area of some of the plurality of third subpixels F3 may be different from planar areas of the others of the plurality of third subpixels F3.

In another embodiment, the second subpixels F2 may have the same planar area, and the third subpixels F3 may have the same planar area. In this case, the planar area of the second subpixel F2 may be different from the planar area of the third subpixel F3. For example, one of the planar area of the second subpixel F2 and the planar area of the third subpixel F3 may be less than the other of the planar area of the second subpixel F2 or the planar area of the third subpixel F3. In one or more embodiments, the planar area of the second subpixel F2 may be less than the planar area of the third subpixel F3. In another embodiment, the planar area of the third subpixel F3 may be less than the planar area of the second subpixel F2. Therefore, an aperture ratio of light emitted from each subpixel may be adjustable.

In the case described above, a long side of the second subpixel F2 and a long side of the third subpixel F3 may have the same size. However, a short side of the second subpixel F2 and a short side of the third subpixel F3 may be different from each other.

As described above, adjusting an area of at least one of the first subpixel F1, the second subpixel F2, or the third subpixel F3 may be achieved by adjusting an area of a pixel-defining layer that exposes a pixel electrode. In this case, the first intermediate layer 28-2A, the second intermediate layer 28-2B, and the third intermediate layer 28-2C formed by being respectively deposited on the first subpixel F1, the second subpixel F2, and the third subpixel F3 may have an area and a shape corresponding to those of each subpixel to prevent or substantially prevent the subpixel from overlapping each other.

The second mask sheet 133-2 and the third mask sheet 143-2 may be used to form the second intermediate layer 28-2B and the third intermediate layer 28-2C. In this case, the second mask sheet 133-2 may include a plurality of second openings 133-4, and the third mask sheet 143-2 may include a plurality of third openings 143-4. In this case, an area of each second opening 133-4 may be different from an area of each third opening 143-4. In particular, the area of each second opening 133-4 and the area of each third opening 143-4 may correspond to an area of the second intermediate layer 28-2B and an area of the third intermediate layer 28-2C, respectively. The relationship among each subpixel, each intermediate layer, and each opening as described above may be applicable to all embodiments of the present disclosure.

Two adjacent second openings 133-4 among the second openings 133-4 may be tilted in directions opposite to each other with respect to the tensile direction of the second mask sheet 133-2. In one or more embodiments, two adjacent third openings 143-4 of the third openings 143-4 may be tilted in directions opposite to each other with respect to the tensile direction of the third mask sheet 143-2.

In the case described above, even when the second mask sheet 133-2 and the third mask sheet 143-2 are tensioned, shapes of the second opening 133-4 and the third opening 143-4 may be maintained almost similarly to their initial states. In one or more embodiments, when positions of the second opening 133-4 and the third opening 143-4 are changed from their initial positions, the positions are moved within a range that may be expectable to a certain degree, and thus, when a second deposition material and a third deposition material are deposited on a display substrate later, patterns may be corrected to a certain degree.

In the case described above, a spacer P may be arranged between some of the subpixels. In this case, the spacer P is the same as or similar to that described with reference to FIGS. 4A and 4B, and thus, a more detailed description thereof will be omitted. In one or more embodiments, an arrangement of each subpixel, a distance from an edge of a subpixel to an edge of another subpixel, and a distance from an edge of the spacer P to an edge of each subpixel are the same as those described with reference to FIGS. 4A and 4B, and, thus a more detailed description thereof will be omitted.

The display apparatus may be fixed to an apparatus that transports a user such as a vehicle or the like. In this case, the display apparatus may be fixed to the apparatus such that a predetermined or set angle that is not 0° is formed between a user's gaze direction and the first direction or the second direction. For example, the display apparatus may be arranged such that an angle of 90° is formed between the user's gaze direction looking at the display apparatus and the first direction or the second direction.

In the case described above, when the user looks at the display apparatus, an inclined portion of the pixel-defining layer and the gaze direction are not perpendicular to each other, and thus, external light may be reflected through the inclined portion of the pixel-defining layer and prevented or substantially prevented from being incident to the user's eyes. In other words, the inclined portion may prevent or substantially prevent external light being reflected into the user's eyes.

In one or more embodiments, the display apparatus may implement a precise image through each subpixel.

The display apparatus may include a blocking portion including the blocking layer 52. In this case, the blocking layer 52 may be provided as a plurality of blocking layers 52 and may be arranged to be spaced apart from each other. Each blocking layer 52 may be arranged on the first subpixel F1, the second subpixel F2, and the third subpixel F3, as described with reference to FIGS. 4A and 4B.

Therefore, the display apparatus may prevent or substantially prevent a Moire phenomenon from occurring in the display apparatus due to external light or operation of the display apparatus. In one or more embodiments, the display apparatus may be provided with the blocking layer 52 to prevent or substantially prevent an image, a character, etc. from being formed or reflected in a window of a vehicle.

The display apparatus may be manufactured by an apparatus for manufacturing a display apparatus. In this case, the apparatus for manufacturing a display apparatus may be formed similarly to that shown in FIGS. 5 and 6. In this case, a first deposition portion may form the first intermediate layer 28-2A by using the first mask assembly 123 shown in FIG. 7, and a second deposition portion and a third deposition portion (not shown) may form, on the display substrate, the second intermediate layer 28-2B and the third intermediate layer 28-2C by using deposition materials that respectively passed through the second opening 133-4 and the third opening 143-4 by using the second mask sheet 133-2 and the third mask sheet 143-2 shown in FIGS. 12 and 13.

The apparatus for manufacturing a display apparatus and a method of manufacturing a display apparatus may manufacture the display apparatus having a precise deposition pattern by minimizing deformation of each mask sheet.

In one or more embodiments, the apparatus for manufacturing a display apparatus and the method of manufacturing a display apparatus may reduce an error between a design pattern and an actual deposition pattern that may occur during a manufacturing process.

Figure 14A:
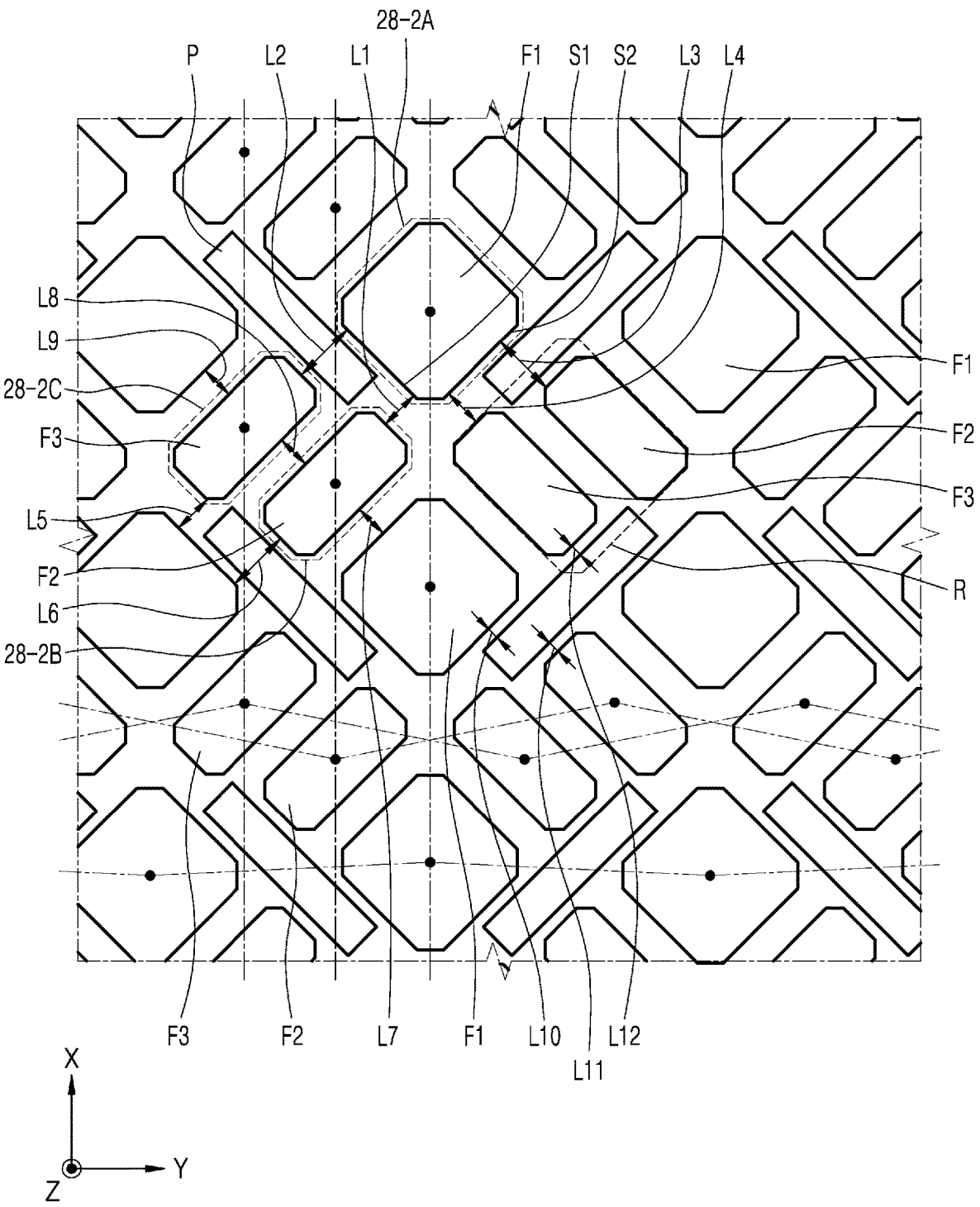
FIG. 14A is a plan view illustrating a first subpixel, a second subpixel, and a third subpixel of a display apparatus according to one or more embodiments.
Figure 14B:
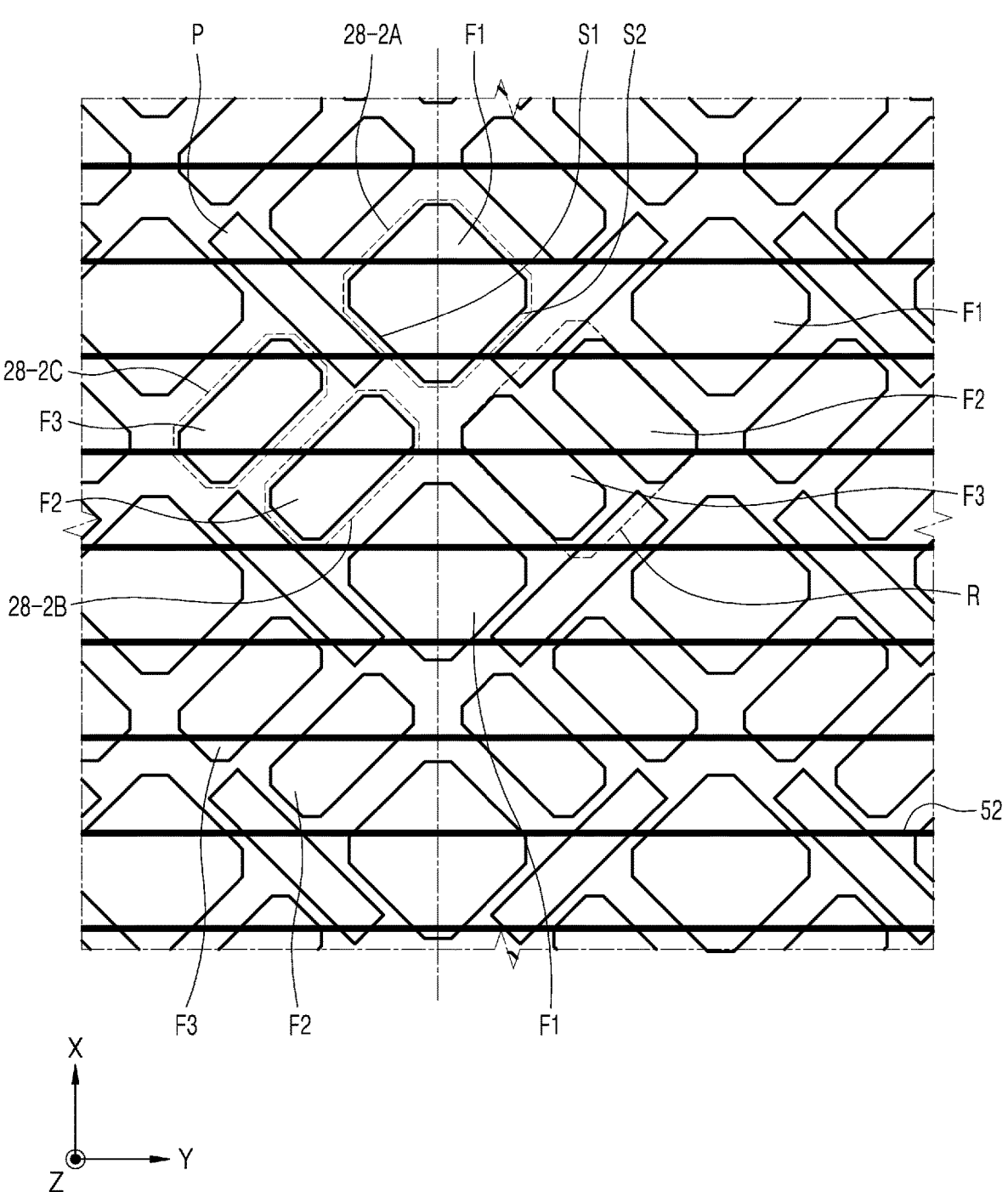
FIG. 14B is a plan view illustrating an arrangement of first, second, and third subpixels shown in FIG. 14A and a blocking layer.
Figure 15:
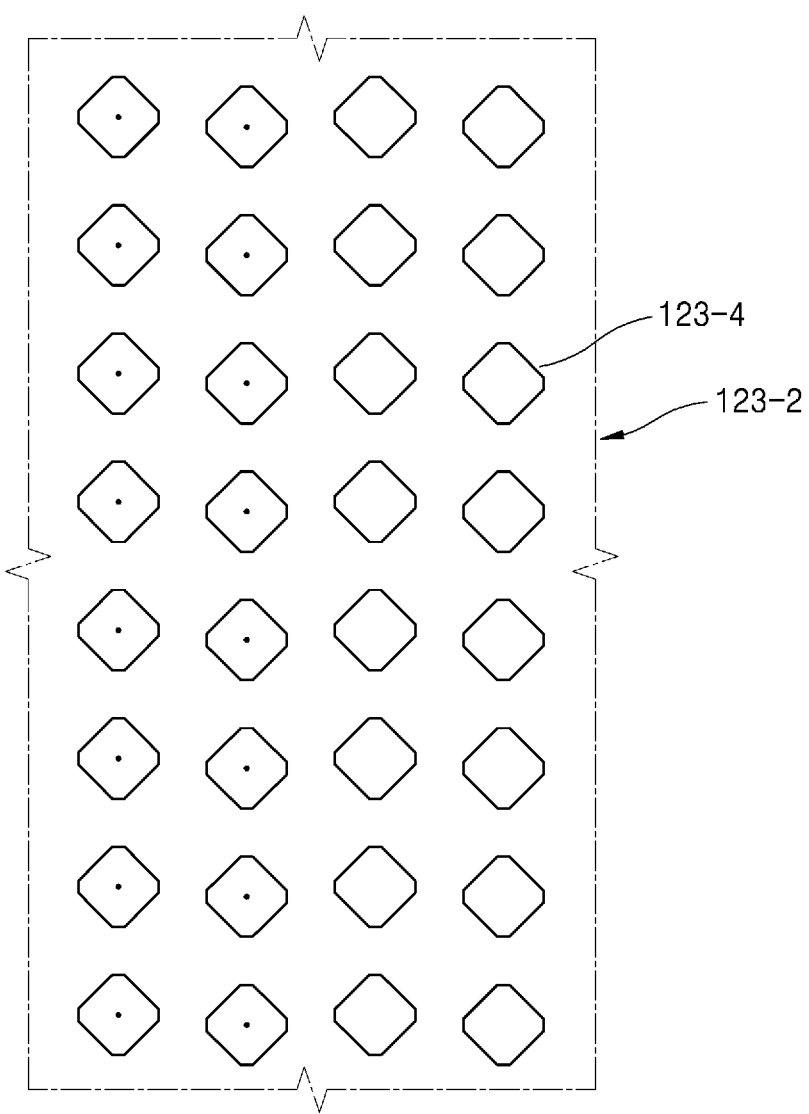
FIG. 15 is a plan view illustrating a portion of a first mask sheet for depositing a first intermediate layer shown in FIGS. 14A and 14B.
Figure 15:
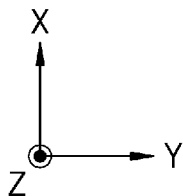
Figure 16:
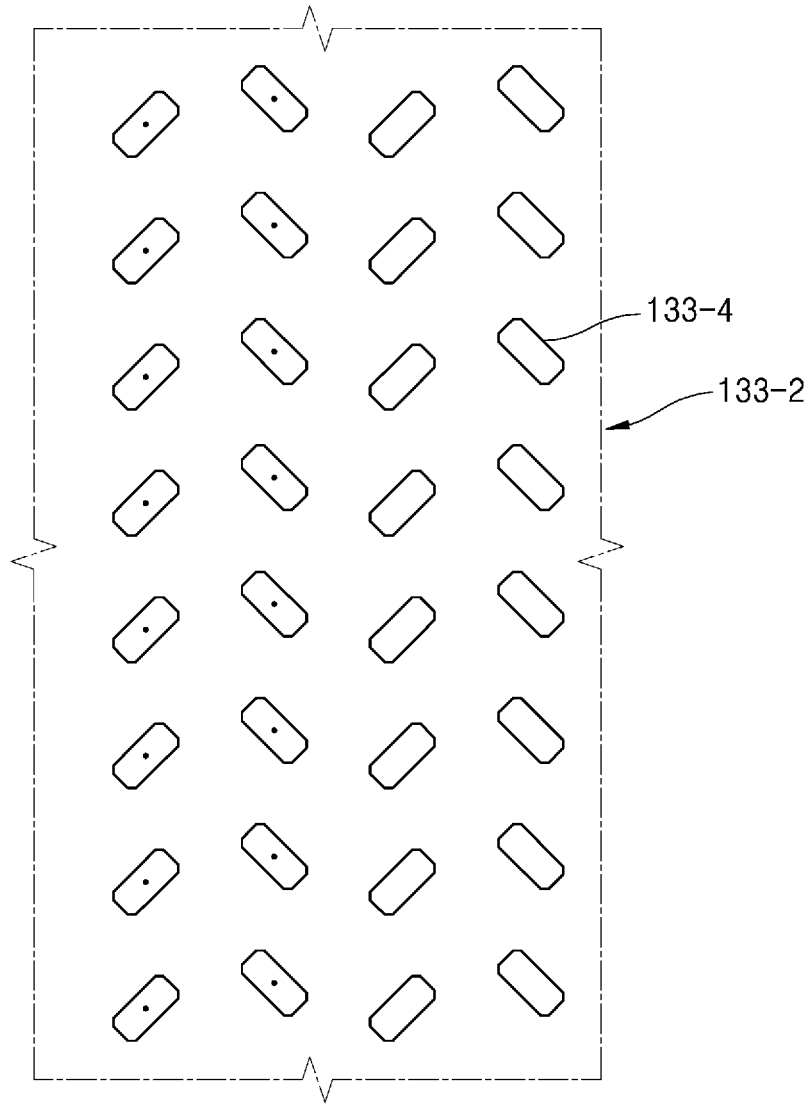
FIG. 16 is a plan view illustrating a portion of a second mask sheet for depositing a second intermediate layer shown in FIGS. 14A and 14B.
Figure 16:
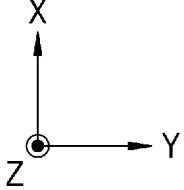
Figure 17:
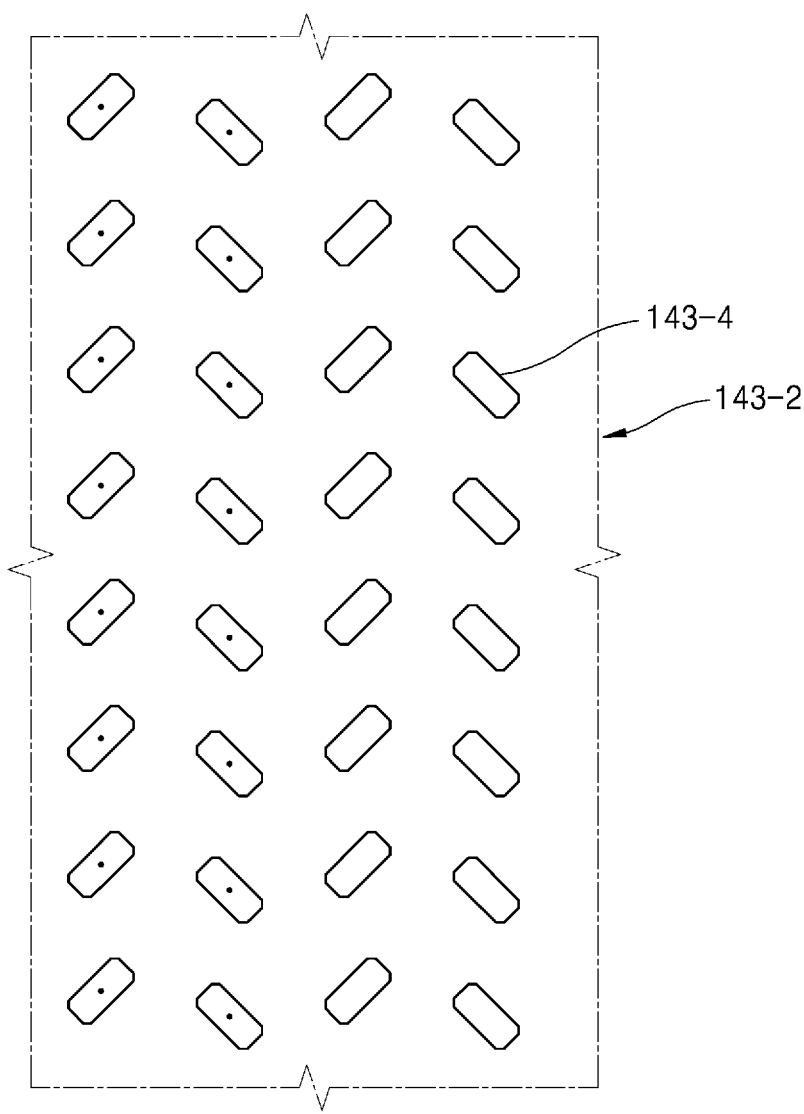
FIG. 17 is a plan view illustrating a portion of a third mask sheet for depositing a third intermediate layer shown in FIGS. 14A and 14B.
Figure 17:
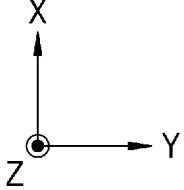

FIG. 14A is a plan view illustrating a first subpixel F1, a second subpixel F2, and a third subpixel F3 of a display apparatus according to one or more embodiments. FIG. 14B is a plan view illustrating an arrangement of first, second, and third subpixels F1, F2, and F3 shown in FIG. 14A and a blocking layer 52. FIG. 15 is a plan view illustrating a portion of a first mask sheet 123-2 for depositing a first intermediate layer 28-2A shown in FIGS. 14A and 14B. FIG. 16 is a plan view illustrating a portion of a second mask sheet 133-2 for depositing a second intermediate layer 28-2B shown in FIGS. 14A and 14B. FIG. 17 is a plan view illustrating a portion of a third mask sheet 143-2 for depositing a third intermediate layer 28-2C shown in FIGS. 14A and 14B.

Referring to FIGS. 14A to 17, the display apparatus may be the same as that shown in FIGS. 2A and 2B. In a display panel, a display area and a non-display area outside or around the display area may be defined over a substrate. In one or more embodiments, the non-display area surrounds the display area. The subpixels including the first subpixel F1, the second subpixel F2, and the third subpixel F3 may be arranged in the display area, and a power line may be arranged in the non-display area. In one or more embodiments, a pad portion may be arranged in the non-display area. The display apparatus is the same as or similar to that described above, and thus, a more detailed description thereof will be omitted.

The first subpixel F1, the second subpixel F2, and the third subpixel F3 may emit light beams of different colors. For example, one of the first subpixel F1, the second subpixel F2, and the third subpixel F3 emits blue light, another one of the first subpixel F1, the second subpixel F2, and the third subpixel F3 emits red light, and the other one of the first subpixel F1, the second subpixel F2, and the third subpixel F3 emits green light.

One of the first subpixel F1, the second subpixel F2, or the third subpixel F3 may have a square shape, and the other two of the first subpixel F1, the second subpixel F2, and the third subpixel F3 may have a rectangular shape.

Hereinafter, for convenience of description, one or more embodiments where the first subpixel F1 has a square shape and emits red light, the second subpixel F2 has a rectangular shape and emits green light, and the third subpixel F3 has a rectangular shape and emits blue light is described in more detail. In this case, the first subpixel F1, the second subpixel F2, and the third subpixel F3 may be similar to those described with reference to FIGS. 1A through 4B. However, an edge of each subpixel may be chamfered. That is, an edge portion of each subpixel may be round or inclined.

The first subpixel F1 may include a first intermediate layer 28-2A, and the first intermediate layer 28-2A may correspond to a shape and a position of the first subpixel F1. In this case, a planar area of the first intermediate layer 28-2A may be greater than or equal to a planar area of the first subpixel F1, and a region of the first subpixel F1 may be arranged in a region of the first intermediate layer 28-2A.

The second subpixel F2 may include a second intermediate layer 28-2B. In one or more embodiments, the second intermediate layer 28-2B may correspond to a shape and a position of the second subpixel F2. A region of the second subpixel F2 may be arranged in a region of the second intermediate layer 28-2B.

The third subpixel F3 may include a third intermediate layer 28-2C. In one or more embodiments, the third intermediate layer 28-2C may correspond to a shape and a position of the third subpixel F3. In this case, a region of the third subpixel F3 may be arranged in a region of the third intermediate layer 28-2C.

A spacer P may be arranged between the subpixels. Here, the spacer P is the same as or similar to that described with reference to FIGS. 1A to 4B, and thus, a more detailed description thereof will be omitted.

In order to manufacture the first subpixel F1, the second subpixel F2, and the third subpixel F3, the substrate may be supplied to the apparatus for manufacturing a display apparatus described with reference to FIGS. 5 and 6.

In this case, a first deposition portion may supply a first deposition material to the substrate to form the first intermediate layer 28-2A, a second deposition portion may supply a second deposition material to the substrate to form the second intermediate layer 28-2B, and the third deposition portion may supply a third deposition material to the substrate to form the third intermediate layer 28-2C.

The first mask sheet 123-2 used by the first deposition portion may include a first opening 123-4 formed to correspond to a shape of the first subpixel F1. A planar area of a first opening 123-4 may be greater than or equal to a planar area of a first subpixel F1 corresponding to the first opening 123-4. In one or more embodiments, the planar area of the first opening 123-4 may be less than or equal to a planar area of a first intermediate layer 28-2A formed by having a first deposition material that passed through the first opening 123-4 deposited on the display substrate. Here, the first opening 123-4, the first intermediate layer 28-2A, and the first subpixel F1 that correspond to each other may all have the same shape as a square.

A second opening 133-4 of a second mask sheet 133-2 used by the second deposition portion may also be formed to correspond to a shape of the second subpixel F2. Here, the second opening 133-4 may be arranged in the same manner as the second subpixel F2 is arranged. In this case, a planar area of the second opening 133-4 may be greater than or equal to a planar area of the second subpixel F2, and may be less than or equal to a planar area of a second intermediate layer 28-2B formed by having the second deposition material deposited on the substrate.

A third opening 143-4 of a third mask sheet 143-2 used by the third deposition portion may also be formed to correspond to a shape of the third subpixel F3, and a planar area of the third opening 143-4 may be greater than or equal to a planar area of the third subpixel F3. In one or more embodiments, a planar area of the third opening 143-4 may be less than or equal to a planar area of the third intermediate layer 28-2C.

In this case, the relationship among the first subpixel F1, the second subpixel F2, and the third subpixel F3 may be similar to that described with reference to FIGS. 4A and 4B. In one or more embodiments, the relationship among the first intermediate layer 28-2A, the second intermediate layer 28-2B, and the third intermediate layer 28-2C may be the same as the relationship among the first subpixel F1, the second subpixel F2, and the third subpixel F3.

For example, centers of some of the second subpixels F2 may be arranged in a straight line in one direction, and centers of the others of the second subpixels F2 may be arranged in a serpentine form in another direction. In one or more embodiments, centers of some of the third subpixels F3 may be arranged in one direction in a straight line, and centers of the others of the third subpixels F3 may be arranged in a serpentine form in another direction. Centers of the first subpixels F1 may be arranged in a straight line in a direction different from one direction.

In one or more embodiments, one side of each of the second subpixel F2 and the third subpixel F3 may be tilted in directions opposite to each other with respect to the tensile direction of the second mask sheet 133-2 and a tensile of the third mask sheet 143-2, the second subpixel F2 and the third subpixel F3 facing the same first subpixel F1. In particular, in this case, the second subpixels F2 adjacent to each other may form an angle of 45° or about 45° with respect to the tensile direction of the second mask sheet 133-2 in directions opposite to each other. In this case, one side of each of the second openings 133-4 may also form an angle of 45° or about 45° with respect to the tensile direction of the second mask sheet 133-2, the second openings 133-4 being formed in the second mask sheet 133-2 and adjacent to each other. In one or more embodiments, an angle of 45° or about 45° may be formed between one side of each of the third subpixels F3 adjacent to each other and the tensile direction of the third mask sheet 143-2 in directions opposite to each other. Further, one side of each of the third openings 143-4 may also form an angle of 45° or about 45° with respect to the tensile direction of the third mask sheet 143-2, the third openings 143-4 being formed in the third mask sheet 143-2 and adjacent to each other. In the case described above, the second intermediate layer 28-2B and the third intermediate layer 28-2C may be arranged on the substrate at positions corresponding to the second opening 133-4 and the third opening 143-4, respectively. Here, a direction from one side of the first opening 123-4 to one side of the third opening 143-4 is not limited thereto, and may vary according to positions of the first through third subpixels F1 through F3. That is, each of the one side of the first opening 123-4 to the one side of the third opening 143-4 may be tilted to have an angle of 85° or less with respect to the tensile direction of the first mask sheet 123-2 to the tensile direction of the third mask sheet 143-2.

The display apparatus may include a blocking portion including the blocking layer 52. In this case, the blocking layer 52 may be provided as a plurality of blocking layers 52 and may be arranged to be spaced apart from each other. Each blocking layer 52 may be arranged on the first subpixel F1, the second subpixel F2, and the third subpixel F3, as described with reference to FIGS. 4A and 4B.

Therefore, the display apparatus may prevent or substantially prevent a Moire phenomenon from occurring due to external light or an operation of the display apparatus. In one or more embodiments, during operation, the display apparatus may prevent or substantially prevent an image, a character, etc. displayed on the display apparatus from being formed or reflected in a window of a vehicle.

The display apparatus may be fixed to an apparatus that transports a user such as a vehicle or the like. In this case, the display apparatus may be fixed to the apparatus such that a predetermined or set angle that is not 0° is formed between a user's gaze direction and the first direction or the second direction. For example, the display apparatus may be arranged such that an angle of 90° is formed between the user's gaze direction looking at the display apparatus and the first direction or the second direction.

In the case described above, when the user looks at the display apparatus, an inclined portion of the pixel-defining layer and the gaze direction are not perpendicular to each other, and thus, external light may be reflected through the inclined portion of the pixel-defining layer and prevented or substantially prevented from being incident to the user's eyes. In other words, the inclined portion may prevent or substantially prevent external light being reflected into the user's eyes.

In one or more embodiments, the display apparatus may implement a precise image through each subpixel.

The display apparatus may prevent or substantially prevent a Moire pattern from being formed on surfaces thereof, which may occur during operation of the display apparatus or due to external light.

The apparatus for manufacturing a display apparatus and a method of manufacturing a display apparatus may manufacture the display apparatus having a precise deposition pattern.

In one or more embodiments, the apparatus for manufacturing a display apparatus and the method of manufacturing a display apparatus may reduce an error between a design pattern and an actual deposition pattern that may occur during a manufacturing process.

Figure 18A:
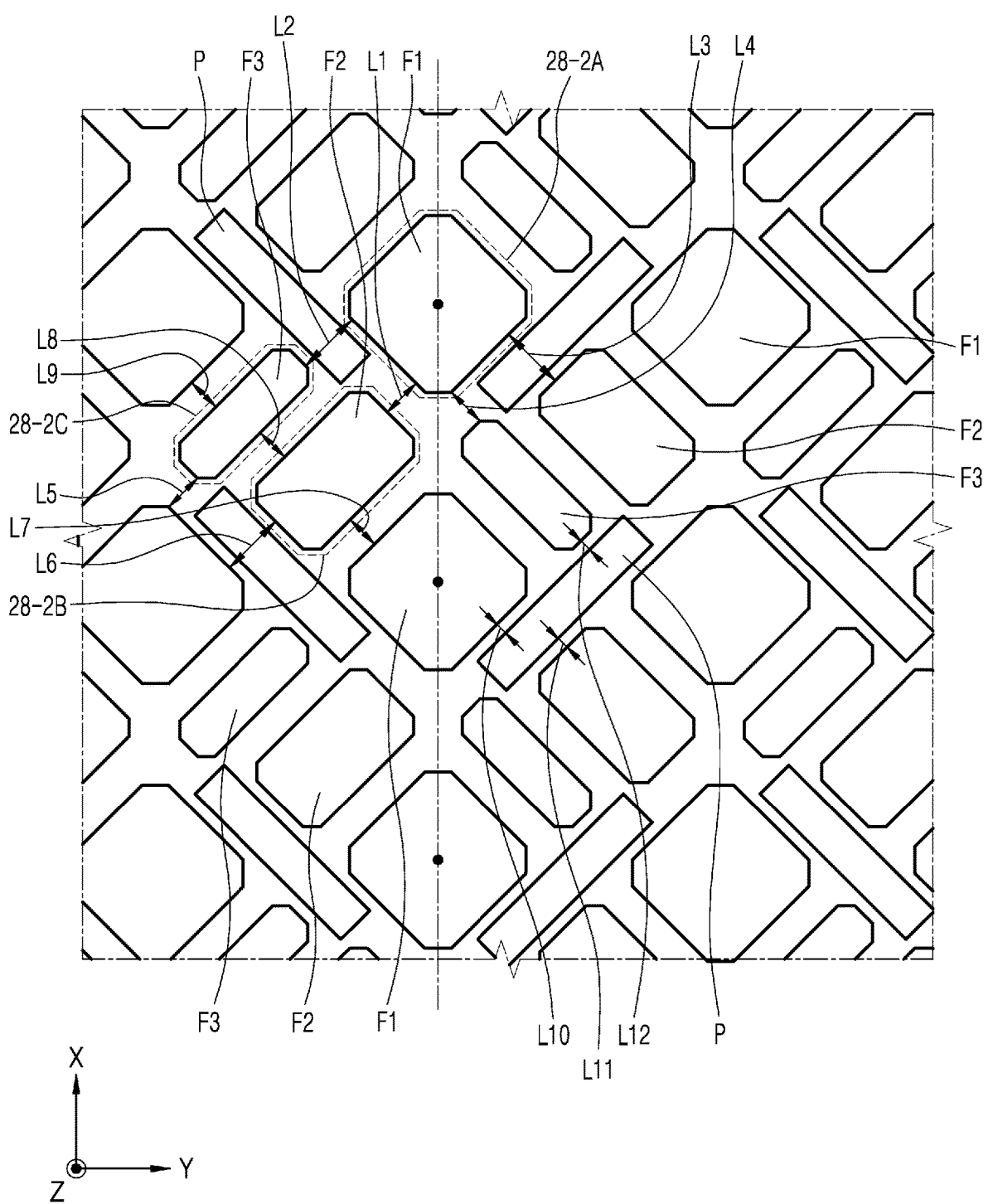
FIG. 18A is a plan view illustrating a first subpixel, a second subpixel, and a third subpixel of a display apparatus according to one or more embodiments.
Figure 18B:
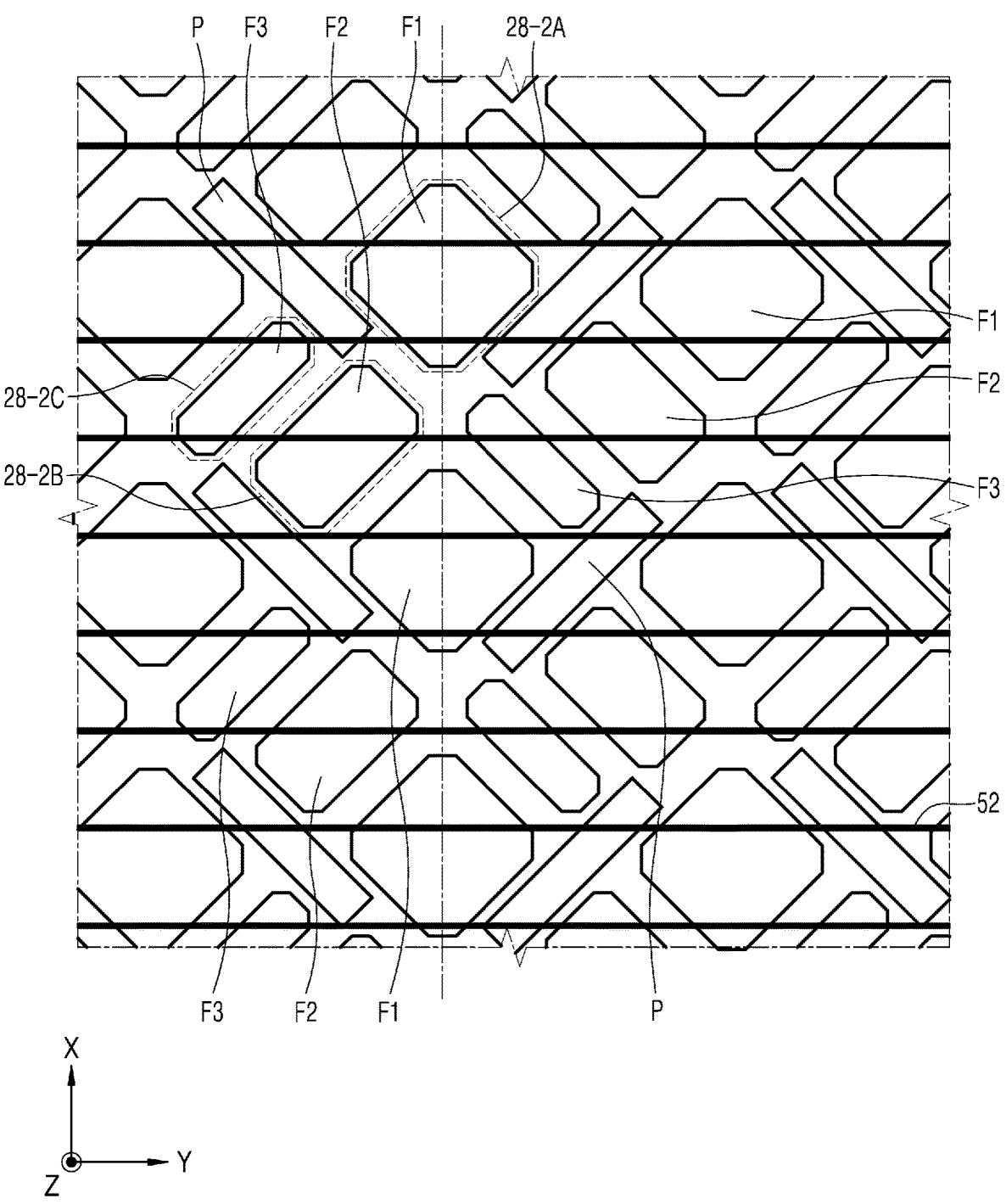
FIG. 18B is a plan view illustrating an arrangement of first, second, and third subpixels shown in FIG. 18A and a blocking layer.
Figure 19:
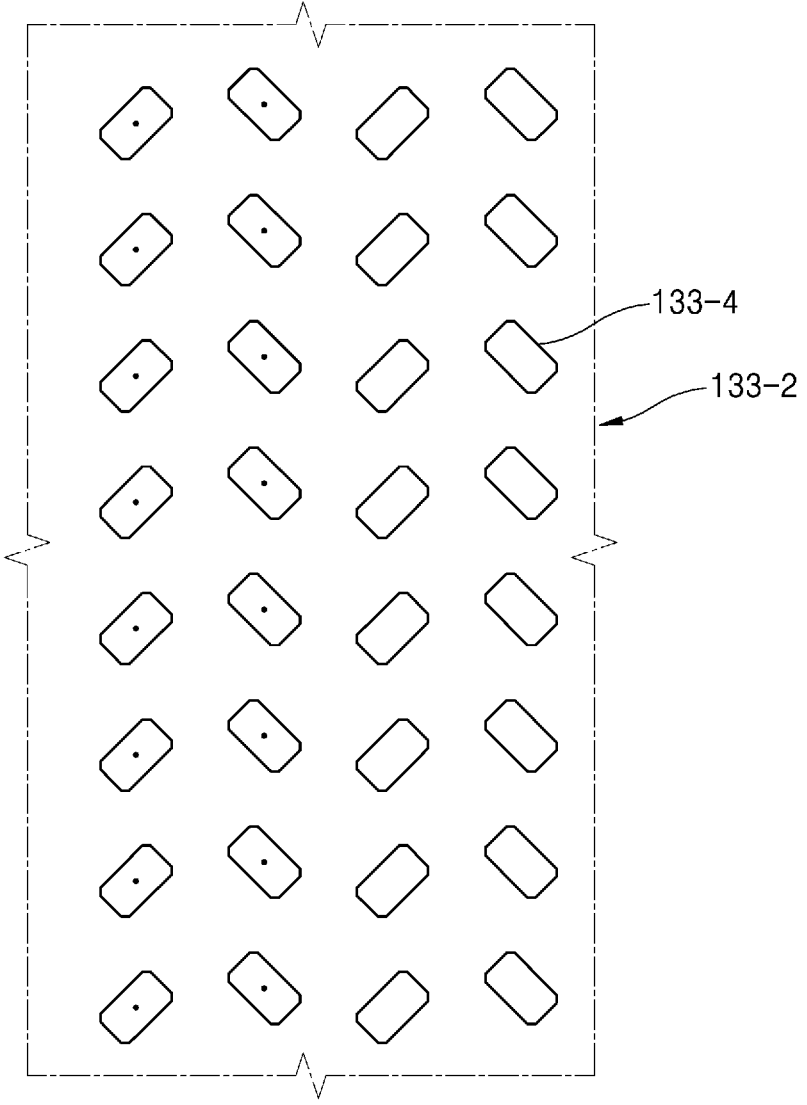
FIG. 19 is a plan view illustrating a portion of a second mask sheet for depositing a second intermediate layer shown in FIGS. 18A and 18B.
Figure 19:
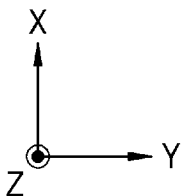

FIG. 18A is a plan view illustrating a first subpixel F1, a second subpixel F2, and a third subpixel F3 of a display apparatus according to one or more embodiments. FIG. 18B is a plan view illustrating an arrangement of first, second, and third subpixels F1, F2, and F3 shown in FIG. 18A and a blocking layer 52. FIG. 19 is a plan view illustrating a portion of a second mask sheet 133-2 for depositing a second intermediate layer 28-2B shown in FIGS. 18A and 18B. FIG.

20 is a plan view illustrating a portion of a third mask sheet 143-2 for depositing a third intermediate layer 28-2C shown in FIGS. 18A and 18B.

Referring to FIGS. 18A to 20, the display apparatus may be the same as that shown in FIGS. 2A and 2B. In a display panel, a display area and a non-display area outside or around the display area may be defined over a substrate. In one or more embodiments, the non-display area surrounds the display area. The subpixels including the first subpixel F1, the second subpixel F2, and the third subpixel F3 may be arranged in the display area, and a power line may be arranged in the non-display area. In one or more embodiments, a pad portion may be arranged in the non-display area.

The first subpixel F1, the second subpixel F2, and the third subpixel F3 may emit light beams of different colors. For example, one of the first subpixel F1, the second subpixel F2, and the third subpixel F3 emits blue light, another one of the first subpixel F1, the second subpixel F2, and the third subpixel F3 emits red light, and the other one of the first subpixel F1, the second subpixel F2, and the third subpixel F3 emits green light.

One of the first subpixel F1, the second subpixel F2, or the third subpixel F3 may have a square shape, and the other two of the first subpixel F1, the second subpixel F2, and the third subpixel F3 may have a rectangular shape.

Hereinafter, for convenience of description, one or more embodiments where the first subpixel F1 has a square shape and emits red light, the second subpixel F2 has a rectangular shape and emits green light, and the third subpixel F3 has a rectangular shape and emits blue light is described in more detail.

The first subpixel F1 may include a first intermediate layer 28-2A, and the first intermediate layer 28-2A may correspond to a shape and a position of the first subpixel F1. In this case, a planar area of the first intermediate layer 28-2A may be greater than a planar area of the first subpixel F1, and a region of the first subpixel F1 may be arranged in a region of the first intermediate layer 28-2A.

The second subpixel F2 may include a second intermediate layer 28-2B. In one or more embodiments, the second intermediate layer 28-2B may correspond to a shape and a position of the second subpixel F2. In this case, a region of the second subpixel F2 may be arranged in a region of the second intermediate layer 28-2B.

The third subpixel F3 may include a third intermediate layer 28-2C. In one or more embodiments, the third intermediate layer 28-2C may correspond to a shape and a position of the third subpixel F3. In this case, a region of the third subpixel F3 may be arranged in a region of the third intermediate layer 28-2C.

The first subpixel F1, the second subpixel F2, and the third subpixel F3 may be identically or similarly applied to the structures shown in FIGS. 11A and 11B, and the first subpixel F1, the second subpixel F2, and the third subpixel F3 may be arranged in the same or a similar manner as those described with reference to FIGS. 11A and 11B.

Here, at least one of the first subpixel F1, the second subpixel F2, or the third subpixel F3 may have a chamfered edge. For example, in one or more embodiments, vertexes of one of the first subpixel F1, the second subpixel F2, and the third subpixel F3 may be chamfered, and the vertexes of the other two of the first subpixel F1, the second subpixel F2, and the third subpixel F3 may not be chamfered. In another embodiment, the vertexes of two of the first subpixel F1, the second subpixel F2, and the third subpixel F3 may be chamfered, and the vertexes of the other one of the first subpixel F1, the second subpixel F2, and the third subpixel F3 may not be chamfered. In another embodiment, the vertexes of the first subpixel F1, the second subpixel F2, or the third subpixel F3 may be all chamfered. Hereinafter, for convenience of description, one or more embodiments where the vertexes of the first subpixel F1, the second subpixel F2, or the third subpixel F3 are all chamfered is described in more detail.

Figure 20:
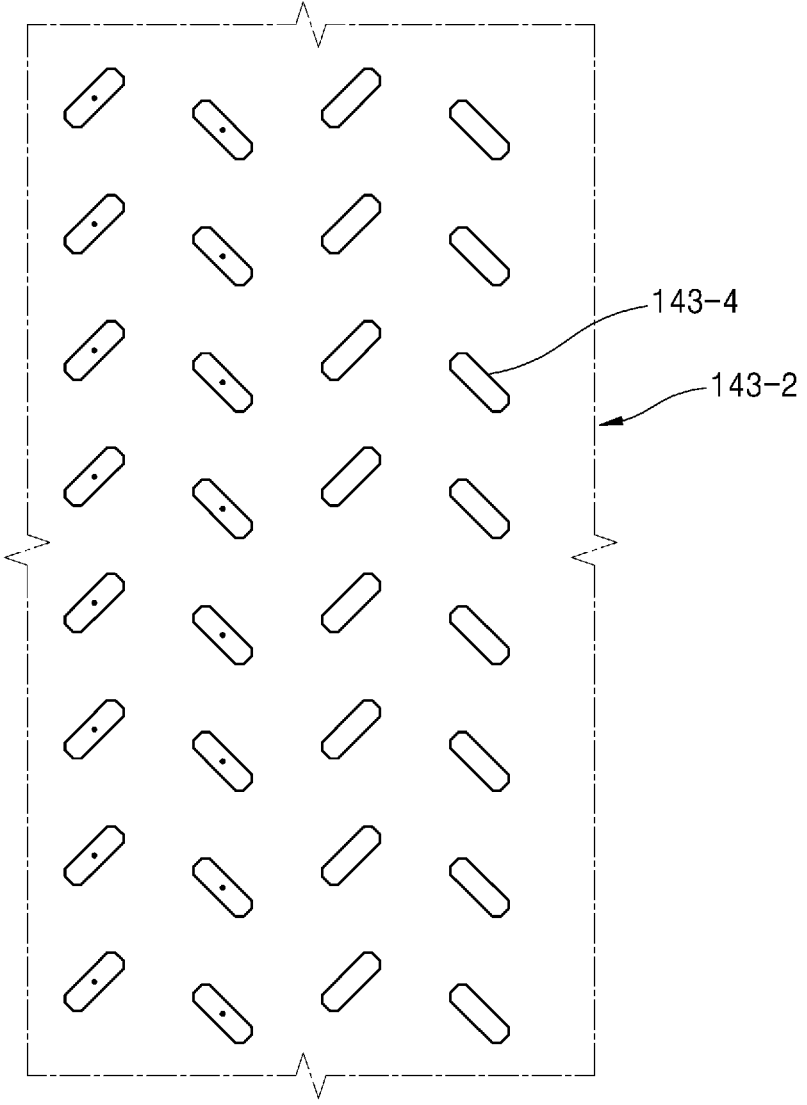
FIG. 20 is a plan view illustrating a portion of a third mask sheet for depositing a third intermediate layer shown in FIGS. 18A and 18B.
Figure 20:
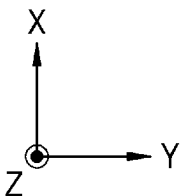

In order to form the chamfered vertexes of the first subpixel F1, the second subpixel F2, or the third subpixel F3, a vertex (or corner) of a first opening of a first mask sheet, a vertex (or corner) of the second opening 133-4 of the second mask sheet 133-2, and a vertex (or corner) of the third opening 143-4 of the third mask sheet 143-2 may be chamfered. In this case, a shape of each of the first opening, the second opening 133-4, and the third opening 143-4 may have the same as or similar to an octagonal shape. In particular, chamfered portions of the first opening, the second opening 133-4, and the third opening 143-4 may be round, the first opening may be formed as shown in FIG. 15, and the second opening 133-4 and the third opening 143-4 may be formed to have an inclined shape as shown in FIGS. 19 and 20.

As described above, in one or more embodiments where the vertexes of the first opening, the second opening 133-4, and the third opening 143-4 are chamfered, when each of the first mask sheet, the second mask sheet 133-2, and the third mask sheet 143-2 are tensioned, stress may not be concentrated on the vertexes of the first opening, the second opening 133-4, and the third opening 143-4.

Accordingly, when each of the first mask sheet, the second mask sheet 133-2, and the third mask sheet 143-2 is tensioned, damage to the first mask sheet, the second mask sheet 133-2, and the third mask sheet 143-2 may be prevented or substantially prevented. In one or more embodiments, a first deposition material, a second deposition material, and a third deposition material are respectively deposited on the vertexes of the first opening, the second opening 133-4, and the third opening 143-4, such that the deposition materials do not block each other. Thus, the first intermediate layer 28-2A, the second intermediate layer 28-2B, and the third intermediate layer 28-2C having accurate shapes may be formed.

The display apparatus may be manufactured by an apparatus for manufacturing a display apparatus that is the same as or similar to the apparatus for manufacturing a display apparatus of FIGS. 5 and 6.

In this case, a first deposition portion may supply the first deposition material to the substrate to form the first intermediate layer 28-2A, a second deposition portion may supply the second deposition material to the substrate to form the second intermediate layer 28-2B, and the third deposition portion may supply the third deposition material to the substrate to form the third intermediate layer 28-2C.

The first mask sheet used by the first deposition portion may include the first opening formed to correspond to a shape of the first subpixel F1. A planar area of a first opening may be greater than or equal to a planar area of a first subpixel F1 corresponding to the first opening. In one or more embodiments, the planar area of the first opening may be less than or equal to a planar area of a first intermediate layer 28-2A formed by having a first deposition material that passed through the first opening deposited on the substrate. Here, the first opening, the first intermediate layer 28-2A, and the first subpixel F1 that correspond to each other may each have a shape corresponding to each other.

A second opening 133-4 of a second mask sheet 133-2 used by the second deposition portion may also be formed to correspond to a shape of the second subpixel F2. Here, the second opening 133-4 may be arranged in the same manner as the second subpixel F2 is arranged. In this case, a planar area of the second opening 133-4 may be greater than or equal to a planar area of the second subpixel F2, and may be less than or equal to a planar area of a second intermediate layer 28-2B formed by having the second deposition material deposited on the substrate.

A third opening 143-4 of a third mask sheet 143-2 used by the third deposition portion may also be formed to correspond to a shape of the third subpixel F3, and a planar area of the third opening 143-4 may be greater than or equal to a planar area of the third subpixel F3. In one or more embodiments, a planar area of the third opening 143-4 may be less than or equal to a planar area of the third intermediate layer 28-2C.

In this case, the first subpixel F1, the second subpixel F2, and the third subpixel F3 may be similar to those described with reference to FIGS. 11A and 11B. In one or more embodiments, the relationship among the first intermediate layer 28-2A, the second intermediate layer 28-2B, and the third intermediate layer 28-2C may be the same as the relationship among the first subpixel F1, the second subpixel F2, and the third subpixel F3.

For example, centers of some of the second subpixels F2 may be arranged in a straight line in one direction, and centers of the others of the second subpixels F2 may be arranged in a serpentine form in another direction. In one or more embodiments, centers of some of the third subpixels F3 may be arranged in one direction in a straight line, and centers of the others of the third subpixels F3 may be arranged in a serpentine form in another direction. Centers of the first subpixels F1 may be arranged in a straight line in a direction different from one direction.

In one or more embodiments, the second subpixel F2 and the third subpixel F3 facing the same first subpixel F1 may be tilted in directions opposite to each other with respect to the tensile direction of the second mask sheet 133-2 and the tensile direction of the third mask sheet 143-2. In particular, in this case, the second subpixels F2 adjacent to each other may form an angle of 45° or about 45° with respect to the tensile direction of the second mask sheet 133-2 in directions opposite to each other. Further, second openings 133-4 may also form an angle of 45° or about 45° with respect to the tensile direction of the second mask sheet 133-2, the second openings 133-4 being formed in the second mask sheet 133-2 and adjacent to each other. An angle of 45° or about 45° may be formed between each of the third subpixels F3 adjacent to each other and the tensile direction of the third mask sheet 143-2 in directions opposite to each other. In one or more embodiments, the third openings 143-4 may also form an angle of 45° or about 45° with respect to the tensile direction of the third mask sheet 143-2, the third openings 143-4 being formed in the third mask sheet 143-2 and adjacent to each other. In the case described above, the second intermediate layer 28-2B and the third intermediate layer 28-2C may be arranged on the substrate at positions corresponding to the second opening 133-4 and the third opening 143-4, respectively.

The display apparatus may be fixed to an apparatus that transports a user such as a vehicle or the like. In this case, the display apparatus may be fixed to the apparatus such that a predetermined or set angle that is not 0° is formed between a user's gaze direction and the first direction or the second direction. For example, the display apparatus may be arranged such that an angle of 90° is formed between the user's gaze direction looking at the display apparatus and the first direction or the second direction.

In the case described above, when the user looks at the display apparatus, an inclined portion of the pixel-defining layer and the gaze direction are not perpendicular to each other, and thus, external light may be reflected through the inclined portion of the pixel-defining layer and prevented or substantially prevented from being incident to the user's eyes. In other words, the inclined portion may prevent or substantially prevent external light being reflected into the user's eyes.

In one or more embodiments, the display apparatus may implement a precise image through each subpixel.

The display apparatus may include a blocking portion including the blocking layer 52. In this case, the blocking layer 52 may be provided as a plurality of blocking layers 52 and may be arranged to be spaced apart from each other. Each blocking layer 52 may be arranged on the first subpixel F1, the second subpixel F2, and the third subpixel F3, as described with reference to FIGS. 4A and 4B.

Therefore, the display apparatus may prevent or substantially prevent a Moire phenomenon from being seen from the outside (e.g., seen from an external environment) of the display apparatus due to external light or an operation of the display apparatus.

The apparatus for manufacturing a display apparatus and a method of manufacturing a display apparatus may manufacture the display apparatus having a precise deposition pattern.

In one or more embodiments, the apparatus for manufacturing a display apparatus and the method of manufacturing a display apparatus may reduce an error between a design pattern and an actual deposition pattern that may occur during a manufacturing process.

Figure 21:
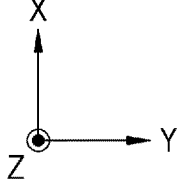
FIG. 21 is a plan view illustrating a first subpixel, a second subpixel, and a third subpixel of a display apparatus according to one or more embodiments.

FIG. 21 is a plan view illustrating a first subpixel F1, a second subpixel F2, and a third subpixel F3 of a display apparatus according to one or more embodiments.

Referring to FIG. 21, the display apparatus may be the same as that shown in FIGS. 2A and 2B. In this case, a display panel may be formed identically or similarly to the display panel described above. Here, the display apparatus may include the display panel including the first subpixel F1, the second subpixel F2, and the third subpixel F3.

The subpixels may include the first subpixel F1, the second subpixel F2, and the third subpixel F3. In this case, one of the first subpixel F1, the second subpixel F2, and the third subpixel F3 may have a square shape, and the other two of the first subpixel F1, the second subpixel F2, and the third subpixel F3 may have a rectangular shape. Hereinafter, for convenience of description, one or more embodiments where the first subpixel F1 has a square shape, and the second subpixel F2 and the third subpixel F3 have a rectangular shape is described in more detail.

One of the first subpixel F1, the second subpixel F2, or the third subpixel F3 emits blue light, another one of the first subpixel F1, the second subpixel F2, and the third subpixel F3 emits red light, and the other one of the first subpixel F1, the second subpixel F2, and the third subpixel F3 emits green light. In this case, according to a shape of each of the first subpixel F1, the second subpixel F2, and the third subpixel F3, one of the blue, red, and green light may have a square shape, and the other of the blue, red, or green light may have a rectangular shape. Hereinafter, for convenience of description, one or more embodiments where the first subpixel F1 emits blue light, the second subpixel F2 emits red light, and the third subpixel F3 emits green light is described in more detail.

Areas of the first subpixel F1, the second subpixel F2, and the third subpixel F3 may be variously configured. In this case, because an aperture ratio of each subpixel is adjustable, display apparatuses with various suitable shapes and capable of various suitable operations may be implemented.

The first subpixel F1, the second subpixel F2, and the third subpixel F3 may respectively include a first intermediate layer 28-2A, a second intermediate layer 28-2B, and a third intermediate layer 28-2C. In this case, the first intermediate layer 28-2A, the second intermediate layer 28-2B, and the third intermediate layer 28-2C may include materials (e.g., organic light-emitting layers) that emit different light beams when external power is applied thereto.

The first intermediate layer 28-2A, the second intermediate layer 28-2B, and the third intermediate layer 28-2C may respectively correspond to the shapes of the first subpixel F1, the second subpixel F2, and the third subpixel F3. For example, the first intermediate layer 28-2A may have a square shape to correspond to a square shape of the first subpixel F1. In one or more embodiments, the second intermediate layer 28-2B and the third intermediate layer 28-2C may have a rectangular shape to correspond to a rectangular shape of the second subpixel F2 and the third subpixel F3, respectively. In this case, a planar area of each intermediate layer may be the same as or different from a planar area of each subpixel. For example, in one or more embodiments, a planar area of the first intermediate layer 28-2A may be different from a planar area of the first subpixel F1, a planar area of the second intermediate layer 28-2B may be the same as a planar area of the second subpixel F2, and a planar area of the third intermediate layer 28-2C may be the same as a planar area of the third subpixel F3. In another embodiment, the planar area of the second intermediate layer 28-2B may be different from the planar area of the second subpixel F2, the planar area of the first intermediate layer 28-2A may be the same as the planar area of the first subpixel F1, and the planar area of the third intermediate layer 28-2C may be the same as the planar area of the third subpixel F3. In another embodiment, the planar area of the third intermediate layer 28-2C may be different from the planar area of the third subpixel F3, the planar area of the second intermediate layer 28-2B may be the same as the planar area of the second subpixel F2, and the planar area of the first intermediate layer 28-2A may be the same as the planar area of the first subpixel F1. In another embodiment, the planar area of the first intermediate layer 28-2A may be the same as the planar area of the first subpixel F1, the planar area of the second intermediate layer 28-2B may be different from the planar area of the second subpixel F2, and the planar area of the third intermediate layer 28-2C may be different from the planar area of the third subpixel F3. In another embodiment, the planar area of the second intermediate layer 28-2B may be the same as the planar area of the second subpixel F2, the planar area of the first intermediate layer 28-2A may be different from the planar area of the first subpixel F1, and the planar area of the third intermediate layer 28-2C may be different from the planar area of the third subpixel F3. In another embodiment, the planar area of the third intermediate layer 28-2C may be the same as the planar area of the third subpixel F3, the planar area of the first intermediate layer 28-2A may be different from the planar area of the first subpixel F1, and the planar area of the second intermediate layer 28-2B may be different from the planar area of the second subpixel F2. In another embodiment, the planar area of the first intermediate layer 28-2A may be different from the planar area of the first subpixel F1, the planar area of the second intermediate layer 28-2B may be different from the planar area of the second subpixel F2, and the planar area of the third intermediate layer 28-2C may be different from the planar area of the third subpixel F3. In another embodiment, the planar area of the first intermediate layer 28-2A may be the same as the planar area of the first subpixel F1, the planar area of the second intermediate layer 28-2B may be the same as the planar area of the second subpixel F2, and the planar area of the third intermediate layer 28-2C may be the same as the planar area of the third subpixel F3. In this case, the planar area may be an area of a plane formed by a display area of the display apparatus. Alternatively, the planar area may be an area of a plane on which an image is implemented when the image is implemented. Hereinafter, for convenience of description, one or more embodiments where a planar area of each intermediate layer is different from a planar area of each subpixel is described in more detail.

The first subpixel F1, the second subpixel F2, and the third subpixel F3 may be provided as a plurality of first subpixels F1, a plurality of second subpixels F2, and a plurality of third subpixels F3, respectively. The first subpixels F1 may be spaced apart from each other in at least one of the first direction or the second direction. For example, some of the first subpixels F1 may be arranged to be spaced apart from each other in the first direction (e.g., one of the X-axis direction and the Y-axis direction of FIG. 1), and other ones of the first subpixels F1 may be arranged to be spaced apart from each other in the second direction (e.g., the other of the X-axis direction and the Y-axis direction of FIG. 1). Here, centers of the first subpixels F1 arranged in the first direction among the first subpixels F1 may be arranged in a straight line, and the straight line may be arranged in the same direction as the first direction. In one or more embodiments, centers of the first subpixels F1 arranged in the second direction among the first subpixels F1 may be arranged in a straight line, and the straight line may be arranged in the same direction as the second direction.

A predetermined or set angle may be formed between a first side S1 and a second side S2 of each first subpixel F1. In particular, the first side S1 and the second side S2 of the first subpixel F1 may be perpendicular or normal to each other. In this case, the first side S1 and the second side S2 may be tilted in different directions with respect to at least one of the first direction or the second direction. Accordingly, each first subpixel F1 may be arranged in a diamond shape based on one of the first direction and the second direction, and an angle formed between two sides (e.g., the first side S1 and the second side S2) adjacent to each vertex of each first subpixel F1 may be 900.

In this case, one second subpixel F2 or one third subpixel F3 may be arranged to face the first subpixel F1 at the first side S1 or the second side S2 of one first subpixel F1. The second subpixel F2 and the third subpixel F3 may be tilted with respect to one of the first direction and the second direction. In particular, the second subpixel F2 and the third subpixel F3 may be tilted such that an angle of 45° or about 45° is formed with respect to one of the first direction and the second direction. For example, an angle of 45° or about 45° may be formed between at least one of a short side or a long side of at least one of the second subpixel F2 or the third subpixel F3 and a straight line connecting or crossing the centers of the first subpixels F1 arranged in the first direction.

The second subpixel F2 and the third subpixel F3 may each have a rectangular shape. Here, an area of at least one of the second subpixel F2 or the third subpixel F3 may be less than an area of the first subpixel F1. In one or more embodiments, at least one of the second subpixel F2 or the third subpixel F3 facing the first subpixel F1 may be arranged to overlap one side (e.g., the first side S1 or the second side S2) of the first subpixel F1 facing the second subpixel F2 and the third subpixel F3, and/or may be arranged to overlap an extension line of the one side of the first subpixel F1 (in a direction parallel to a plane defined by the X axis and the Y axis). For example, at least a side portion of the second subpixel F2 and at least a side portion of the third subpixel F3 adjacent to the second subpixel F2 may be arranged within a length range of one of the first side S1 or the second side S2. A short side or a long side of at least one of a second subpixel F2 or a third subpixel F3 facing one first subpixel F1 may be parallel to the first side S1 or the second side S2.

For example, in one or more embodiments, extension lines of short sides of different second subpixels F2 respectively facing the first side S1 and the second side S2 may cross each other, or extension lines of long sides of the different second subpixels F2 respectively facing the first side S1 and the second side S2 may cross each other. In another embodiment, extension lines of short sides of third subpixels F3 respectively facing the first side S1 and the second side S2 may cross each other, or extension lines of long sides of the third subpixels F3 respectively facing the first side S1 and the second side S2 may cross each other. In another embodiment, the extension line of the short side of the second subpixel F2 facing the first side S1 may cross the extension line of the short side of the third subpixel F3 facing the second side S2, or the extension line of the long side of the second subpixel F2 facing the first side S1 may cross the extension line of the long side of the third subpixel F3 facing the second side S2. In another embodiment, the extension line of the long side of the second subpixel F2 facing the first side S1 may cross the extension line of the short side of the third subpixel F3 facing the second side S2, or the extension line of the short side of the second subpixel F2 facing the first side S1 may cross the extension line of the long side of the third subpixel F3 facing the second side S2.

The second subpixel F2 may be arranged to be spaced apart from each other in at least one of the first direction or the second direction. In one or more embodiments, centers of some of second subpixels F2 arranged in the first direction or the second direction may be positioned in a straight line. In another embodiment, centers of some of second subpixels F2 arranged in one of the first direction and the second direction may be arranged in a straight line, and centers of the others of the second subpixels F2 arranged in the other of the first direction or the second direction may be arranged in a serpentine (or zigzag) form in the other of the first direction and the second direction. Hereinafter, for convenience of description, one or more embodiments where centers of some of the second subpixels F2 arranged in the first direction are arranged in a straight line, and centers of the others of the second subpixels F2 arranged in the second direction are arranged in a serpentine form is described in more detail.

Similarly to the second subpixel F2, the third subpixels F3 may be arranged to be spaced apart from each other in at least one of the first direction or the second direction. In this case, the third subpixels F3 may be arranged in a similar manner to the second subpixel F2. Hereinafter, for convenience of description, one or more embodiments where centers of some of third subpixels F3 arranged in the first direction among the third subpixels F3 are arranged in a straight line, and centers of the others of the third subpixels F3 arranged in the second direction among the third subpixels F3 are arranged in a serpentine form is described in more detail.

In the case described above, one of a second subpixel F2 and a third subpixel F3 facing a first side S1 of a first subpixel F1 may be arranged to be symmetrical to one of a second subpixel F2 and a third subpixel F3 facing a second side S2 of the first subpixel F1 with respect to or about a straight line (or a straight line that passes through centers of two adjacent subpixels and is parallel to the first direction) connecting or crossing the centers of the first subpixels F1 arranged in the first direction. For example, the second subpixel F2 facing the first side S1 may be symmetrical to the third subpixel F3 facing the second side S2 with respect to or about the straight line. In one or more embodiments, the third subpixel F3 facing the first side S1 may be symmetrical to the second subpixel F2 facing the second side S2 with respect to or about the straight line. In this case, a distance between the centers of the second subpixels F2 adjacent to each other may be the same as a distance between the centers of the third subpixels F3 adjacent to each other. In another embodiment, the second subpixel F2 and the third subpixel F3 facing the first side S1 may be symmetrical to the second subpixel F2 and the third subpixel F3 facing the second side S2 with respect to or about the straight line. In this case, a distance between centers of one of a pair of second subpixels F2 and a pair of third subpixels F3 arranged to be symmetrical to each other may be less than a distance between centers of the other of the pair of second subpixels F2 or the pair of third subpixels F3 arranged to be symmetrical to each other. In this case, the pair of second subpixels F2 adjacent to each other may be positioned between the pair of third subpixels F3 adjacent to each other, or the pair of third subpixels F3 adjacent to each other may be positioned between the pair of second subpixels F2 adjacent to each other. However, hereinafter, for convenience of description, one or more embodiments where the second subpixel F2 is arranged to be symmetrical to the third subpixel F3 with respect to or about a straight line connecting or crossing the centers of the first subpixels F1 arranged in the first direction is described in more detail.

When the arrangement is made as described above, a first distance L1, which is a shortest distance from an edge of the first subpixel F1 to the second subpixel F2, may the same as a second distance L2, which is a shortest distance from the edge of the first subpixel F1 to the third subpixel F3. In this case, the shortest distance may be measured from the first side S1 or the second side S2 to one side of the second subpixel F2 or one side of the third subpixel F3 in a direction perpendicular or normal to one of the first side S1 and the second side S2. Alternatively, in another embodiment, the shortest distance may be measured from the first side S1 (or an extension line of the first side S1 or the second side S2 (an extension line of the second side S2) to one side of the second subpixel F2 or one side of the third subpixel F3 in a direction perpendicular or normal to an extension line of one of the first side S1 and the second side S2. However, hereinafter, for convenience of description, one or more embodiments where the shortest distance is a distance measured between the first side S1 or the extension line of the first side S1 and the second subpixel F2 and the third subpixel F3 facing the first side S1 is described in more detail. In another embodiment, the shortest distance may be measured as a distance from the center of the first subpixel F1 to the center of the second subpixel F2 or a distance from the center of the first subpixel F1 to the center of the third subpixel F3. In another embodiment, the shortest distance may be measured as a distance from the first side S1 of the first subpixel F1 or an extension line of the first side S1 to the center of the second subpixel F2, or a distance from the first side S1 of the first subpixel F1 or the extension line of the first side S1 to the center of the third subpixel F3.

The first distance L1 and the second distance L2 measured from the first side S1 or the extension line of the first side S1 may be the same. In this case, the first distance L1 may be a distance from one of the first side S1 and the extension line of the first side S1 to a short side of the second subpixel F2, and the second distance L2 may be a distance from one of the first side S1 and the extension line of the first side S1 to a short side of the third subpixel F3.

An outline R connecting a portion of an edge of the second subpixel F2 to a portion of an edge of the third subpixel F3 may have a square shape, the second subpixel F2 and the third subpixel F3 facing one side of the first subpixel F1. For example, the outline R may be drawn by connecting, except for one side of the second subpixel F2 and one side of the third subpixel F3, the other edges of the second subpixel F2 to the other edges of the third subpixel F3, and connecting a vertex of the second subpixel F2 to a vertex of the third subpixel F3, at a portion where the second subpixel F2 and the third subpixel F3 are spaced apart from each other, wherein the one side of the second subpixel F2 and the one side of the third subpixel F3 face each other, and the vertex of the second subpixel F2 and the vertex of the third subpixel F3 face each other. The outline R may be formed in a square shape such that the second subpixel F2 and the third subpixel F3 are arranged at the second side S2 in a mirrored manner to correspond to an arrangement of the second subpixel F2 and the third subpixel F3 that face the first side S1.

The first intermediate layer 28-2A, the second intermediate layer 28-2B, and the third intermediate layer 28-2C, which respectively form the first subpixel F1, the second subpixel F2, and the third subpixel F3, may be formed and arranged in the same or a similar manner as the first subpixel F1, the second subpixel F2, and the third subpixel F3, respectively. In this case, centers of the first intermediate layer 28-2A, the second intermediate layer 28-2B, and the third intermediate layer 28-2C may be respectively arranged at positions that are the same as or different from the centers of the first subpixel F1, the second subpixel F2, and the third subpixel F3. Here, the descriptions of the first subpixel F1, the second subpixel F2, and the third subpixel F3 described above may be respectively applied to the first intermediate layer 28-2A, the second intermediate layer 28-2B, and the third intermediate layer 28-2C.

The display apparatus may include a blocking portion including the blocking layer 52. In this case, the blocking layer 52 may be provided as a plurality of blocking layers 52 and may be arranged to be spaced apart from each other. Each blocking layer 52 may be arranged on the first subpixel F1, the second subpixel F2, and the third subpixel F3, as described with reference to FIGS. 4A and 4B.

Therefore, the display apparatus may prevent or substantially prevent a Moire phenomenon from being seen from the outside (e.g., seen from an external environment) of the display apparatus due to external light or an operation of the display apparatus.

The display apparatus may be manufactured by an apparatus for manufacturing a display apparatus. Here, the apparatus for manufacturing a display apparatus may be formed similarly to that shown in FIGS. 5 and 6. In this case, the first intermediate layer 28-2A through the third intermediate layer 28-2C may be formed by using a mask sheet having a shape similar to that of the first mask sheet through the third mask sheet described above. Openings of each mask sheet used in forming the first intermediate layer 28-2A through the third intermediate layer 28-2C may be formed to correspond to a shape of each intermediate layer.

Figure 22:
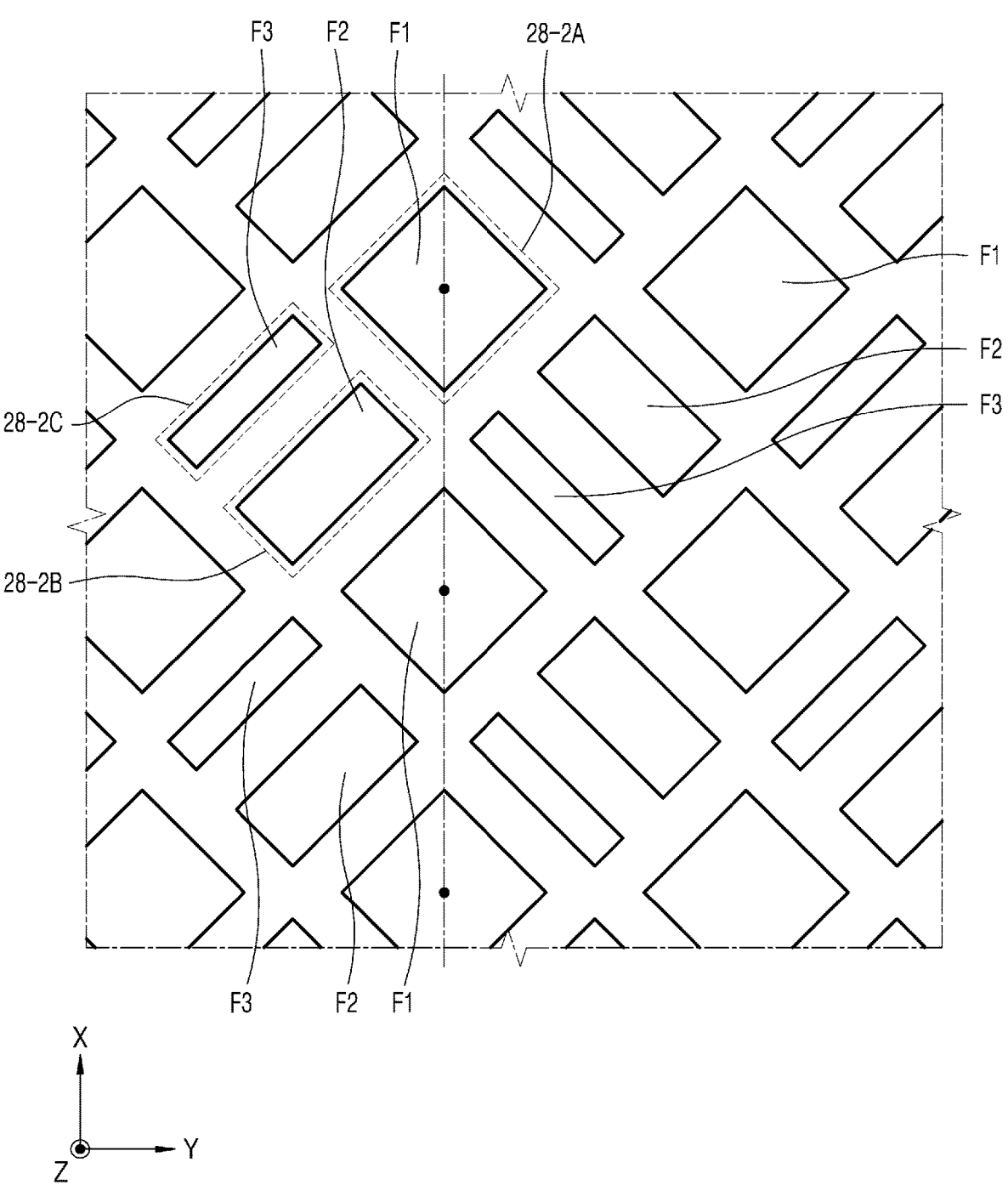
FIG. 22 is a plan view illustrating a first subpixel, a second subpixel, and a third subpixel of a display apparatus according to one or more embodiments.

FIG. 22 is a plan view illustrating a first subpixel F1, a second subpixel F2, and a third subpixel F3 of a display apparatus according to one or more embodiments.

Referring to FIG. 22, the display apparatus may be the same as that shown in FIGS. 2A and 2B. In a display panel, a display area and a non-display area outside or around the display area may be defined over a substrate. In one or more embodiments, the non-display area surrounds the display area. The subpixels including the first subpixel F1, the second subpixel F2, and the third subpixel F3 may be arranged in the display area, and a power line may be arranged in the non-display area. In one or more embodiments, a pad portion may be arranged in the non-display area. The display apparatus may include a display substrate, an intermediate layer arranged in the display area, an opposite electrode, and a thin-film encapsulation layer.

The first subpixel F1, the second subpixel F2, and the third subpixel F3 may emit light beams of different colors. For example, one of the first subpixel F1, the second subpixel F2, and the third subpixel F3 emits blue light, another one of the first subpixel F1, the second subpixel F2, and the third subpixel F3 emits red light, and the other one of the first subpixel F1, the second subpixel F2, and the third subpixel F3 emits green light.

One of the first subpixel F1, the second subpixel F2, or the third subpixel F3 may have a square shape, and the other two of the first subpixel F1, the second subpixel F2, and the third subpixel F3 may have a rectangular shape.

Hereinafter, for convenience of description, one or more embodiments where the first subpixel F1 has a square shape and emits red light, the second subpixel F2 has a rectangular shape and emits green light, and the third subpixel F3 has a rectangular shape and emits blue light is described in more detail.

The first subpixel F1 may include a first intermediate layer 28-2A, and the first intermediate layer 28-2A may correspond to a shape and a position of the first subpixel F1. In this case, a planar area of the first intermediate layer 28-2A may be greater than or equal to a planar area of the first subpixel F1, and a region of the first subpixel F1 may be arranged in a region of the first intermediate layer 28-2A.

The second subpixel F2 may include a second intermediate layer 28-2B. In one or more embodiments, the second intermediate layer 28-2B may correspond to a shape and a position of the second subpixel F2. In this case, a region of the second subpixel F2 may be arranged in a region of the second intermediate layer 28-2B.

The third subpixel F3 may include a third intermediate layer 28-2C. In one or more embodiments, the third intermediate layer 28-2C may correspond to a shape and a position of the third subpixel F3. In this case, a region of the third subpixel F3 may be arranged in a region of the third intermediate layer 28-2C.

The planar area of the second subpixel F2 may be different from the planar area of the third subpixel F3. For example, one of the planar area of the second subpixel F2 and the planar area of the third subpixel F3 may be less than the other of the planar area of the second subpixel F2 or the planar area of the third subpixel F3. In one or more embodiments, the planar area of the second subpixel F2 may be less than the planar area of the third subpixel F3. In another embodiment, the planar area of the third subpixel F3 may be less than the planar area of the second subpixel F2. Therefore, an aperture ratio of light emitted from each subpixel may be adjustable.

As described above, adjusting an area of at least one of the first subpixel F1, the second subpixel F2, or the third subpixel F3 may be achieved by adjusting an area of a pixel-defining layer that exposes a pixel electrode. In this case, the first intermediate layer 28-2A, the second intermediate layer 28-2B, and the third intermediate layer 28-2C formed by being respectively deposited on the first subpixel F1, the second subpixel F2, and the third subpixel F3 may have an area and a shape corresponding to those of each subpixel to prevent or substantially prevent the subpixel from overlapping each other.

The display apparatus may include a blocking portion including the blocking layer 52. In this case, the blocking layer 52 may be provided as a plurality of blocking layers 52 and may be arranged to be spaced apart from each other. Each blocking layer 52 may be arranged on the first subpixel F1, the second subpixel F2, and the third subpixel F3, as described with reference to FIGS. 4A and 4B.

Therefore, the display apparatus may prevent or substantially prevent a Moire phenomenon from being seen from the outside (e.g., seen from an external environment) of the display apparatus due to external light or an operation of the display apparatus.

The display apparatus may be manufactured by an apparatus for manufacturing a display apparatus. Here, the apparatus for manufacturing a display apparatus may be formed similarly to that shown in FIGS. 5 and 6. In this case, the first intermediate layer 28-2A through the third intermediate layer 28-2C may be formed by using a mask sheet having a shape similar to that of the first mask sheet through the third mask sheet described above. Openings of each mask sheet used in roming the first intermediate layer 28-2A through the third intermediate layer 28-2C may be formed to correspond to a shape of each intermediate layer. The display apparatus may be fixed to an apparatus that transports a user such as a vehicle or the like. In this case, the display apparatus may be fixed to the apparatus such that a predetermined or set angle that is not 0° is formed between a user's gaze direction and the first direction or the second direction. For example, the display apparatus may be arranged such that an angle of 90° is formed between the user's gaze direction looking at the display apparatus and the first direction or the second direction.

In the case described above, when the user looks at the display apparatus, an inclined portion of the pixel-defining layer and the gaze direction are not perpendicular to each other, and thus, external light may be reflected through the inclined portion of the pixel-defining layer and prevented or substantially prevented from being incident to the user's eyes. In other words, the inclined portion may prevent or substantially prevent external light being reflected into the user's eyes.

In one or more embodiments, the display apparatus may implement a precise image through each subpixel.

Figure 23:
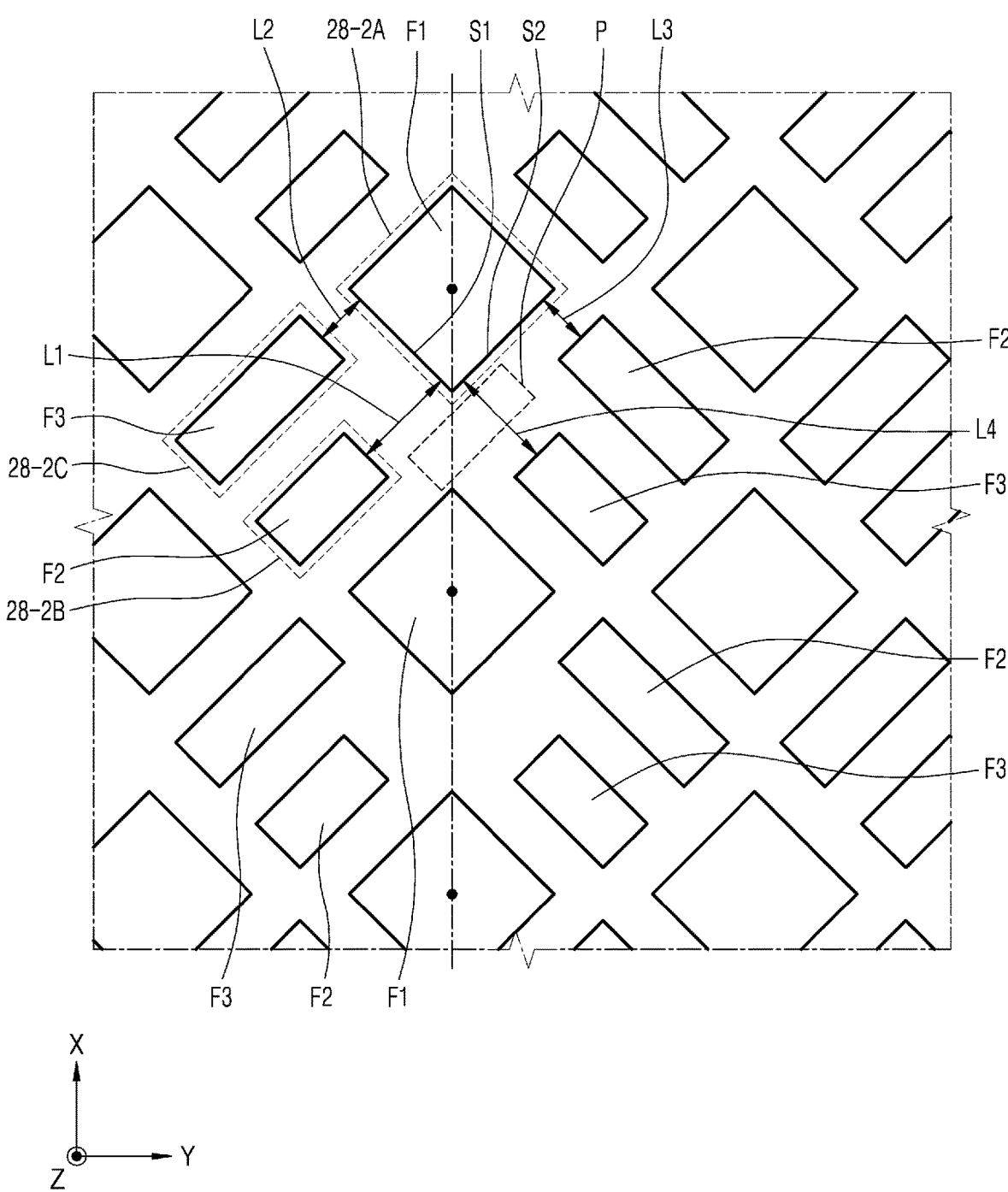
FIG. 23 is a plan view illustrating a first subpixel, a second subpixel, and a third subpixel of a display apparatus according to one or more embodiments.

FIG. 23 is a plan view illustrating a first subpixel F1, a second subpixel F2, and a third subpixel F3 of a display apparatus according to one or more embodiments.

Referring to FIG. 23, the display apparatus may be the same as that shown in FIGS. 2A and 2B. In a display panel, a display area and a non-display area outside or around the display area may be defined over a substrate. In one or more embodiments, the non-display area surrounds the display area. The subpixels including the first subpixel F1, the second subpixel F2, and the third subpixel F3 may be arranged in the display area, and a power line may be arranged in the non-display area. In one or more embodiments, a pad portion may be arranged in the non-display area. The display apparatus may include a display substrate, an intermediate layer arranged in the display area, an opposite electrode, and a thin-film encapsulation layer.

The first subpixel F1, the second subpixel F2, and the third subpixel F3 may emit light beams of different colors. For example, one of the first subpixel F1, the second subpixel F2, and the third subpixel F3 emits blue light, another one of the first subpixel F1, the second subpixel F2, and the third subpixel F3 emits red light, and the other one of the first subpixel F1, the second subpixel F2, and the third subpixel F3 emits green light.

One of the first subpixel F1, the second subpixel F2, or the third subpixel F3 may have a square shape, and the other two of the first subpixel F1, the second subpixel F2, and the third subpixel F3 may have a rectangular shape.

Hereinafter, for convenience of description, one or more embodiments where the first subpixel F1 has a square shape and emits red light, the second subpixel F2 has a rectangular shape and emits green light, and the third subpixel F3 has a rectangular shape and emits blue light is described in more detail.

The first subpixel F1 may include a first intermediate layer 28-2A, and the first intermediate layer 28-2A may correspond to a shape and a position of the first subpixel F1. In this case, a planar area of the first intermediate layer 28-2A may be greater than or equal to a planar area of the first subpixel F1, and a region of the first subpixel F1 may be arranged in a region of the first intermediate layer 28-2A.

The second subpixel F2 may include a second intermediate layer 28-2B. In one or more embodiments, the second intermediate layer 28-2B may correspond to a shape and a position of the second subpixel F2. In this case, a region of the second subpixel F2 may be arranged in a region of the second intermediate layer 28-2B.

The third subpixel F3 may include a third intermediate layer 28-2C. In one or more embodiments, the third intermediate layer 28-2C may correspond to a shape and a position of the third subpixel F3. In this case, a region of the third subpixel F3 may be arranged in a region of the third intermediate layer 28-2C.

In the case described above, each of the second subpixel F2 and the third subpixel F3 may have various suitable planar areas.

In one or more embodiments, the planar areas of the second subpixels F2 may be different from each other. For example, planar areas of some of the second subpixels F2 may be different from planar areas of the others of the second subpixels F2. In particular, a pair of second subpixels F2 that face one first subpixel F1 and are adjacent to each other may have different planar areas.

In one or more embodiments, the planar areas of the third subpixels F3 may be different from each other. For example, planar areas of some of the third subpixels F3 may be different from planar areas of the others of the third subpixels F3. In particular, third subpixels F3 that face one first subpixel F1 and are adjacent to each other may have different planar areas.

In the case described above, distances from one of the first side S1 and the second side S2 of the first subpixel F1, or an extension line of the first side S1 or the second side S2 of the first subpixel F1 to the second subpixel F2 and the third subpixel F3 that face one of the first side S1 and the second side S2 may be different from each other.

For example, with regard to the second subpixel F2 and the third subpixel F3 that face the first side S1 or the extension line of the first side S1, a first distance L1, which is a shortest distance from the first side S1 or the extension line of the first side S1 to a short side (or one side, or a center of the second subpixel F2) of the second subpixel F2, may be different from a second distance L2, which is a shortest distance from the first side S1 or the extension line of the first side S1 to a short side (or one side, or a center of the third subpixel F3) of the third subpixel F3. In particular, the first distance L1 may be longer than the second distance L2.

For example, with regard to the second subpixel F2 and the third subpixel F3 that face the second side S2 or the extension line of the second side S2, a third distance L3, which is a shortest distance from the second side S2 or the extension line of the second side S2 to a short side (or one side, or a center of the second subpixel F2) of the second subpixel F2, may be different from a fourth distance L4, which is a shortest distance from the second side S2 or the extension line of the second side S2 to a short side (or one side, or a center of the third subpixel F3) of the third subpixel F3. In particular, the third distance L3 may be shorter than the fourth distance L4.

In another embodiment, the planar areas of the second subpixels F2 may be the same, and the planar areas of the third subpixels F3 may be the same. In this case, the planar area of each second subpixel F2 may be greater or smaller than the planar area of each third subpixel F3. In the case described above, in one or more embodiments, a pair of third subpixels F3 may be arranged between a pair of second subpixels F2 respectively arranged to face the first side S1 and the second side S2, so as to face the first side S1 and the second side S2, respectively. In this case, the shortest distance from the first side S1 or the second side S2 to the short side (or one side, or the center of the second subpixel F2) of the second subpixel F2 may be smaller than the shortest distance from the first side S1 or the second side S2 to the short side (or one side, or the center of the third subpixel F3) of the third subpixel F3. In another embodiment, a pair of second subpixels F2 may be arranged between a pair of third subpixels F3 respectively arranged to face the first side S1 and the second side S2, so as to face the first side S1 and the second side S2, respectively. In this case, the shortest distance from the first side S1 or the second side S2 to the short side (or one side, or the center of the second subpixel F2) of the second subpixel F2 may be greater than the shortest distance from the first side S1 or the second side S2 to the short side (or one side, or the center of the third subpixel F3) of the third subpixel F3.

Hereinafter, for convenience of description, one or more embodiments where planar areas of some of the second subpixels F2 are different from planar areas of the others of the second subpixels F2, planar areas of some of the third subpixels F3 are different from planar areas of the others of the third subpixels F3, the first distance L1 is different from the second distance L2, and the third distance L3 is different from the fourth distance L4 is described in more detail.

A spacer P may be arranged between the subpixels. Here, the spacer P may be the same as or similar to that illustrated in FIG. 3.

The first intermediate layer 28-2A, the second intermediate layer 28-2B, and the third intermediate layer 28-2C may be respectively arranged in the first subpixel F1, the second subpixel F2, and the third subpixel F3 to correspond to the first subpixel F1, the second subpixel F2, and the third subpixel F3, respectively. In this case, the relationship among the first intermediate layer 28-2A, the second intermediate layer 28-2B, and the third intermediate layer 28-2C may be the same as the relationship among the first subpixel F1, the second subpixel F2, and the third subpixel F3.

For example, centers of some of the second subpixels F2 may be arranged in a straight line in one direction, and centers of the others of the second subpixels F2 may be arranged in a serpentine form in another direction. In one or more embodiments, centers of some of the third subpixels F3 may be arranged in one direction in a straight line, and centers of the others of the third subpixels F3 may be arranged in a serpentine form in another direction. Centers of the first subpixels F1 may be arranged in a straight line in a direction different from one direction.

In one or more embodiments, the second subpixel F2 and the third subpixel F3 facing the same first subpixel F1 may be tilted in directions opposite to each other with respect to a tensile direction of a second mask sheet and a tensile direction of a third mask sheet. In particular, in this case, the second subpixels F2 adjacent to each other may form an angle of 45° or about 45° with respect to the tensile direction of the second mask sheet in directions opposite to each other. Further, second openings may also form an angle of 45° or about 45° with respect to the tensile direction of the second mask sheet, the second openings being formed in the second mask sheet and adjacent to each other. The third subpixels F3 adjacent to each other may form an angle of 45° or about 45° with respect to the tensile direction of the third mask sheet in directions opposite to each other. Further, third openings may also form an angle of 45° or about 45° with respect to the tensile direction of the third mask sheet, the third openings being formed in the third mask sheet and adjacent to each other. In the case described above, the second intermediate layer 28-2B and the third intermediate layer 28-2C may be arranged on the substrate, so as to correspond to positions corresponding to the second opening and the third opening, respectively.

The display apparatus may include a blocking portion including the blocking layer 52 (shown in FIG. 1C or 1B). In this case, the blocking layer 52 may be provided as a plurality of blocking layers 52 and may be arranged to be spaced apart from each other. As described with reference to FIGS. 4A and 4B, each blocking layer 52 may be arranged on the first subpixel F1, the second subpixel F2, and the third subpixel F3.

Therefore, the display apparatus may prevent or substantially prevent a Moire phenomenon from being seen from the outside (e.g., seen from an external environment) of the display apparatus due to external light or an operation of the display apparatus.

The display apparatus may be manufactured by an apparatus for manufacturing a display apparatus. Here, the apparatus for manufacturing a display apparatus may be formed similarly to that shown in FIGS. 5 and 6. In this case, the first intermediate layer 28-2A through the third intermediate layer 28-2C may be formed by using a mask sheet having a shape similar to that of the first mask sheet through the third mask sheet described above. Openings of each mask sheet used in forming the first intermediate layer 28-2A through the third intermediate layer 28-2C may be formed to correspond to a shape of each intermediate layer.

Figure 24:
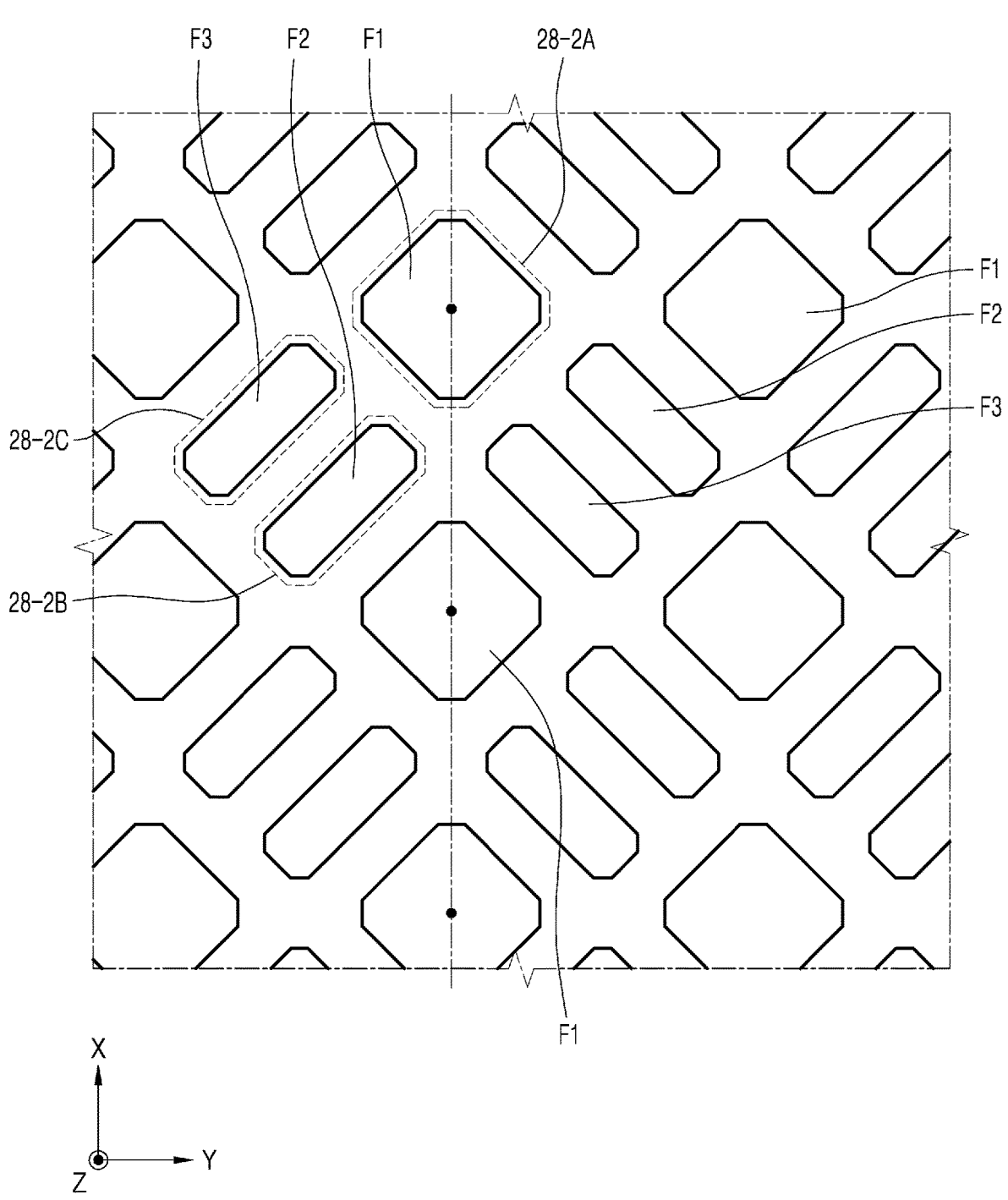
FIG. 24 is a plan view illustrating a first subpixel, a second subpixel, and a third subpixel of a display apparatus according to one or more embodiments.

FIG. 24 is a plan view illustrating a first subpixel F1, a second subpixel F2, and a third subpixel F3 of a display apparatus according to one or more embodiments.

Referring to FIG. 24, the display apparatus may be the same as that shown in FIGS. 2A and 2B. In a display panel, a display area and a non-display area outside or around the display area may be defined over a substrate. In one or more embodiments, the non-display area surrounds the display area. The subpixels including the first subpixel F1, the second subpixel F2, and the third subpixel F3 may be arranged in the display area, and a power line may be arranged in the non-display area. In one or more embodiments, a pad portion may be arranged in the non-display area. The display apparatus may include a display substrate, an intermediate layer arranged in the display area, an opposite electrode, and a thin-film encapsulation layer.

The first subpixel F1, the second subpixel F2, and the third subpixel F3 may emit light beams of different colors. For example, one of the first subpixel F1, the second subpixel F2, and the third subpixel F3 emits blue light, another one of the first subpixel F1, the second subpixel F2, and the third subpixel F3 emits red light, and the other one of the first subpixel F1, the second subpixel F2, and the third subpixel F3 emits green light.

One of the first subpixel F1, the second subpixel F2, or the third subpixel F3 may have a square shape, and the other two of the first subpixel F1, the second subpixel F2, and the third subpixel F3 may have a rectangular shape.

Hereinafter, for convenience of description, one or more embodiments where the first subpixel F1 has a square shape and emits red light, the second subpixel F2 has a rectangular shape and emits green light, and the third subpixel F3 has a rectangular shape and emits blue light is described in more detail.

The first subpixel F1 may include a first intermediate layer 28-2A, and the first intermediate layer 28-2A may correspond to a shape and a position of the first subpixel F1. In this case, a planar area of the first intermediate layer 28-2A may be greater than a planar area of the first subpixel F1, and a region of the first subpixel F1 may be arranged in a region of the first intermediate layer 28-2A.

The second subpixel F2 may include a second intermediate layer 28-2B. In one or more embodiments, the second intermediate layer 28-2B may correspond to a shape and a position of the second subpixel F2. In this case, a region of the second subpixel F2 may be arranged in a region of the second intermediate layer 28-2B.

The third subpixel F3 may include a third intermediate layer 28-2C. In one or more embodiments, the third intermediate layer 28-2C may correspond to a shape and a position of the third subpixel F3. In this case, a region of the third subpixel F3 may be arranged in a region of the third intermediate layer 28-2C.

The first subpixel F1, the second subpixel F2, and the third subpixel F3 may be identically or similarly applied to the structures described above, and the first subpixel F1, the second subpixel F2, and the third subpixel F3 may be arranged in the same or a similar manner as those described above.

Here, at least one of the first subpixel F1, the second subpixel F2, or the third subpixel F3 may have a chamfered edge. For example, in one or more embodiments, vertexes of one of the first subpixel F1, the second subpixel F2, and the third subpixel F3 may be chamfered, and the vertexes of the other two of the first subpixel F1, the second subpixel F2, and the third subpixel F3 may not be chamfered. In another embodiment, the vertexes of two of the first subpixel F1, the second subpixel F2, and the third subpixel F3 may be chamfered, and the vertexes of the other one of the first subpixel F1, the second subpixel F2, and the third subpixel F3 may not be chamfered. In another embodiment, the vertexes of the first subpixel F1, the second subpixel F2, or the third subpixel F3 may be all chamfered. Hereinafter, for convenience of description, one or more embodiments where the vertexes of the first subpixel F1, the second subpixel F2, or the third subpixel F3 are all chamfered is described in more detail.

The display apparatus may include a blocking portion including the blocking layer 52 (shown in FIG. 1C or 1B). In this case, the blocking layer 52 may be provided as a plurality of blocking layers 52 and may be arranged to be spaced apart from each other. As described above, each blocking layer 52 may be arranged on the first subpixel F1, the second subpixel F2, and the third subpixel F3.

Therefore, the display apparatus may prevent or substantially prevent a Moire phenomenon from being seen from the outside (e.g., seen from an external environment) of the display apparatus due to external light or an operation of the display apparatus.

The display apparatus may be manufactured by an apparatus for manufacturing a display apparatus. Here, the apparatus for manufacturing a display apparatus may be formed similarly to that shown in FIGS. 5 and 6. In this case, the first intermediate layer 28-2A through the third intermediate layer 28-2C may be formed by using a mask sheet having a shape similar to that of the first mask sheet through the third mask sheet described above. Openings of each mask sheet used in formjng the first intermediate layer 28-2A through the third intermediate layer 28-2C may be formed to correspond to a shape of each intermediate layer.

The first subpixel F1, the second subpixel F2, and the third subpixel F3 may be similar to those described above. In one or more embodiments, the relationship among the first intermediate layer 28-2A, the second intermediate layer 28-2B, and the third intermediate layer 28-2C may be the same as the relationship among the first subpixel F1, the second subpixel F2, and the third subpixel F3. In this case, a planar area of each intermediate layer may be greater than a planar area of each subpixel corresponding to each intermediate layer.

For example, centers of some of the second subpixels F2 may be arranged in a straight line in one direction, and centers of the others of the second subpixels F2 may be arranged in a serpentine form in another direction. In one or more embodiments, centers of some of the third subpixels F3 may be arranged in one direction in a straight line, and centers of the others of the third subpixels F3 may be arranged in a serpentine form in another direction. Centers of the first subpixels F1 may be arranged in a straight line in a direction different from one direction.

In one or more embodiments, the second subpixel F2 and the third subpixel F3 facing the same first subpixel F1 may be tilted in directions opposite to each other with respect to a tensile direction of a second mask sheet and a tensile direction of a third mask sheet. In particular, in this case, the second subpixels F2 adjacent to each other may form an angle of 45° or about 45° with respect to the tensile direction of the second mask sheet in directions opposite to each other. Further, second openings may also form an angle of 45° or about 45° with respect to the tensile direction of the second mask sheet, the second openings being formed in the second mask sheet and adjacent to each other. The third subpixels F3 adjacent to each other may form an angle of 45° or about 45° with respect to the tensile direction of the third mask sheet in directions opposite to each other. Further, third openings may also form an angle of 45° or about 45° with respect to the tensile direction of the third mask sheet, the third openings being formed in the third mask sheet and adjacent to each other. In the case described above, the second intermediate layer 28-2B and the third intermediate layer 28-2C may be arranged on the display substrate at positions corresponding to the second opening and the third opening, respectively.

The display apparatus may be fixed to an apparatus that transports a user such as a vehicle or the like. In this case, the display apparatus may be fixed to the apparatus such that a predetermined or set angle that is not 0° is formed between a user's gaze direction and the first direction or the second direction. For example, the display apparatus may be arranged such that an angle of 90° is formed between the user's gaze direction looking at the display apparatus and the first direction or the second direction.

In the case described above, when the user looks at the display apparatus, an inclined portion of the pixel-defining layer and the gaze direction are not perpendicular to each other, and thus, external light may be reflected through the inclined portion of the pixel-defining layer and prevented or substantially prevented from being incident to the user's eyes. In other words, the inclined portion may prevent or substantially prevent external light being reflected into the user's eyes.

In one or more embodiments, the display apparatus may implement a precise image through each subpixel.

The display apparatus according to one or more embodiments may reduce reflection of external light to prevent or substantially prevent a user from being dazzled or distracted thereby. In one or more embodiments, the display apparatus according to one or more embodiments may prevent or substantially prevent an image of the display apparatus from being formed in a window of a vehicle or the like.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
   a first subpixel having a rectangular shape;
   a second subpixel facing a first side of the first subpixel, the second subpixel having a rectangular shape;
   a third subpixel facing the first side of the first subpixel and spaced apart from the second subpixel, the third subpixel having a rectangular shape; and
   a blocking portion comprising a blocking layer on at least one of the first subpixel, the second subpixel, or the third subpixel, and, in a plan view, overlapping at least one of the first subpixel, the second subpixel, or the third subpixel,
   wherein a distance from the first side of the first subpixel to the second subpixel is different from a distance from the first side of the first subpixel to the third subpixel, and
   wherein at least one subpixel of the first subpixel, the second subpixel, or the third subpixel has a chamfered edge and an inclined edge portion of the chamfered edge is closer to a vertex of the rectangular shape of the at least one subpixel at the chamfered edge than to a center of the at least one subpixel.

2. The display apparatus of claim 1, wherein, in the plan view, the blocking layer overlaps two sides of at least one of the first subpixel, the second subpixel, or the third subpixel.

3. The display apparatus of claim 1, further comprising a plurality of blocking layers comprising the blocking layer, the plurality of blocking layers being spaced apart from each other and arranged in parallel with each other.

4. The display apparatus of claim 1, wherein the blocking portion further comprises:
   a protection layer exposed to outside; and
   a base layer in which a plurality of blocking layers, comprising the blocking layer, are inserted.

5. The display apparatus of claim 1, wherein an end of the blocking layer is concave.

6. The display apparatus of claim 1, further comprising a substrate on which the first subpixel, the second subpixel, and the third subpixel are arranged,
   wherein a lengthwise direction of the blocking layer is parallel to a long side or a short side of the substrate.

7. The display apparatus of claim 1, further comprising a substrate on which the first subpixel, the second subpixel, and the third subpixel are arranged,
   wherein an angle between the first side of the first subpixel and a lengthwise direction of the blocking layer is in a range of about 5° to about 85°.

8. The display apparatus of claim 1, wherein at least a side portion of the second subpixel and at least a side portion of the third subpixel are arranged within a length range of the first side of the first subpixel.

9. The display apparatus of claim 1, wherein a short side of the second subpixel is parallel to the first side of the first subpixel.

10. The display apparatus of claim 1, wherein a short side of the third subpixel is parallel to the first side of the first subpixel.

11. The display apparatus of claim 1, further comprising a plurality of first subpixels comprising the first subpixel, the plurality of first subpixels including centers arranged in a straight line in a first direction and arranged in a serpentine form in a second direction.

12. The display apparatus of claim 11, wherein the first direction is parallel to a long side of the display apparatus.

13. The display apparatus of claim 1, further comprising a plurality of second subpixels comprising the second subpixel and a plurality of third subpixels comprising the third subpixel,
   wherein centers of first ones of the plurality of second subpixels or centers of first ones of the plurality of third subpixels are arranged in a straight line.

14. The display apparatus of claim 1, further comprising a plurality of second subpixels comprising the second subpixel and a plurality of third subpixels comprising the third subpixel,
   wherein centers of first ones of the plurality of second subpixels or centers of first ones of the plurality of third subpixels are arranged in a serpentine form in a direction.

15. The display apparatus of claim 1, further comprising a plurality of first subpixels arranged in a first direction, the plurality of first subpixels comprising the first subpixel,
   wherein the second subpixel facing the first side of the first subpixel and another third subpixel facing a second side of the first subpixel are symmetrical to each other about a straight line crossing centers of the plurality of first subpixels arranged in the first direction.

16. The display apparatus of claim 1, wherein a length of a long side of the second subpixel is substantially equal to a length of a long side of the third subpixel.

17. The display apparatus of claim 1, further comprising a spacer between the first subpixel and the second subpixel or between the first subpixel and the third subpixel.

18. The display apparatus of claim 17, wherein a shortest distance from the second subpixel to the spacer is substantially equal to a shortest distance from another third subpixel to the spacer.

19. The display apparatus of claim 1, wherein a short side of the second subpixel or a short side of the third subpixel overlaps one side of the first subpixel, and is arranged in a straight line extending from one side of another first subpixel.

20. The display apparatus of claim 1, further comprising a plurality of first subpixels arranged in a first direction, the plurality of first subpixels comprising the first subpixel, wherein an angle of about 45° is between a long side of the second subpixel or a long side of the third subpixel and a straight line crossing centers of the plurality of first subpixels arranged in the first direction.

21. The display apparatus of claim 1, wherein an outline connecting a portion of an edge of the second subpixel to a portion of an edge of the third subpixel has a square shape.

22. The display apparatus of claim 1, wherein the first subpixel is configured to emit blue light, one of the second subpixel or the third subpixel is configured to emit red light, and the other of the second subpixel or the third subpixel is configured to emit green light.

23. A display apparatus comprising:
a plurality of first subpixels each having a rectangular shape;
a plurality of second subpixels comprising a second subpixel facing a first side of a corresponding first subpixel of the plurality of first subpixels, each of the plurality of the second subpixels having a rectangular shape;
a plurality of third subpixels comprising a third subpixel facing the first side of the first subpixel and spaced apart from the second subpixel, each of the plurality of third subpixels having a rectangular shape; and
a blocking portion comprising a blocking layer arranged on at least one of the first subpixel, the second subpixel, or the third subpixel,
wherein centers of first ones of the plurality of first subpixels are arranged in a straight line, at least one side of the first subpixel is tilted with respect to the straight line crossing the centers of the first ones of the plurality of first subpixels, and
wherein a lengthwise direction of the straight line crossing the centers of the first ones of the plurality of first subpixels is the same as or perpendicular to a lengthwise direction of the blocking layer, and
wherein vertices of at least one of the first subpixel, the second subpixel, or the third subpixel are chamfered.

24. The display apparatus of claim 23, wherein an angle between the lengthwise direction of the blocking layer and one side of the first subpixel is in a range of about 5° to about 85°.

25. The display apparatus of claim 23, wherein, in a plan view, the blocking layer overlaps two sides of at least one of the first subpixel, the second subpixel, or the third subpixel.

26. The display apparatus of claim 23, wherein the blocking portion comprises:
a protection layer exposed to outside; and a base layer in which a plurality of blocking layers, comprising the blocking layer, are inserted.

27. The display apparatus of claim 23, wherein an end of the blocking layer is concave.

28. The display apparatus of claim 23, further comprising a substrate on which the plurality of first subpixels, the plurality of second subpixels, and the plurality of third subpixels are arranged,
wherein the lengthwise direction of the blocking layer is parallel to a long side or a short side of the substrate.

29. The display apparatus of claim 23, wherein, in a plan view, the blocking layer overlaps at least one of the first subpixel, the second subpixel, or the third subpixel.

30. The display apparatus of claim 23, wherein a size of the first subpixel is different from a size of at least one of the second subpixel or the third subpixel.

31. The display apparatus of claim 23, wherein the plurality of first subpixels each have a square shape.

32. The display apparatus of claim 23, wherein at least one of the second subpixel or the third subpixel has a rectangular shape.

33. The display apparatus of claim 23, wherein at least a portion of the second subpixel and at least a portion of the third subpixel, facing the first side of the first subpixel, are arranged within a length range of the first side of the first subpixel that faces the second subpixel and the third subpixel.

34. The display apparatus of claim 23, wherein centers of first ones of the plurality of second subpixels and centers of first ones of the plurality of third subpixels are arranged in a serpentine form.

35. A display apparatus comprising:
a plurality of first subpixels;
a plurality of second subpixels comprising a second subpixel facing a corresponding first subpixel of the plurality of first subpixels;
a plurality of third subpixels comprising a third subpixel facing the first subpixel and spaced apart from the second subpixel;
a spacer between the first subpixel and the second subpixel or between the first subpixel and the third subpixel; and
a blocking portion comprising a blocking layer arranged on the first subpixel, the second subpixel, and the third subpixel,
wherein centers of first ones of the plurality of first subpixels are arranged in a straight line, and at least one side of each first subpixel is tilted with respect to the straight line crossing the centers of the first ones of the plurality of first subpixels, and
wherein a vertex of at least one of the first subpixel, the second subpixel, or the third subpixel is chamfered.

36. The display apparatus of claim 35, wherein a lengthwise direction of the straight line crossing the centers of the first ones of the plurality of first subpixels is the same as or perpendicular to a lengthwise direction of the blocking layer.

37. The display apparatus of claim 35, wherein an angle between a lengthwise direction of the blocking layer and one side of at least one of the plurality of first subpixels is in a range of about 5° to about 85°.

38. The display apparatus of claim 35, wherein the blocking portion comprises:
a protection layer exposed to outside; and
a base layer in which a plurality of blocking layers, comprising the blocking layer, are inserted.

39. The display apparatus of claim 35, wherein an end of the blocking layer is concave.

40. The display apparatus of claim 35, further comprising a substrate on which the plurality of first subpixels, the plurality of second subpixels, and the plurality of third subpixels are arranged, wherein a lengthwise direction of the blocking layer is parallel to a long side or a short side of the substrate.

41. The display apparatus of claim 35, wherein, in a plan view, the blocking layer overlaps at least one of the first subpixel, the second subpixel, or the third subpixel.

42. The display apparatus of claim 35, wherein a size of the first subpixel is different from a size of at least one of the second subpixel or the third subpixel.

43. The display apparatus of claim 35, wherein the plurality of first subpixels each have a square shape.

44. The display apparatus of claim 35, wherein a size of each second subpixel is substantially equal to a size of each third subpixel.

45. The display apparatus of claim 35, wherein a shortest distance from an edge of the spacer to the second subpixel is substantially equal to a shortest distance from the edge of the spacer to another third subpixel.

46. The display apparatus of claim 35, wherein a shortest distance from the second subpixel or the third subpixel to an edge of the spacer is substantially equal to a shortest distance from the first subpixel to the edge of the spacer.

47. The display apparatus of claim 35, wherein the plurality of second subpixels and the plurality of third subpixels each have a rectangular shape, and a distance between the first subpixel and a long side of the second subpixel that face each other, a distance between the long side of the second subpixel and a long side of the third subpixel that face each other, and a distance between the long side of the third subpixel and another first subpixel that face each other are the same.

48. The display apparatus of claim 35, wherein a distance from one side of the first subpixel to the second subpixel is different from a distance from the one side of the first subpixel to the third subpixel, wherein the first subpixel faces the second subpixel and the third subpixel.

\* \* \* \* \*